(12) United States Patent  
Fukuoka et al.

(10) Patent No.: US 8,441,122 B2  
(45) Date of Patent: May 14, 2013

(54) SEMICONDUCTOR DEVICE HAVING SEMICONDUCTOR CHIP AND METAL PLATE

(75) Inventors: Daisuke Fukuoka, Nisshin (JP); Takanori Teshima, Okazaki (JP); Kuniaki Mamitsu, Nukata-gun (JP); Ken Sakamoto, Chiryu (JP); Tetsuo Fujii, Toyohashi (JP); Akira Tai, Okazaki (JP); Kazuo Akamatsu, Okazaki (JP); Masayoshi Nishihata, Chiryu (JP)

(73) Assignee: Denso Corporation, Kariya (JP)

( * ) Notice: Subject to any disclaimer, the term of this patent is extended or adjusted under 35 U.S.C. 154(b) by 351 days.

(21) Appl. No.: 12/805,733

(22) Filed: Aug. 17, 2010

(65) Prior Publication Data

US 2011/0042741 A1    Feb. 24, 2011

(30) Foreign Application Priority Data

Aug. 18, 2009 (JP) ................................. 2009-189175  
Oct. 14, 2009 (JP) ................................. 2009-237249  
Jan. 14, 2010 (JP) ................................. 2010-005715

(51) Int. Cl.  
*H01L 23/34*    (2006.01)

(52) U.S. Cl.  
USPC .................................. 257/717; 257/E23.109

(58) Field of Classification Search .................. 257/717, 257/713, E23.109  
See application file for complete search history.

(56) References Cited

U.S. PATENT DOCUMENTS

| 6,891,265 B2 * | 5/2005 | Mamitsu et al. ............... 257/718 |
| 7,009,292 B2 * | 3/2006 | Miura et al. ................... 257/718 |
| 7,215,020 B2 * | 5/2007 | Nakase et al. ................. 257/706 |
| 2005/0042798 A1 | 2/2005 | Nagao et al. |
| 2005/0121701 A1 | 6/2005 | Hirano et al. |
| 2007/0001265 A1 | 1/2007 | Narazaki |
| 2009/0001532 A1 * | 1/2009 | Shiomi ......................... 257/675 |

FOREIGN PATENT DOCUMENTS

| JP | A-S63-148659 | 6/1988 |
| JP | A-H3-237745  | 10/1991 |
| JP | A-2007-27565 | 2/2007 |
| JP | A-2007-48889 | 2/2007 |
| JP | A-2007-158218 | 6/2007 |
| JP | A-2008-192691 | 8/2008 |

OTHER PUBLICATIONS

Office Action mailed Dec. 13, 2011 in corresponding JP Application No. 2009-237249 (and English translation).  
Office Action mailed Dec. 13, 2011 in corresponding JP Application No. 2010-05715 (and English translation).

* cited by examiner

*Primary Examiner* — Steven J Fulk  
(74) *Attorney, Agent, or Firm* — Posz Law Group, PLC

(57) ABSTRACT

A semiconductor device includes a first protection film for covering a first metal wiring. A second protection film is disposed on the first protection film, which is covered with a solder layer. Even if a crack is generated in the second protection film before the solder layer is formed on the second protection film, the crack is restricted from proceeding into the first protection film.

3 Claims, 22 Drawing Sheets ated on the surface electrode; a first protection film covering the first metal wiring; a metal plate covering at least a part of the surface electrode and a part of the first metal wiring and electrically coupling with the metal layer and the surface electrode via a solder layer, wherein the solder layer is disposed on the metal layer; and an insulation layer disposed on the at least the part of the first metal wiring, which is covered with the metal plate via the solder layer and the first protection film. The semiconductor chip, the surface electrode, the first metal wiring and the metal plate are packaged, and the insulation layer is disposed between the part of the first metal wiring and the first protection film.

SEMICONDUCTOR DEVICE HAVING SEMICONDUCTOR CHIP AND METAL PLATE

CROSS REFERENCE TO RELATED APPLICATIONS

This application is based on Japanese Patent Applications No. 2009-189175 filed on Aug. 18, 2009, No. 2009-237249 filed on Oct. 14, 2009, and No. 2010-5715 filed on Jan. 14, 2010, the disclosures of which are incorporated herein by reference.

FIELD OF THE INVENTION

The present invention relates to a semiconductor device including a semiconductor chip and a metal plate, which are packaged.

BACKGROUND OF THE INVENTION

Conventionally, a semiconductor chip having a semiconductor element such as an IGBT is packaged together with a metal block and/or a heat radiation plate so that a package semiconductor equipment is formed. This equipment is described in, for example, Japanese Patent No. 3750680 (corresponding to U.S. Pat. No. 7,009,292). In the equipment, an emitter aluminum electrode is formed on a surface of a semiconductor substrate, on which the IGBT is formed. Further, a gate wiring layer is formed on the surface of the substrate through a LOCOS oxide film and an insulation film.

To isolate the emitter aluminum electrode from the gate wiring layer so as not to short-circuit, a protection film is formed to cover the surface of the gate wiring layer. The emitter aluminum electrode and the gate wiring layer are electrically insulated from each other with the protection film. A metal block is bonded to the emitter aluminum electrode and the protection film via a solder layer.

However, in the above conventional art, when disturbance is applied to the equipment, the protection film may be cracked. In this case, the solder layer may penetrate into the crack to reach the gate wiring layer, so that the emitter aluminum electrode and the gate wiring layer may short-circuit.

The factor of generation of the crack in the protection film is not only the disturbance but also process failure, which occurs in a step for forming the protection film. For example, in JP-A-2007-27565, after the protection film and a metal film are formed on a semiconductor substrate, a part of the metal film on the protection film is removed by cutting a part of the protection film and the metal film with a bit for cutting. The part of the metal film is an unnecessary part.

Since the bit cuts the protection film under the metal film, the protection film may be damaged. Thus, a crack may be generated in the protection film. Similar to the disturbance, the solder layer may penetrate into the crack to reach the gate wiring layer, so that the emitter aluminum electrode and the gate wiring layer may short-circuit.

Thus, when the protection film is formed or after the protection film is formed, the crack may be generated in the protection film. Thus, if the solder layer penetrates through the crack and reaches the gate wiring layer, the emitter aluminum electrode and the gate wiring layer may short-circuit.

SUMMARY OF THE INVENTION

In view of the above-described problem, it is an object of the present disclosure to provide a semiconductor device, which prevents from short-circuiting between a surface electrode and a first metal wiring. It is another object of the present disclosure to provide a method for manufacturing a semiconductor device.

According to a first aspect of the present disclosure, a semiconductor device includes: a semiconductor chip including a semiconductor element, wherein the semiconductor chip further includes a first region and a second region, and has a first surface and a second surface; a surface electrode disposed on the first surface of the semiconductor chip and electrically coupled with the first region of the semiconductor chip; a first metal wiring disposed on the first surface of the semiconductor chip and electrically coupled with the second region of the semiconductor chip, wherein the first metal wiring controls a potential to be applied to the second region; a metal layer disposed on the surface electrode; a first protection film covering the first metal wiring; a metal plate covering at least a part of the surface electrode and a part of the first metal wiring and electrically coupling with the metal layer and the surface electrode via a solder layer, wherein the solder layer is disposed on the metal layer; and an insulation layer disposed on the at least the part of the first metal wiring, which is covered with the metal plate via the solder layer and the first protection film. The semiconductor chip, the surface electrode, the first metal wiring and the metal plate are packaged, and the insulation layer is disposed between the part of the first metal wiring and the first protection film.

In the above device, since the insulation layer is disposed on the first metal wiring, even if a crack is generated in the first protection film, and the solder layer penetrates into the crack, the solder is stopped at the insulation layer, so that the solder layer is restricted from reaching the first metal wiring. Accordingly, the first metal wiring and the surface electrode are not short-circuited.

According to a second aspect of the present disclosure, a semiconductor device includes: a semiconductor chip including a semiconductor element, wherein the semiconductor chip further includes a first region and a second region, and has a first surface and a second surface; a surface electrode disposed on the first surface of the semiconductor chip and electrically coupled with the first region of the semiconductor chip; a first metal wiring disposed on the first surface of the semiconductor chip and electrically coupled with the second region of the semiconductor chip, wherein the first metal wiring controls a potential to be applied to the second region; a metal layer disposed on the surface electrode; a first protection film covering the first metal wiring; a metal plate covering at least a part of the surface electrode and a part of the first metal wiring and electrically coupling with the metal layer and the surface electrode via a solder layer, wherein the solder layer is disposed on the metal layer; and a fluorine surface processed layer disposed on the first protection film, which is covered with the metal plate via the fluorine surface processed layer. The semiconductor chip, the surface electrode, the first metal wiring and the metal plate are packaged, and the fluorine surface processed layer is disposed between the metal plate and the first protection film.

In the above device, since the fluorine surface processed layer having very low solder wettability is formed on the first protection film, the fluorine surface processed layer rejects the solder layer. Thus, even if a crack is generated in the first protection film, the crack is covered with the fluorine surface processed layer. Thus, the solder layer is restricted from reaching the first metal wiring. Accordingly, the first metal wiring and the surface electrode are not short-circuited.

According to a third aspect of the present disclosure, a semiconductor device includes: a semiconductor chip including a semiconductor element, wherein the semiconductor chip further includes a first region and a second region, and has a first surface and a second surface; a surface electrode disposed on the first surface of the semiconductor chip and electrically coupled with the first region of the semiconductor chip; a first metal wiring disposed on the first surface of the semiconductor chip and electrically coupled with the second region of the semiconductor chip, wherein the first metal wiring controls a potential to be applied to the second region; a metal layer disposed on the surface electrode; a first protection film covering the first metal wiring; a metal plate covering at least a part of the surface electrode and a part of the first metal wiring and electrically coupling with the metal layer and the surface electrode via a solder layer, wherein the solder layer is disposed on the metal layer; and a solder penetration prevention member disposed on the first protection film, which is covered with the metal plate. The semiconductor chip, the surface electrode, the first metal wiring and the metal plate are packaged, and the solder penetration prevention member is sandwiched between the metal plate and the first protection film.

In the above device, since the solder penetration prevention member is formed on the first protection film, the solder layer is mounted only on the metal layer. Thus, even if a crack is generated in the first protection film, the solder is restricted from reaching the first metal wiring via the crack. Accordingly, the first metal wiring and the surface electrode are not short-circuited.

According to a fourth aspect of the present disclosure, a semiconductor device includes: a semiconductor chip including a semiconductor element, wherein the semiconductor chip further includes a first region and a second region, and has a first surface and a second surface; a surface electrode disposed on the first surface of the semiconductor chip and electrically coupled with the first region of the semiconductor chip; a first metal wiring disposed on the first surface of the semiconductor chip and electrically coupled with the second region of the semiconductor chip, wherein the first metal wiring controls a potential to be applied to the second region; a metal layer disposed on the surface electrode; a first protection film covering the first metal wiring; and a metal plate covering at least a part of the surface electrode and a part of the first metal wiring and electrically coupling with the metal layer and the surface electrode via a solder layer, wherein the solder layer is disposed on the metal layer. The semiconductor chip, the surface electrode, the first metal wiring and the metal plate are packaged, and the first protection film contacts the metal plate.

In the above device, the metal plate directly contacts the first protection film. Thus, the solder layer is mounted on only the metal layer. Even if a crack is generated in the first protection film, the solder is restricted from reaching the first metal wiring via the crack. Accordingly, the first metal wiring and the surface electrode are not short-circuited.

According to a fifth embodiment of the present disclosure, a semiconductor device includes: a semiconductor chip including a semiconductor element, wherein the semiconductor chip further includes a first region and a second region, and has a first surface and a second surface; a surface electrode disposed on the first surface of the semiconductor chip and electrically coupled with the first region of the semiconductor chip; a first metal wiring disposed on the first surface of the semiconductor chip and electrically coupled with the second region of the semiconductor chip, wherein the first metal wiring controls a potential to be applied to the second region; a metal layer disposed on the surface electrode; a first protection film covering the first metal wiring; and a metal plate covering at least a part of the surface electrode and a part of the first metal wiring and electrically coupling with the metal layer and the surface electrode via a solder layer, wherein the solder layer is disposed on the metal layer. The semiconductor chip, the surface electrode, the first metal wiring and the metal plate are packaged. The metal plate includes a protrusion, which faces the first protection film, and protrudes toward the semiconductor chip, and the first protection film contacts the protrusion of the metal plate.

In the above device, since the protrusion of the metal plate directly contacts the first protection film, the solder layer is mounted on only the metal layer. Even if a crack is generated in the first protection film, the solder is restricted from reaching the first metal wiring via the crack. Accordingly, the first metal wiring and the surface electrode are not short-circuited.

According to a sixth aspect of the present disclosure, a semiconductor device includes: a semiconductor chip including a semiconductor element, wherein the semiconductor chip further includes a first region and a second region, and has a first surface and a second surface; a surface electrode disposed on the first surface of the semiconductor chip and electrically coupled with the first region of the semiconductor chip; a first metal wiring disposed on the first surface of the semiconductor chip and electrically coupled with the second region of the semiconductor chip, wherein the first metal wiring controls a potential to be applied to the second region; a first protection film covering the first metal wiring; a metal layer disposed on the surface electrode and a side of the second protection film; a metal plate covering at least a part of the surface electrode and a part of the first metal wiring and electrically coupling with the metal layer and the surface electrode via a solder layer, wherein the solder layer is disposed on the metal layer; and a second protection film disposed on the first protection film, which is covered with the solder layer via the second protection. The semiconductor chip, the surface electrode, the first metal wiring and the metal plate are packaged.

In the above device, the second protection film covers the first protection film, which is to be covered with the solder. The first protection film provides homogeneous solid body, and the second protection film provides another homogeneous solid body, and they are stacked. Thus, the homogeneous solid body is not continuous at a boundary between the first and the second protection films. Even if a crack is generated in the second protection film caused by stress from the solder layer, the crack is stopped at the boundary between the first and second protection films. Accordingly, the crack is restricted from reaching the first metal wiring, which is covered with the first protection film. Accordingly, the first metal wiring and the surface electrode are not short-circuited.

According to a seventh aspect of the present disclosure, a manufacturing method of a semiconductor device includes: forming a plurality of semiconductor chips in a wafer, wherein each chip includes a semiconductor element having a first region and a second region; forming a surface electrode on a first surface of each semiconductor chip, wherein the surface electrode is electrically coupled with the first region of the semiconductor element; forming a first metal wiring on the first surface of each semiconductor chip, wherein the first metal wiring is electrically coupled with the second region of the semiconductor element; forming a first protection film on the first metal wiring to cover the first metal wiring; applying a second protection film on the first protection film with an injector; forming a metal layer on the surface electrode after the applying the second protection film; dividing the wafer into the plurality of semiconductor chips after the forming the metal layer; bonding a metal plate on the metal layer via a solder layer in such a manner that the metal plate covers at least a part of the surface electrode and a part of the first metal wiring, and the metal plate is electrically coupled with the metal, layer and the surface electrode via the solder layer; and packaging the semiconductor chip, the surface electrode, the first metal wiring and the metal plate after the bonding the metal plate. The second protection film is disposed on the first protection film, which is covered with the metal plate via the solder layer and the second protection film.

In the above method, the second protection film is partially arranged on the first protection film, which is covered with the solder layer. Even if a crack such as scratch is generated in the second protection film before the solder layer is mounted, the crack is stopped at the boundary between the first and second protection films. Accordingly, the crack is restricted from reaching the first metal wiring, which is covered with the first protection film. Accordingly, the first metal wiring and the surface electrode are not short-circuited. Further, since the injector is used, the second protection film can be applied on a certain part of the first protection film, which is requested to apply the second protection film thereon. Thus, a photo lithography process and an etching process for patterning the second protection film are not necessary.

According to an eighth aspect of the present disclosure, a manufacturing method of a semiconductor device includes: forming a plurality of semiconductor chips in a wafer, wherein each chip includes a semiconductor element having a first region and a second region; forming a surface electrode on a first surface of each semiconductor chip, wherein the surface electrode is electrically coupled with the first region of the semiconductor element; forming a first metal wiring on the first surface of each semiconductor chip, wherein the first metal wiring is electrically coupled with the second region of the semiconductor element; forming a first protection film on the first metal wiring to cover the first metal wiring; forming a metal layer on the surface electrode and the first protection film after the forming the first protection film; cutting a part of the first protection film and a part of the metal layer with a bit or a multiple blade tool so as to expose the first protection film from the metal layer after the forming the metal layer; applying a second protection film on the first protection film with an injector after the cutting; dividing the wafer into the plurality of semiconductor chips after the applying the second protection film; bonding a metal plate on the metal layer via a solder layer in such a manner that the metal plate covers at least a part of the surface electrode and a part of the first metal wiring, and the metal plate is electrically coupled with the metal layer and the surface electrode via the solder layer; and packaging the semiconductor chip, the surface electrode, the first metal wiring and the metal plate after the bonding the metal plate.

Even if a crack is generated in the first protection film when the part of the first protection film is cut by the bit or the multiple blade tool, the crack is covered with the second protection film since the second protection film is formed after the cutting the part of the first protection film. Accordingly, the solder is restricted from reaching the first metal wiring via the crack in the first protection film. Accordingly, the first metal wiring and the surface electrode are not short-circuited.

According to a ninth aspect of the present disclosure, a manufacturing method of a semiconductor device includes: forming a plurality of semiconductor chips in a wafer, wherein each chip includes a semiconductor element having a first region and a second region; forming a surface electrode on a first surface of each semiconductor chip, wherein the surface electrode is electrically coupled with the first region of the semiconductor element; forming a first metal wiring on the first surface of each semiconductor chip, wherein the first metal wiring is electrically coupled with the second region of the semiconductor element; forming a first protection film on the first metal wiring to cover the first metal wiring; forming a metal layer on the surface electrode and the first protection film after the forming the first protection film; cutting a part of the first protection film and a part of the metal layer with a bit or a multiple blade tool so as to expose the first protection film from the metal layer after the forming the metal layer; dividing the wafer into the plurality of semiconductor chips after the cutting; bonding a metal plate on the metal layer via a solder layer in such a manner that the metal plate covers at least a part of the surface electrode and a part of the first metal wiring, and the metal plate is electrically coupled with the metal layer and the surface electrode via the solder layer; packaging the semiconductor chip, the surface electrode, the first metal wiring and the metal plate after the bonding the metal plate; and after the forming the first metal wiring, forming an insulation layer on the at least the part of the first metal wiring, which is covered with the metal plate via the solder layer and the first protection film. The insulation layer is disposed between the part of the first metal wiring and the first protection film.

In the above method, even if a crack is generated in the first protection film when the part of the first protection film is cut by the bit or the multiple blade tool, the crack is stopped at the insulation layer, which is formed on the first metal wiring. Accordingly, the crack is restricted from reaching the first metal wiring via the crack. Accordingly, the first metal wiring and the surface electrode are not short-circuited.

According to a tenth aspect of the present disclosure, a manufacturing method of a semiconductor device includes: forming a plurality of semiconductor chips in a wafer, wherein each chip includes a semiconductor element having a first region and a second region; forming a surface electrode on a first surface of each semiconductor chip, wherein the surface electrode is electrically coupled with the first region of the semiconductor element; forming a first metal wiring on the first surface of each semiconductor chip, wherein the first metal wiring is electrically coupled with the second region of the semiconductor element; forming a first protection film on the first metal wiring to cover the first metal wiring; forming a metal layer on the surface electrode and the first protection film after the forming the first protection film; cutting a part of the first protection film and a part of the metal layer with a bit or a multiple blade tool so as to expose the first protection film from the metal layer after the forming the metal layer; dividing the wafer into the plurality of semiconductor chips after the cutting; bonding a metal plate on the metal layer via a solder layer in such a manner that the metal plate covers at least a part of the surface electrode and a part of the first metal wiring, and the metal plate is electrically coupled with the metal layer and the surface electrode via the solder layer; packaging the semiconductor chip, the surface electrode, the first metal wiring and the metal plate after the bonding the metal plate; and after the cutting, forming a fluorine surface processed layer on the first protection film, which is covered with the metal plate via the fluorine surface processed layer. The fluorine surface processed layer is disposed between the metal plate and the first protection film.

In the above method, after the part of the first protection film is cut, the fluorine surface processed layer having very low solder wettability is formed on the first protection film. Even if a crack is generated in the first protection film, the fluorine surface processed layer prevents the solder layer from reaching the first metal wiring via the crack. Accordingly, the first metal wiring and the surface electrode are not short-circuited.

According to an eleventh aspect of the present disclosure, a manufacturing method of a semiconductor device includes: forming a plurality of semiconductor chips in a wafer, wherein each chip includes a semiconductor element having a first region and a second region; forming a surface electrode on a first surface of each semiconductor chip, wherein the surface electrode is electrically coupled with the first region of the semiconductor element; forming a first metal wiring on the first surface of each semiconductor chip, wherein the first metal wiring is electrically coupled with the second region of the semiconductor element; forming a first protection film on the first metal wiring to cover the first metal wiring; forming a metal layer on the surface electrode and the first protection film after the forming the first protection film; cutting a part of the first protection film, and a part of the metal layer with a bit or a multiple blade tool so as to expose the first protection film from the metal layer after the forming the metal layer; dividing the wafer into the plurality of semiconductor chips after the cutting; bonding a metal plate on the metal layer via a solder layer in such a manner that the metal plate covers at least a part of the surface electrode and a part of the first metal wiring, and the metal plate is electrically coupled with the metal layer and the surface electrode via the solder layer; packaging the semiconductor chip, the surface electrode, the first metal wiring and the metal plate after the bonding the metal plate; and after the cutting, forming a solder penetration prevention member on the first protection film, which is covered with the metal plate. In the packaging, the solder penetration prevention member is sandwiched between the metal plate and the first protection film.

In the above method, since the solder penetration prevention member is formed on the first protection film, the solder is mounted on only the metal layer. Thus, even if a crack is generated in the first protection film, the solder layer is restricted from penetrating into the crack. Thus, the first metal wiring and the surface electrode are not short-circuited.

According to a twelfth aspect of the present disclosure, a manufacturing method of a semiconductor device includes: forming a plurality of semiconductor chips in a wafer, wherein each chip includes a semiconductor element having a first region and a second region; forming a surface electrode on a first surface of each semiconductor chip, wherein the surface electrode is electrically coupled with the first region of the semiconductor element; forming a first metal wiring on the first surface of each semiconductor chip, wherein the first metal wiring is electrically coupled with the second region of the semiconductor element; forming a first protection film on the first metal wiring to cover the first metal wiring; forming a metal layer on the surface electrode and the first protection film after the forming the first protection film; cutting a part of the first protection film and a part of the metal layer with a bit or a multiple blade tool so as to expose the first protection film from the metal layer after the forming the metal layer; dividing the wafer into the plurality of semiconductor chips after the cutting; bonding a metal plate on the metal layer via a solder layer in such a manner that the metal plate covers at least a part of the surface electrode and a part of the first metal wiring, and the metal plate is electrically coupled with the metal layer and the surface electrode via the solder layer; and packaging the semiconductor chip, the surface electrode, the first metal wiring and the metal plate after the bonding the metal plate. In the packaging, the first protection film contacts the metal plate.

In the above method, the first protection film directly contacts the metal plate. Thus, the solder layer is formed on only the metal layer. Even if a crack is generated in the first protection film, the solder layer is restricted from penetrating into the crack. Thus, the first metal wiring and the surface electrode are not short-circuited.

According to a thirteenth aspect of the present disclosure, a manufacturing method of a semiconductor device includes: forming a plurality of semiconductor chips in a wafer, wherein each chip includes a semiconductor element having a first region and a second region; forming a surface electrode on a first surface of each semiconductor chip, wherein the surface electrode is electrically coupled with the first region of the semiconductor element; forming a first metal wiring on the first surface of each semiconductor chip, wherein the first metal wiring is electrically coupled with the second region of the semiconductor element; forming a first protection film on the first metal wiring to cover the first metal wiring; forming a metal layer on the surface electrode and the first protection film after the forming the first protection film; cutting a part of the first protection film and a part of the metal layer with a bit or a multiple blade tool so as to expose the first protection film from the metal layer after the forming the metal layer; dividing the wafer into the plurality of semiconductor chips after the cutting; bonding a metal plate on the metal layer via a solder layer in such a manner that the metal plate covers at least a part of the surface electrode and a part of the first metal wiring, and the metal plate is electrically coupled with the metal layer and the surface electrode via the solder layer; and packaging the semiconductor chip, the surface electrode, the first metal wiring and the metal plate after the bonding the metal plate. The metal plate includes a protrusion, which faces the first protection film, and protrudes toward the semiconductor chip, and, in the bonding the metal plate, the first protection film contacts the protrusion of the metal plate.

In the above method, the protrusion of the metal plate directly contacts the first protection film. Thus, the solder layer is not mounted on the first protection film. Even if a crack is generated in the first protection film, the solder layer is restricted from reaching the first metal wiring via the crack. Thus, the first metal wiring and the surface electrode are not short-circuited.

According to fourteenth aspect of the present disclosure, a manufacturing method of a semiconductor device includes: forming a plurality of semiconductor chips in a wafer, wherein each chip includes a plurality of cells and a plurality of passages, the plurality of passages surrounds each cell, the plurality of passages is disposed on a first surface of the chip, and each cell includes a semiconductor element having a first region and a second region; forming a surface electrode on the first surface of each semiconductor chip, wherein the surface electrode is electrically coupled with the first region of the semiconductor element; forming a first metal wiring on one of the plurality of passages, wherein the first metal wiring is electrically coupled with the second region of the semiconductor element; applying a first protection film on the plurality of passages with an injector in such a manner that a height of the first protection film disposed on a first passage is lower than a height of the first protection film disposed on a second passage, wherein the plurality of passages includes the first passage and the second passage, a solder layer is to be mounted on the first passage, no solder layer is to be mounted on the second passage, and the first protection film covers the first metal wiring; forming a metal layer on the surface electrode and the first protection film; cutting a part of the first protection film disposed on the second passage and a part of the metal layer with a bit or a multiple blade tool so as to expose the first protection film on the second passage from the metal layer; dividing the wafer into the plurality of semiconductor chips after the cutting; bonding a metal plate on the metal layer via the solder layer in such a manner that the metal plate covers at least a part of the surface electrode and a part of the first metal wiring, and the metal plate is electrically coupled with the metal layer and the surface electrode via the solder layer; and packaging the semiconductor chip, the surface electrode, the first metal wiring and the metal plate after the bonding the metal plate.

In the above method, since the height of the first protection film on the first passage, on which the solder layer is mounted, is lower than the height of the first protection film on the second passage, on which the solder layer is mounted, the first protection film on the first passage is not cut by the bit or the multiple blade tool. Accordingly, since the stress from the bit or the tool is not applied to the first protection film on the first passage when the step of cutting, a crack is not generated in the first protection film on the first passage. Thus, the solder layer does not penetrate into the crack, and therefore, the first metal wiring and the surface electrode are not short-circuited.

According to a fifteenth aspect of the present disclosure, a manufacturing method of a semiconductor device includes: forming a plurality of semiconductor chips in a wafer, wherein each chip includes a plurality of cells and a plurality of passages, the plurality of passages surrounds each cell, the plurality of passages is disposed on a first surface of the chip, and each cell includes a semiconductor element having a first region and a second region; forming a surface electrode on the first surface of each semiconductor chip, wherein the surface electrode is electrically coupled with the first region of the semiconductor element; forming a first metal wiring on one of the plurality of passages, wherein the first metal wiring is electrically coupled with the second region of the semiconductor element; applying a first protection film on the plurality of passages wherein the first protection film covers the first metal wiring; forming a metal layer on the surface electrode and the first protection film; preparing a press element having a press surface and a press protrusion, wherein the press protrusion protrudes from the press surface, and corresponds to the first protection film disposed on a first passage, wherein the plurality of passages includes the first passage and a second passage, a solder layer is to be mounted on the first passage, and no solder layer is to be mounted on the second passage; pressing the first protection film on the first passage with the press protrusion under a condition that the press surface of the press element faces the first surface of the chip so that a height of the first protection film disposed on the first passage with respect to the first surface of the chip is lower than a height of the first protection film disposed on the second passage with respect to the first surface of the chip; cutting a part of the first protection film disposed on the second passage and a part of the metal layer with a bit or a multiple blade tool so as to expose the first protection film on the second passage from the metal layer; dividing the wafer into the plurality of semiconductor chips after the cutting; bonding a metal plate on the metal layer via the solder layer in such a manner that the metal plate covers at least a part of the surface electrode and a part of the first metal wiring, and the metal plate is electrically coupled with the metal layer and the surface electrode via the solder layer; and packaging the semiconductor chip, the surface electrode, the first metal wiring and the metal plate after the bonding the metal plate.

In the above method, the first protection film on the second passage is selectively cut. Thus, a crack is not generated in the first protection film on the first passage. Accordingly, the first metal wiring and the surface electrode are not short-circuited.

According to sixteenth aspect of the present disclosure, a manufacturing method of a semiconductor device includes: forming a plurality of semiconductor chips in a wafer, wherein each chip includes a plurality of cells and a plurality of passages, the plurality of passages surrounds each cell, the plurality of passages is disposed on a first surface of the chip, and each cell includes a semiconductor element having a first region and a second region; forming a surface electrode on the first surface of each semiconductor chip, wherein the surface electrode is electrically coupled with the first region of the semiconductor element; forming a first metal wiring on one of the plurality of passages, wherein the first metal wiring is electrically coupled with the second region of the semiconductor element; applying a first protection film on the plurality of passages, wherein the first protection film covers the first metal wiring; forming a metal layer on the surface electrode and the first protection film; dividing the wafer into the plurality of semiconductor chips after the forming the metal layer; after the dividing the wafer, preparing a press element having a press surface and a press protrusion, wherein the press protrusion protrudes from the press surface, and corresponds to the first protection film disposed on a first passage, wherein the plurality of passages includes the first passage and a second passage, a solder layer is to be mounted on the first passage, and no solder layer is to be mounted on the second passage; pressing the first protection film on the first passage with the press protrusion under a condition that the press surface of the press element faces the first surface of the chip so that a height of the first protection film disposed on the first passage with respect to the first surface of the chip is lower than a height of the first protection film disposed on the second passage with respect to the first surface of the chip; after the pressing the first protection film, cutting a part of the first protection film disposed on the second passage and a part of the metal layer with a bit or a multiple blade tool so as to expose the first protection film on the second passage from the metal layer; after the cutting, bonding a metal plate on the metal layer via the solder layer in such a manner that the metal plate covers at least a part of the surface electrode and a part of the first metal wiring, and the metal plate is electrically coupled with the metal layer and the surface electrode via the solder layer; and after the bonding, packaging the semiconductor chip, the surface electrode, the first metal wiring and the metal plate after the bonding the metal plate.

In the above method, the first protection film on the second passage is selectively cut. Thus, a crack is not generated in the first protection film on the first passage. Accordingly, the first metal wiring and the surface electrode are not short-circuited.

According to a seventeenth aspect of the present disclosure, a manufacturing method of a semiconductor device includes: forming a plurality of semiconductor chips in a wafer, wherein each chip includes a plurality of cells and a plurality of passages, the plurality of passages surrounds each cell, the plurality of passages is disposed on a first surface of the chip, and each cell includes a semiconductor element having a first region and a second region; forming a surface electrode on the first surface of each semiconductor chip, wherein the surface electrode is electrically coupled with the first region of the semiconductor element; forming a first metal wiring on one of the plurality of passages, wherein the first metal wiring is electrically coupled with the second region of the semiconductor element; applying a first protection film on the plurality of passages, wherein the first protection film covers the first metal wiring; after the forming the first protection film, preparing a press element having a press surface and a press protrusion, wherein the press protrusion protrudes from the press surface, and corresponds to the first protection film disposed on a first passage, wherein the plurality of passages includes the first passage and a second passage, a solder layer is to be mounted on the first passage, and no solder layer is to be mounted on the second passage; pressing the first protection film on the first passage with the press protrusion under a condition that the press surface of the press element faces the first surface of the chip so that a height of the first protection film disposed on the first passage with respect to the first surface of the chip is lower than a height of the first protection film disposed on the second passage with respect to the first surface of the chip; after the pressing, forming a metal layer on the surface electrode and the first protection film; after the forming the metal layer, cutting a part of the first protection film disposed on the second passage and a part of the metal layer with a bit or a multiple blade tool so as to expose the first protection film on the second passage from the metal layer; after the cutting, dividing the wafer into the plurality of semiconductor chips after the forming the metal layer; after the dividing, bonding a metal plate on the metal layer via the solder layer in such a manner that the metal plate covers at least a part of the surface electrode and a part of the first metal wiring, and the metal plate is electrically coupled with the metal layer and the surface electrode via the solder layer; and after the bonding, packaging the semiconductor chip, the surface electrode, the first metal wiring and the metal plate after the bonding the metal plate.

In the above method, the height of the first protection film on the first passage is lowered by the press element. Then, the metal layer is formed on the first protection film. The first protection film on the second passage is selectively cut. Accordingly, a crack is not generated in the first protection film on the first passage. Accordingly, the first metal wiring and the surface electrode are not short-circuited. Further, a part of the first protection film is pressed by the press element before the metal layer is formed in the first protection film, a crack is restricted from being generated in the metal layer and the first protection film.

According to an eighteenth aspect of the present disclosure, a manufacturing method of a semiconductor device includes: forming a plurality of semiconductor chips in a wafer, wherein each chip includes a plurality of cells and a plurality of passages, the plurality of passages surrounds each cell, the plurality of passages is disposed on a first surface of the chip, and each cell includes a semiconductor element having a first region and a second region; forming a surface electrode on the first surface of each semiconductor chip, wherein the surface electrode is electrically coupled with the first region of the semiconductor element; forming a first metal wiring on one of the plurality of passages, wherein the first metal wiring is electrically coupled with the second region of the semiconductor element; applying a first protection film on the plurality of passages, wherein the first protection film covers the first metal wiring; after the applying the first protection film, dividing the wafer into the plurality of semiconductor chips after the forming the metal layer; after the dividing, preparing a press element having a press surface and a press protrusion, wherein the press protrusion protrudes from the press surface, and corresponds to the first protection film disposed on a first passage, wherein the plurality of passages includes the first passage and a second passage, a solder layer is to be mounted on the first passage, and no solder layer is to be mounted on the second passage; pressing the first protection film on the first passage with the press protrusion under a condition that the press surface of the press element faces the first surface of the chip so that a height of the first protection film disposed on the first passage with respect to the first surface of the chip is lower than a height of the first protection film disposed on the second passage with respect to the first surface of the chip; after the pressing, forming a metal layer on the surface electrode and the first protection film; after the forming the metal layer, cutting a part of the first protection film disposed on the second passage and a part of the metal layer with a bit or a multiple blade tool so as to expose the first protection film on the second passage from the metal layer; after the cutting, bonding a metal plate on the metal layer via the solder layer in such a manner that the metal plate covers at least a part of the surface electrode and a part of the first metal wiring, and the metal plate is electrically coupled with the metal layer and the surface electrode via the solder layer; and after the bonding, packaging the semiconductor chip, the surface electrode, the first metal wiring and the metal plate after the bonding the metal plate.

In the above method, the height of the first protection film on the first passage is lowered by the press element. Then, the metal layer is formed on the first protection film. The first protection film on the second passage is selectively cut. Accordingly, a crack is not generated in the first protection film on the first passage. Accordingly, the first metal wiring and the surface electrode are not short-circuited. Further, a part of the first protection film is pressed by the press element before the metal layer is formed in the first protection film, a crack is restricted from being generated in the metal layer and the first protection film.

According to an nineteenth aspect of the present disclosure, a semiconductor device includes: a semiconductor chip including a semiconductor element, wherein the semiconductor chip further includes a first region and a second region, and has a first surface and a second surface; a surface electrode disposed on the first surface of the semiconductor chip and electrically coupled with the first region of the semiconductor chip; a first metal wiring disposed on the first surface of the semiconductor chip and electrically coupled with the second region of the semiconductor chip, wherein the first metal wiring controls a potential to be applied to the second region; a metal layer disposed on the surface electrode; a first protection film covering the first metal wiring; a second protection film disposed on the first protection film, which is covered with a solder layer via the second protection; and a metal plate covering at least a part of the surface electrode and a part of the first metal wiring and electrically coupling with the metal layer and the surface electrode via the solder layer, wherein the solder layer is disposed on the metal layer. The semiconductor chip, the surface electrode, the first metal wiring and the metal plate are packaged.

In the above device, the second protection film covers the first protection film, which is to be covered with the solder. The first protection film provides homogeneous solid body, and the second protection film provides another homogeneous solid body, and they are stacked. Thus, the homogeneous solid body is not continuous at a boundary between the first and the second protection films. Even if a crack is generated in the second protection film caused by stress from the solder layer, the crack is stopped at the boundary between the first and second protection films. Accordingly, the crack is restricted from reaching the first metal wiring, which is covered with the first protection film. Accordingly, the first metal wiring and the surface electrode are not short-circuited.

According to a twentieth aspect of the present disclosure, a semiconductor device includes: a semiconductor chip having a semiconductor element, wherein the semiconductor chip includes a first surface and a second surface, the semiconductor element has a trench gate structure, which includes an emitter region on the first surface, a trench penetrating the emitter region, a gate insulation film disposed on an inner wall of the trench, and a gate region disposed on the gate insulation film in the trench; a surface electrode disposed on the first surface and electrically coupled with the emitter region; a first metal wiring disposed on the first surface and electrically coupled with the gate region, wherein the first metal wiring controls a potential to be applied to the gate region; a metal layer disposed on the surface electrode; a first protection film covering the first metal wiring; and a metal plate covering the surface electrode and electrically coupling with the metal layer and the surface electrode via a solder layer, wherein the solder layer is disposed on the metal layer. The semiconductor chip, the surface electrode, the first metal wiring and the metal plate are packaged. The first surface of the semiconductor chip includes a solder mounting region and a no solder region. The solder layer is disposed over the solder mounting region, and the solder layer is not disposed over the no solder region. The gate region is disposed in both of the solder mounting region and the no solder region. The first metal wiring is disposed on the no solder region of the first surface, and the first metal wiring is electrically coupled with the gate region only in the no solder region.

In the above device, the first metal wiring is formed in the no solder region on the first surface of the chip. The first protection film covering the first metal wiring is also formed in the no solder region. Thus, the first protection film covering the first metal wiring is not covered with the solder layer. Thus, the crack is not generated in the first protection film covering the first metal wiring. The first metal wiring and the surface electrode are not short-circuited.

According to a twenty-first aspect of the present disclosure, a manufacturing method of a semiconductor device includes: forming a plurality of semiconductor chips in a wafer, wherein each chip includes a semiconductor element having a first region and a second region; forming a surface electrode on a first surface of each semiconductor chip, wherein the surface electrode is electrically coupled with the first region of the semiconductor element; forming a first metal wiring on the first surface of each semiconductor chip, wherein the first metal wiring is electrically coupled with the second region of the semiconductor element; forming a first protection film on the first metal wiring to cover the first metal wiring; mixing non-conductive material in a second protection film, wherein the non-conductive material is made of an organic particle or an inorganic fiber; applying the second protection film on the first protection film with an injector; forming a metal layer on the surface electrode; dividing the wafer into the plurality of semiconductor chips after the forming the metal layer; bonding a metal plate on the metal layer via a solder layer in such a manner that the metal plate covers at least a part of the surface electrode and a part of the first metal wiring, and the metal plate is electrically coupled with the metal layer and the surface electrode via the solder layer; and packaging the semiconductor chip, the surface electrode, the first metal wiring and the metal plate after the bonding the metal plate. The second protection film is disposed on the first protection film, which is covered with the metal plate via the solder layer and the second protection film. In this case, even if the crack is generated in the first protection film, the non-conductive material prevents the crack from growing.

According to a twenty-second aspect of the present disclosure, a manufacturing method of a semiconductor device includes: forming a plurality of semiconductor chips in a wafer, wherein each chip includes a semiconductor element having a first surface and a second surface, the semiconductor element has a trench gate structure, which includes an emitter region on the first surface, a trench penetrating the emitter region, a gate insulation film disposed on an inner wall of the trench, and a gate region disposed on the gate insulation film in the trench; forming a surface electrode on the first surface, wherein the surface electrode is electrically coupled with the emitter region; forming a first metal wiring on the first surface, wherein the first metal wiring is electrically coupled with the gate region; forming a first protection film, which covers the first metal wiring; forming a metal layer on the surface electrode and the first protection film; cutting a part of the first protection film and a part of the metal layer with a bit or a multiple blade tool so as to expose the first protection film from the metal layer; dividing the wafer into the plurality of semiconductor chips after the cutting; bonding a metal plate on the metal layer via a solder layer in such a manner that the metal plate covers the surface electrode, and the metal plate is electrically coupled with the metal layer and the surface electrode via the solder layer; and packaging the semiconductor chip, the surface electrode, the first metal wiring and the metal plate after the bonding the metal plate. The first surface of the semiconductor chip includes a solder mounting region and a no solder region. The solder layer is disposed over the solder mounting region, and the solder layer is not disposed over the no solder region. In the forming the plurality of semiconductor chips, the gate region is formed in both of the solder mounting region and the no solder region. In the forming the first metal wiring, the first metal wiring is formed on the no solder region of the first surface. The first metal wiring is electrically coupled with the gate region only in the no solder region.

In the above method, the first metal wiring is formed in the no solder region of the first surface of the chip. Thus, even if the crack is generated in the first protection film when the stress of the solder layer is applied to the first protection film, the solder layer does not penetrate into the crack. Accordingly, the first metal wiring and the surface electrode are not short-circuited.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
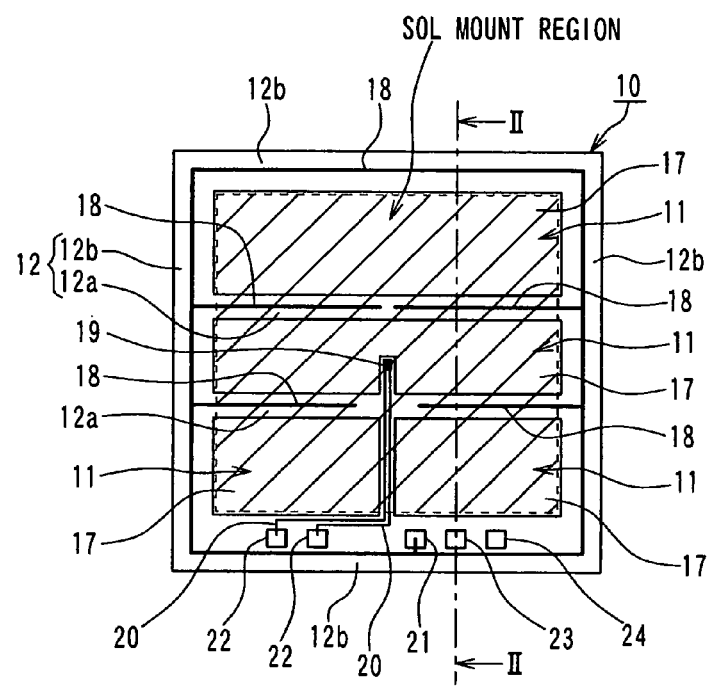
FIG. 1 is a diagram showing a plan view of a semiconductor chip according to a first embodiment.
Figure 2:
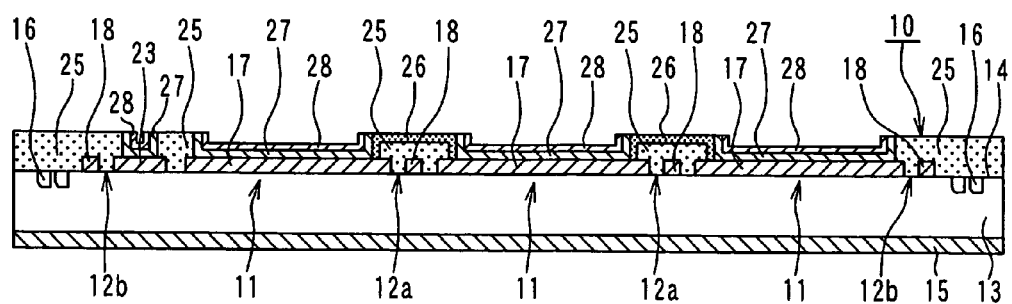
FIG. 2 is a diagram showing a cross sectional view of the chip taken along line II-II in FIG. 1.
Figure 3:
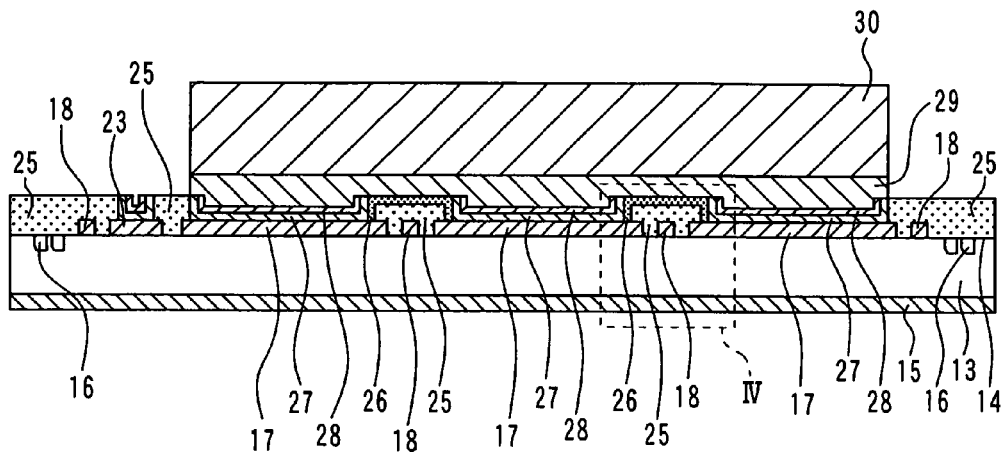
FIG. 3 is a diagram showing a part of a cross sectional view of a semiconductor device including the semiconductor chip.

FIG. 1 shows a semiconductor chip 10 in a semiconductor device according to a first embodiment. FIG. 2 shows a cross sectional view of the device taken along line II-II in FIG. 1. FIG. 3 shows a part of a cross sectional view of the device corresponding to a cross sectional view of the device taken along line II-II in FIG. 1.

As shown in FIG. 1, the chip 10 includes multiple cells 11, each of which includes a semiconductor element, and a passage 12 disposed around the cells 11. As shown in FIG. 2, the chip 10 is formed of a semiconductor substrate 13 such as a silicon substrate. The substrate 13 is, for example, a $P^+$ type substrate, and a $N^-$ type drift layer (not shown) is formed on the P+ type substrate. A principal surface, i.e., a main surface of the substrate 13 or the chip 10 is defined as a surface of the drift layer, i.e., the surface of the substrate 13. Accordingly, the passage 12 is disposed on the main surface side of the chip 10 around the cell 11.

Each cell 11 includes multiple IGBTs as a semiconductor element. A P type base layer (not shown) is formed in a surface portion of the drift layer. A N+ type emitter region corresponding to a first region is formed in a surface portion of the base layer. A trench is formed to penetrate the emitter region and the base layer and to reach the drift layer. A gate insulation film and a gate layer corresponding to a second region are formed on an inner wall of the trench. The trench, the gate insulation film and the gate layer provide a trench gate structure. An insulation film covers a part of the emitter region and the trench gate structure. These constructions are one of examples of the IGBT. Alternatively, the IGBT may have other structures.

The P+ type substrate functions as a collector region. A backside electrode 15 is formed on a backside of the substrate. The backside electrode 15 functions as a collector electrode and contacts the backside of the substrate. The backside electrode 15 is made of, for example, a Ti/Ni/Au film.

A guard ring 16 is formed on the main surface side of the substrate 13. The guard ring 16 improves a breakdown voltage of the element. The guard ring 16 is, for example, made of a P type region, which is formed in an upper portion of the drift layer.

A surface electrode 17 functions as an emitter electrode, and is formed on the surface of the IGBT. The surface electrode 17 contacts each P type base layer and each $N^+$ type emitter region of the IGBTs, which are formed in one cell. Each cell includes multiple surface electrodes 17. Specifically, the electrode 17 is formed on the main surface 14 of the substrate 13 such that the electrode 17 bridges among multiple trench gate structures. As shown in FIG. 1, the electrode 17 having a stripe pattern covers almost all of an upper side of each cell 11. The surface electrode 17 is made of metal material such as aluminum alloy. For example, the electrode 17 may be made of Al—Si, and have a main component of Al. The electrode 17 may be formed by a sputtering method.

A gate metal wiring 18 as a first metal wiring is formed on the main surface 14 of the substrate 13 through a LOCOS oxide film and an insulation film (not shown). The gate metal wiring 18 is electrically coupled with multiple gate layers, which are formed in the cell 11. The gate metal wiring 18 functions as a means for controlling a gate potential in each trench gate structure. Specifically, the gate metal wiring 18 functions to control a potential applied to the semiconductor element.

As shown in FIG. 1, the gate metal wiring 18 is arranged in the passage 12, which is positioned around the cell 11. The gate metal wiring 18 is disposed on the main surface 14 of the chip 10. Here, the gate metal wiring 18 is not formed in all of the passage 12. The gate metal wiring 18 is formed in at least a part of the passages 12. In the present embodiment, the gate metal wiring 18 has a layout in such a manner that the wiring 18 surrounds the surface electrode 17.

A temperature sensor 19 is formed on the main surface 14 of the chip 10. The temperature sensor 19 outputs a voltage corresponding to temperature. Specifically, the temperature sensor 19 changes a forward voltage VF. When the chip 10 is operated, heat is generated. Thus, the sensor 19 outputs the forward voltage VF according to the heat. The heat generated in case of the operation of the chip 10 is concentrated at the center of the chip 10. Thus, the sensor 19 is arranged at the center of the chip 10.

The sensor 19 is, for example, a temperature sensitive diode having a N type layer and a P type layer, which are made of poly crystal silicon and disposed on an insulation film (not shown). The N type layer and the p type layer are formed on the substrate 13.

The sensor metal wiring 20 as a second metal wiring is formed on the main surface 14 of the substrate 13 through a LOCOS oxide film and an insulation film (not shown). The sensor metal wiring 20 is arranged in the passage 12, which extends from the center of the main surface 14 of the substrate 13 to an outer periphery. The gate metal wiring 18 is electrically separated from the sensor metal wiring 20. The sensor metal wiring 20 is connected to the temperature sensor 19.

Further, as shown in FIG. 1, a gate pad 21 and a sensor pad 22 are formed on the main surface 14 of the substrate 13 through the LOCOS oxide film and the insulation film (not shown). The gate pad 21 is electrically coupled with the gate metal wiring 18. The sensor pad 22 is electrically coupled with the sensor metal wiring 20. A voltage to be applied to the gate metal wiring 18 as a gate potential is controlled through the gate pad 21. Further, the forward voltage VF of the sensor 19 is retrieved through the sensor pad 22 to an external device.

A current sense pad 23 and a Kelvin emitter pad 24 are formed on the main surface 14 of the substrate 13, in addition to the gate pad 21 and the sensor pad 22.

As shown in FIG. 2, the first protection film 25 is applied to and formed on the passage 12. The first protection film 25 is arranged between the surface electrode 17, the gate metal wiring 18 and the sensor metal wiring 20. Further, the first protection film 25 covers the gate metal wiring 18 and the sensor metal wiring 20. Thus, the gate metal wiring 18, the sensor metal wiring 20 and the surface electrode 17 are electrically insulated from each other with the first protection film 25. Each pad 21-24 are exposed from the first protection film 25. The first protection film 25 also covers the temperature sensor 19.

A second protection film 26 is formed on the first protection film 25. The position of the second protection film 26 will be explained later.

The first and second protection films 25, 26 are made of a poly imide film. The poly imide film of the first protection film 25 sufficiently covers the substrate 13, the gate metal wiring 18 and the sensor metal wiring 20 so that the film 25 protects them. The second protection film 26 may be made of the same poly imide film as the first protection film 25 as long as the interface of the first protection film 25 is clearly formed in case of the forming step.

A Ni film 27 and a gold film 28 as a metal layer are formed on a top surface of the surface electrode 17 and a side of the second protection film 26. The nickel film 27 and the gold film 28 cover a whole of the sides of the second protection film 26. The Ni film 17 and the gold film 28 are formed by a sputtering method, and each film 17, 28 is thin. Specifically, the nickel film 27 covers a whole side of the second protection film 26, and the gold film 28 is formed on the nickel film 27.

As shown in FIG. 3, a metal plate 30 is bonded to the chip 10 through a solder layer 29. Specifically, the metal plate 30 is electrically and thermally coupled with the surface electrode 17 via the solder layer 29, the nickel film 27 and the gold film 28. Thus, the metal plate 30 functions as both of an electrode (a wiring) and a heat sink.

The passage 12 includes a first passage 12a on which the solder layer 29 is mounted and a second passage 12b on which no solder layer 29 is mounted. Thus, the first passage 12a is positioned in a solder mounting region, which is shown as a shaded area of FIG. 1. The second passage 12b is disposed on the outside of the solder mounting region.

The metal plate 30 covers at least a part of the surface electrode 17 and the gate metal wiring 18. Specifically, the metal plate 30 is formed to cover a portion of the main surface 14 of the chip 10 other than the pads 21-24 and the second passage 12b. The metal plate 30 covers the solder mounting region. Accordingly, in the present embodiment, the metal plate 30 covers a whole of the surface electrode 17.

According to the dimensions of the metal plate 30, the second protection film 26 is formed on a part of the first protection film 25, which is covered with the solder layer 29. The second protection film 26 is partially formed on the first protection film 25, which is disposed on the first passage 12a of the main surface 14 of the chip 10 other than the second passage 12b.

In the structure shown in FIG. 3, a lower heat sink (not shown) is bonded to the backside electrode 15. Further, an upper heat sink (not shown) is bonded to the metal plate 30. This stacking structure having the upper and lower heat sinks is sealed with a resin mold so that the both-side heat radiation type semiconductor device is prepared. The chip 10, the surface electrode 17, the gate metal wiring 18 and the metal plate 30 are packaged.

Each pad 21-24 is connected to a corresponding lead terminal via a wiring. The lead terminal is exposed from the resin mold. Further, each of the lower and upper heat sinks includes a lead terminal, which is exposed form the resin mold. The lead terminals are electrically coupled with an external circuit so that the external circuit is electrically coupled with the chip 10.

Figure 4:
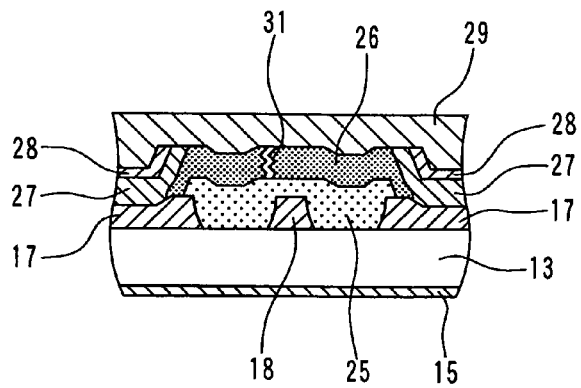
FIG. 4 is a diagram showing a partially enlarged cross sectional view of a part IV of the device in FIG. 3.

Next, as shown in FIG. 4, functions of the second protection film 26 will be explained. FIG. 4 is a partially enlarged cross sectional view of the device in FIG. 3.

A crack 31 such as scratch may be generated in the second protection film 26 before the solder layer 29 is bonded to the second protection film 26. The stress is applied to the crack 31 from the solder layer 29 when the metal plate 30 is bonded to the substrate 13 via the solder layer 29. Thus, the crack 31 reaches the first protection film 25. However, the crack 31 stops at a boundary between the first and second protection films 25, 26.

The first and second protection films 25, 26 are formed to be uniform solid individually. Accordingly, the first protection film 25 as one uniform solid is stacked on the second protection film 26 as another uniform solid. Thus, at the boundary between the first and second protection films 25, 26, no homogeneous, i.e., uniform solid is disposed across the boundary. Specifically, the boundary provides a discontinuous surface. Thus, even if the crack 31 is generated in the second protection film 26, the growth of the crack 31 stops at the boundary between the first and second protection films 25, 26. Thus, the crack 31 does not penetrate into the first protection film 25. Specifically, the crack 31 does not exist in the first protection film 25.

Accordingly, the crack 31 merely reaches the boundary between the first and second protection films 25, 26. Specifically, the crack 31 does not across the boundary. Thus, even if the solder layer 29 penetrates into the crack 31 in the second protection film 26, the solder layer 29 does not penetrate into the first protection film 25.

Thus, when the second protection film 26 is partially formed on the first protection film 25, which is covered with the solder layer 29, the crack 31 does not reach the gate metal wiring 18 covered with the first protection film 25. Thus, short-circuit between the gate metal wiring 18 and the surface electrode 17 is prevented.

Further, since the first protection film 25 is covered with the second protection film 26, the stress from the solder layer 29 is not directly applied to the first protection film 25.

The manufacturing method of the semiconductor device will be explained with reference to FIG. 5.

First, multiple semiconductor chips 10 are formed in a wafer. Specifically, the wafer is prepared, and then, multiple IGBTs are formed in the wafer. Detailed forming steps of the IGBT are performed by a conventional method. For example, a P type base layer and a N+ type emitter region are formed in a surface portion of a N− type drift layer. Then, a trench is formed to penetrate the emitter region and the base layer and to reach the drift layer. A gate insulation film and a gate layer are formed on an inner wall of the trench. Further, an insulation film is formed to cover a part of the emitter region and the trench. Thus, multiple semiconductor chips 10 are formed in the wafer.

Then, a metal film is formed on a surface of the wafer, in which the IGBTs are formed. The metal film is made of, for example, metal including aluminum as a main component. A photo resist is applied on the surface of the metal film. Then, the resist is patterned by an exposure method. Thus, an opening is formed in a part of the photo resist so that the other part of the photo resist corresponds to a surface-electrode-to-be-formed region, a gate-metal-wiring-to-be-formed region, a sensor-metal-wiring-to-be-formed region, and a pad-to-be-formed region. Then, a wet etching step is performed with using the photo resist as a mask, so that the metal film is patterned. Thus, the surface electrode 17 electrically coupled with the N+ type emitter region, the gate metal wiring 18 electrically coupled with the gate layer, the sensor metal wiring 20 and the pads 21-24 are formed in the semiconductor device simultaneously, i.e., at the same time. Then, the photo resist is removed.

Here, the surface electrode and the like may be formed at a different step. The surface electrode 17, the gate metal wiring 18, the sensor metal wiring 20 and each pad 21-24 may be formed independently in multiple steps.

Then, a N type layer and a P type layer made of poly crystal silicon for providing the temperature sensor 19 are formed at a temperature-sensor-to-be-formed region. In this case, the N type layer and the P type layer are connected to the sensor metal wiring 20, respectively.

A poly imide film is formed on a whole surface of the wafer. A part of the poly imide film at a predetermined position is left, and the other part of the poly imide film is removed. Thus, the first protection film 25 is formed. Thus, the first protection film 25 is among the surface electrode 17, the gate metal wiring 18 and the sensor metal wiring 20 so that the surface electrode 17, the gate metal wiring 18 and the sensor metal wiring 20 are electrically isolated from each other with the first protection film 25. Further, the gate metal wiring 18, the sensor metal wiring 20 and the temperature sensor 20 are covered with the first protection film 25.

Figure 5:
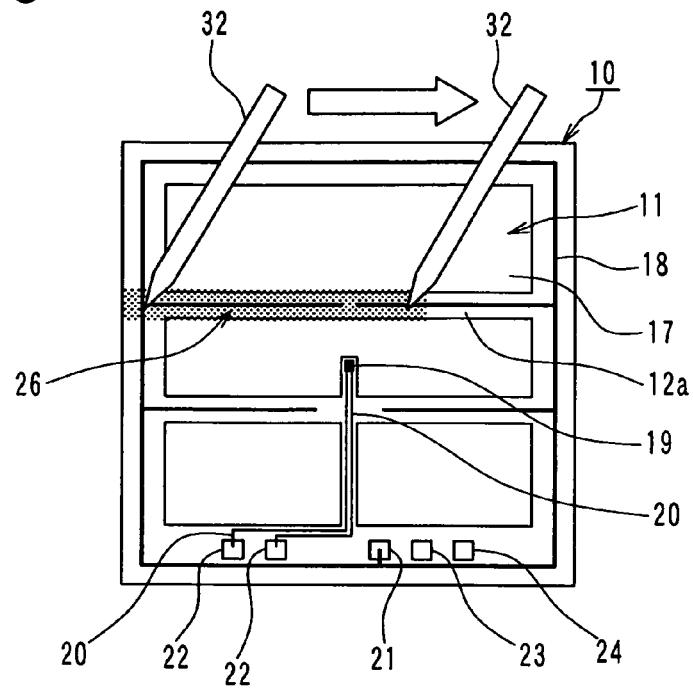
FIG. 5 is a diagram showing a step for forming a second protection film.

Next, as shown in FIG. 5, the second protection film 26 is partially applied on the first protection film 25 with using an injector 32. The injector 32 is, for example, a dispenser or an ink jet nozzle.

Since the gate metal wiring 18 and the like are formed in the passage 12, the injector 32 is moved along with the passage 12. The second protection film 25 is applied in the passage 12 through the injector 32. When the second protection film 26 is formed, the second protection film 26 is partially applied to the surface of the first protection film 25, which is to be covered with the solder layer 29. Accordingly, the second protection film is also applied to the surface of the first protection film, which is disposed on the temperature sensor and the sensor metal wiring 20, which is to be covered with the solder layer 29.

Next, a nickel film 27 and a gold film 28 are formed in this order on the surface electrode 17 exposed from the first protection film 25, the second protection film 216 and the pads 21-24 by a sputtering method. Here, each pad 21-24 may be formed by a nickel plating method and a gold plating method, respectively.

After the nickel film 27 and the gold film 28 are formed, since each pad 21-24 is electrically coupled with the surface electrode 17 via the nickel film 27 and the gold film 28, each pad 21-24 is electrically insulated from the surface electrode 17.

Specifically, a part of the first protection film 25 and a part of the second protection film 26 are cut with a bit or a multi blade tool such that a part of the second protection film 26 formed in the passage 12a, on which the solder layer 29 is to be formed, is exposed, and a part of the first protection film 252 formed in the passage 12b, on which the solder layer 29 is not to be formed, is exposed.

In this case, for example, the main surface 14 of the chip 10 provides a reference surface. The bit or the multi blade tool is moved in parallel to the main surface 14 with a predetermined distance from the surface 14, so that the part of the first protection film 25 and the part of the second protection film 26 are cut. Thus, as shown in FIG. 2, each pad 21-24 and the surface electrode 17 are electrically isolated. Further, since the cutting step is performed with using a cutting tool such as the multi blade tool or the bit, the nickel film 27 and the gold film 28 remains on a side of the second protection film 26, which is formed in the passage 12a, and on a side of the first protection film 25, which is formed in the passage 12b. The solder layer 29 is mounted on the first passage 12a, and the solder layer 29 is not mounted on the second passage 12b.

Thus, when the cutting step is performed with using the bit or the multi blade tool, the stress is applied to the second protection film 26 from the bit or the tool. Thus, the crack 31 may be generated in the second protection film 26. However, the crack 31 stops to penetrate at the boundary between the first and second protection films 25, 26. Thus, even if the solder layer 29 penetrates into the crack 31, the gate metal wiring 18 and the surface electrode 17 does not short-circuit. Even if the crack 31 is generated in the first protection film 25, which is formed in the second passage 12b, the solder layer 29 is not formed on the second passage 12b, so that the solder layer 29 does not penetrate into the crack 31. Thus, the gate metal wiring 18 and the surface electrode 17 does not short-circuit.

The backside electrode 15 is formed by evaporating a Ti film, a Ni film and a Au film in this order on the backside of the wafer.

Then, the wafer is bonded to a dicing tape, and then, the wafer is divided into multiple chips 10. Thus, the metal plate 30 is bonded to each chip 10 via the solder layer 29 on the gold film 28. Then, each pad 21-24 is connected to the lead terminal, respectively. The lower heat sink is bonded to the backside electrode 15, and the upper heat sink is bonded to the metal plate 30. The chip is sealed with the resin mold. Thus, the semiconductor device is completed.

In the present embodiment, the second protection film 26 is applied to a part of the first protection film 25 which is covered with the solder layer 29 with using the injector 32.

Thus, the stress from the solder layer 29 is not directly applied to the first protection film 25. Further, even if the crack 31 such as a scratch is generated in the second protection film 26, the crack 31 does not cross over the boundary between the first and second protection films 25, 26. Accordingly, the crack 31 does not reach the gate metal wiring 18, which is covered with the first protection film 25. Thus, the gate metal wiring 18 and the surface electrode 17 does not short-circuit.

Since the second protection film 26 is formed with using the injector 32, the second protection film 26 can be formed on a necessary part of the first protection film 25. Accordingly, a photo lithography step and an etching step for patterning the second protection film 26 are not necessary.

In the present embodiment, the first and second protection films 25, 26 are made of a poly imide film. Here, the poly imide film is not a brittle material so that the poly imide film may not lose a shape when the poly imide film is cut. The poly imide film has a low ductility, and a breaking extension is in a range between 50% and 60%. The poly imide film has a high adhesiveness with a gold film.

Alternatively, the first and second protection films 25, 26 may be made of a poly tetrafluoethylene film, a poly carbonate film, an acetal resin film, a phenol resin film, a poly amide resin film, an acrylic resin film, or an epoxy resin film. The poly tetrafluoethylene film has a small Young's modulus, and therefore, elastic deformation region is wide. Thus, the poly tetrafluoethylene film can be cut with small force. The breaking extension of the poly tetrafluoethylene film is about 200%. The poly tetrafluoethylene film may not lose a shape when the poly tetrafluoethylene film is cut. A fine split of the poly tetrafluoethylene film is prevented when the poly tetrafluoethylene film is cut.

The poly imide film, the poly tetrafluoethylene film, the poly carbonate film, the acetal resin film, and the phenol resin film are easily cut. The poly amide resin film and the acrylic resin film are not easily cut. The epoxy resin film is difficult to cut. However, when a stress from the bit 36 or the multiple blade tool is appropriately controlled, the crack 31 may not be generated in the first and second protection films 25, 26.

The first and second protection films 25, 26 may be formed by a method with using a dispenser when resin material in the first and second protection films 25, 26 has high viscosity. Alternatively, the first and second protection films 25, 26 may be formed by a ink jet method when resin material in the first and second protection films 25, 26 has low viscosity.

Second Embodiment

In the present embodiment, an arrangement of the sensor metal wiring 20 in the passage 12 is specified.

Figure 6:
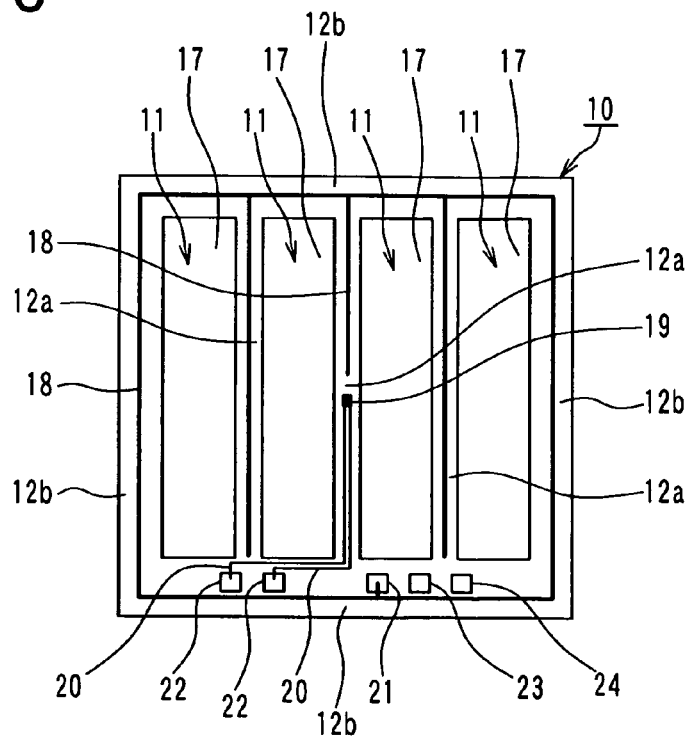
FIG. 6 is a diagram showing a plan view of a semiconductor chip according to a second embodiment.

FIG. 6 shows a semiconductor chip 10 according to a second embodiment. In the chip 10, each cell 11 is arranged in a stripe manner. Accordingly, the passage 12 is also arranged in a stripe manner. The gate metal wiring 18 is arranged in each passage 12.

The temperature sensor 19 is arranged in one of the passages 12. Accordingly, at least a part of the sensor metal wiring 20 is formed in the same passage 12, in which the gate metal wiring 18 is formed. At least the part of the sensor metal wiring 20 is formed to be in parallel to the gate metal wiring 18. In the present embodiment, as shown in FIG. 6, the temperature sensor 19 is arranged at a center of the one of the passages 12. The sensor metal wiring 20 is arranged on one side of the passage 12, and the gate metal wiring 18 is arranged on the other side of the passage 12. The sensor metal wiring 20 extends from the sensor 19 on the one side of the passage 12, which is directed to the pads 21-24.

Figure 7:
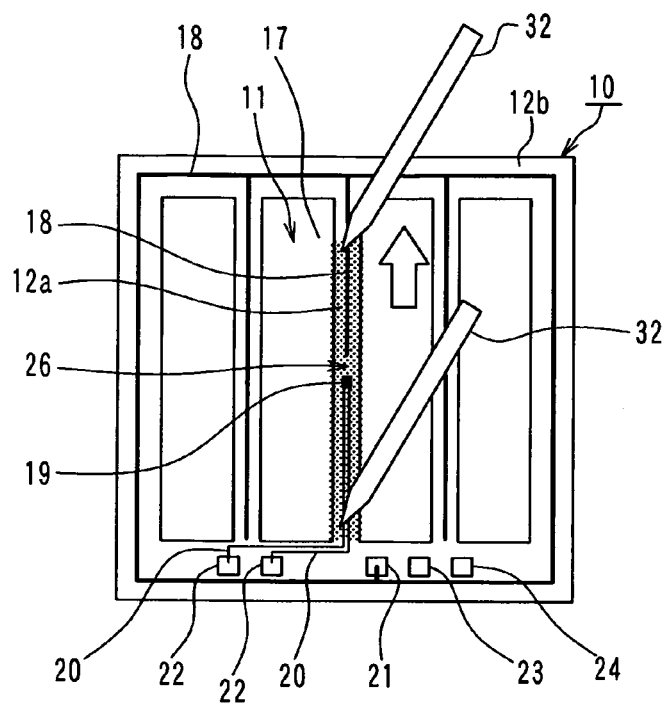
FIG. 7 is a diagram showing a step for forming a second protection film according to the second embodiment.

The manufacturing method of the semiconductor device according to the present embodiment will be explained with reference to FIG. 7. Firstly, as shown in FIG. 6, the TGBT is formed in the substrate 13 so as to form the stripe pattern cell. Further, the surface electrode 17, the gate metal wiring 18, the sensor metal wiring 20 and the pads 21-24 are formed on the main surface 14 of the substrate 13.

When the gate metal wiring 18 and the sensor metal wiring 20 are formed, the gate metal wiring 18 and the sensor metal wiring 20 are formed in the same passage 12 so as to be in parallel to each other. Thus, at least a part of the gate metal wiring 18 and at least a part of the sensor metal wiring 20 are arranged in the same passage 12.

Then, similar to the first embodiment, the first and second protection films 25, 26 are formed. When the second protection film 26 is formed, as shown in FIG. 7, the second protection film 26 is applied to the first protection film 25 along with the passage 12a with using the injector 32. Since a part of the gate metal wiring 18 and a part of the sensor metal wiring 20 are arranged in the same passage 12a so as to be in parallel to each other, the second protection film 26 is applied to the first protection film 25 in one action when the injector 32 is moved along with the passage 12a.

When the first protection film 25 is applied with using the injector 32, since the part of the gate metal wiring 18 and the part of the sensor metal wiring 20 are arranged in the same passage 12 so as to be in parallel to each other, the first protection film 25 is applied to the gate metal wiring 18 and the sensor metal wiring 20 in one action.

After that, the nickel film 27 and the gold film 28 are formed by a sputtering method. Similar to the first embodiment, a part of the first protection film 25 and a part of the second protection film are cut. Then, the metal plate 30 is bonded to the main surface 14 of the chip 10 via the solder layer 29. The upper and lower heat sinks are bonded to the substrate 13; and the substrate 13 is sealed with the resin mold. Thus, the semiconductor device is completed.

When the sensor metal wiring 20 different from the gate metal wiring 18 is arranged on the main surface 14 of the substrate 13, a part of the gate metal wiring 18 and a part of the sensor metal wiring 20 are arranged in the same passage 12 in parallel to each other. Thus, the first and second protection films 25, 26 are effectively formed.

Third Embodiment

In the present embodiment, the first protection film 25 is applied to a side of the chip 10.

Figure 8:
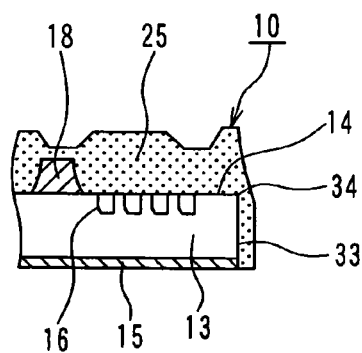
FIG. 8 is a diagram showing a part of a cross sectional view of a semiconductor chip according to a third embodiment.

FIG. 8 shows a partially enlarged cross sectional view of an outer periphery of the chip 10. The chip 10 includes a side 33 perpendicular to the main surface 14 of the chip 10 and a corner 34 provided by the main surface 14 and the side 33 of the chip 10. The first protection film 25 covers the corner 34 of the chip 10.

Figure 9:
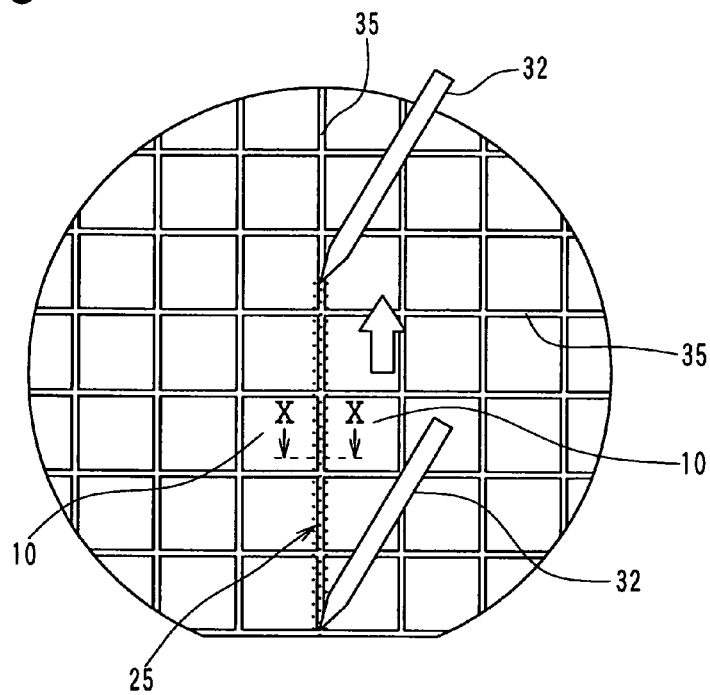
FIG. 9 is a diagram showing a step of forming a first protection film at a corner of the semiconductor chip.
Figure 10:
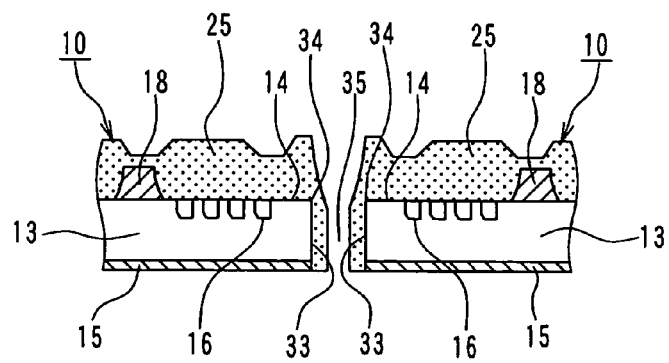
FIG. 10 is a diagram showing a cross sectional view of the chip taken along line X-X in FIG. 9.

Next, a method for forming the first protection film 25 at the corner 34 of the chip 10 will be explained with reference to FIGS. 9 and 10. FIG. 9 shows a step for forming the first protection film 25 on the side 33 of the chip 10. FIG. 10 is a cross sectional view of the wafer taken along line X-X in FIG. 9.

After the wafer is cut in a dicing cut process, the diced wafer is expanded in a wafer expanding process. Specifically, the grind tape, on which the wafer is mounted, is expanded in a radial direction, so that the chips 10 are separated from each other by a clearance 35.

Then, with using the injector 32, the first protection film 25 is applied to cover the corner 34 of the chip 10. In this case, the first protection film 25 is already formed on the main surface 14 of the chip 10. Thus, the first protection film 25 is applied to the side 33 of the chip 10 only. Further, along with the clearance 35, the injector 32 is moved, and the first protection film 25 is applied at each corner 34 with using the injector 32. Here, the phrase "along with the clearance 35" means that the injector 32 is moved along with the corner 34 of the chip 10.

Thus, as shown in FIG. 10, the first protection film 25 is formed on the side 33 of the chip 10. Here, in FIG. 10, the first protection film 14 is applied to a whole of the side 33 of the chip 10. Alternatively, the first protection film 25 may not be applied to the whole of the side 33 of the chip 10. The first protection film 25 may merely cover the corner 34 of the chip 10.

When the first protection film 25 is arranged at the corner 34 of the chip 10, current is prevented with the first protection film 25 at the corner 34 from flowing from the backside electrode 15 to the main surface 14 through the side 33 of the chip 10. Accordingly, the first protection film 25 protects from the short-circuit between the gate metal wiring 18 and the surface electrode 17. Further, the first protection film 25 protects from the short-circuit between the backside electrode 158 and a structure on the main surface 14.

Fourth Embodiment

Figure 11:
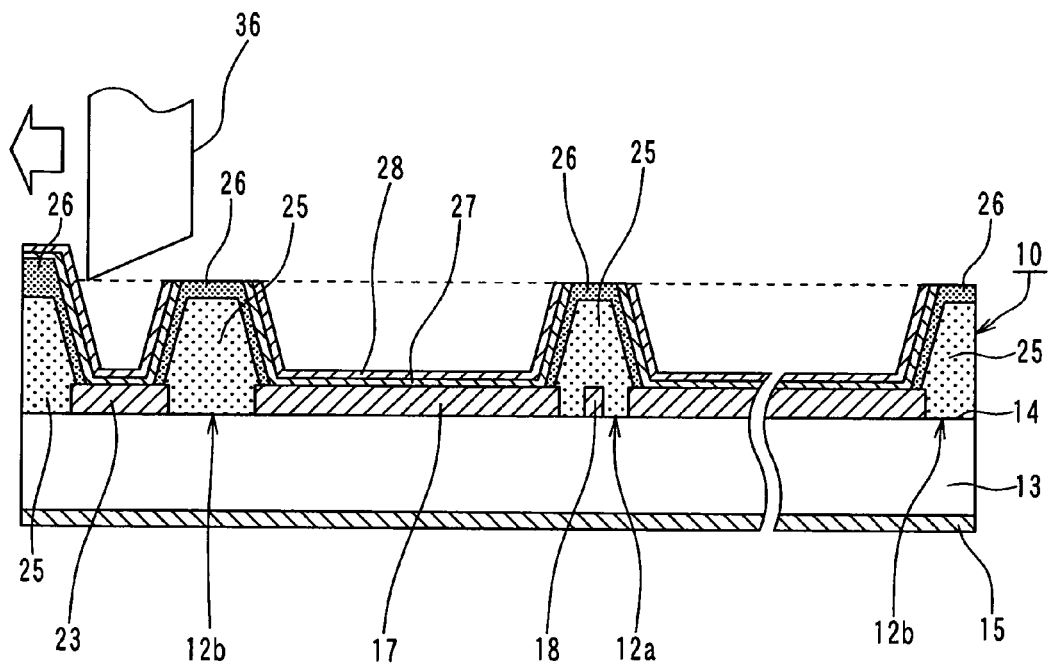
FIG. 11 is a diagram showing a step for cutting a part of a nickel film, a gold film and a second protection film according to a fourth embodiment.

In the present embodiment, the second protection film 26 is formed in the second passage 12*b*, on which the solder layer 29 is not formed. After the metal layers such as the nickel film 27 and the gold film 28 are formed on the main surface 14 of the chip 10 by a sputtering method or the like, a part of the metal layers, which is a unnecessary part, is cut and removed. The present embodiment will be explained with reference to FIG. 11. FIG. 11 corresponds to a cross sectional view of the device taken along line II-II in FIG. 1. However, the layout of the gate metal wiring 18 in FIG. 11 is different from that in FIG. 1.

Here, the term "cut" means a fine cut process. Specifically, the term "cut" means that an electrode for soldering is patterned by a mechanical processing method with using a step on a protection film. Here, the term "cut" in the first to third embodiments has the same meaning.

In the present embodiment, after the first and second protection films 25, 26 are formed on the main surface 14 of the chip 10, the nickel film 27 and the gold film 28 are formed not only on the surface electrode 17 but also on the first and second protection films 25, 26.

After that, as shown in FIG. 11, a part of the nickel film 27 and a part of the gold film 28 and a part of the second protection film 26 are cut by the bit 36 in such a manner that the second protection film 26 is exposed from the metal layers, i.e., the nickel film 27 and the gold film 28. Alternatively, a multi blade tool may be used for cutting. Thus, the nickel film 27 and the gold film 28 formed on the surface electrode 17 are electrically separated from the nickel film 27 and the gold film 28 formed on the pads 21-24.

When the cutting process is performed with using the bit 36 or the multi blade tool, if the stress caused by the bit 36 or the multi blade tool is applied to the second protection film 26 so that the crack 31 is generated in the second protection film 26, the crack 31 stops growing at the boundary between the first and second protection films 25, 26. Accordingly, the crack 31 is prevented from reaching the gate metal wiring 18. Even if the solder layer 29 penetrates into the crack 31, the short-circuit between the gate metal wiring 18 and the surface electrode 17 is prevented.

In FIG. 11, the second protection film 26 covers a whole of the first protection film 25. Alternatively, the second protection film 26 may be formed on an upper portion of the first protection film 25 as long as the stress from the bit 36 is not directly applied to the first protection film 25.

In FIG. 11, the second protection film 26 may be an organic film, which is easily cut. The second protection film may not be made of an inorganic film. The first protection film 25 may be made of an organic film or an inorganic film such as a glass layer and a nitride layer.

Figure 39:
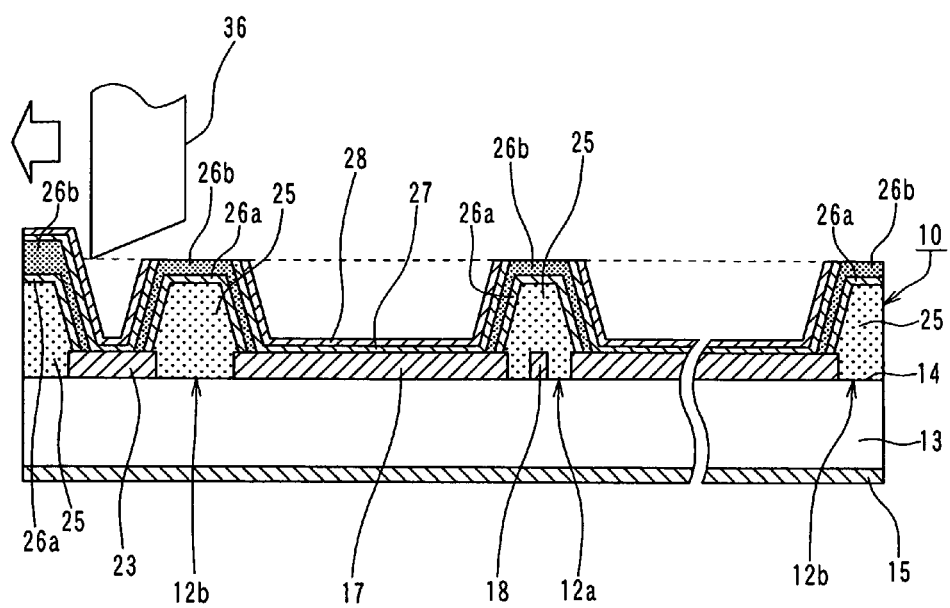
FIG. 39 is a diagram showing a step for cutting a part of a nickel film, a gold film and a second protection film according to a modification of the fourth embodiment.

Further, in FIG. 11, the second protection film 26 is made of a single layer. Alternatively, as shown in FIG. 39, the second protection film 26 may include two or more layers. Specifically, in FIG. 39, the second protection film 26 includes a lower second protection film 26*a* and an upper second protection film 26*b*. The lower second protection film 26*a* contacts the first protection film 25 so as to cover the first protection film 25. The upper second protection film 26*b* is disposed on the lower second protection film 26*a* so as to cover the lower second protection film 26*a*. In this case, the upper second protection film 26*b* may be made of an organic film, which is easily cut. The lower second protection film 26*a* and the first protection film 25 may be made of an organic film or an inorganic film such as a glass layer and a nitride layer.

Fifth Embodiment

Figure 12:
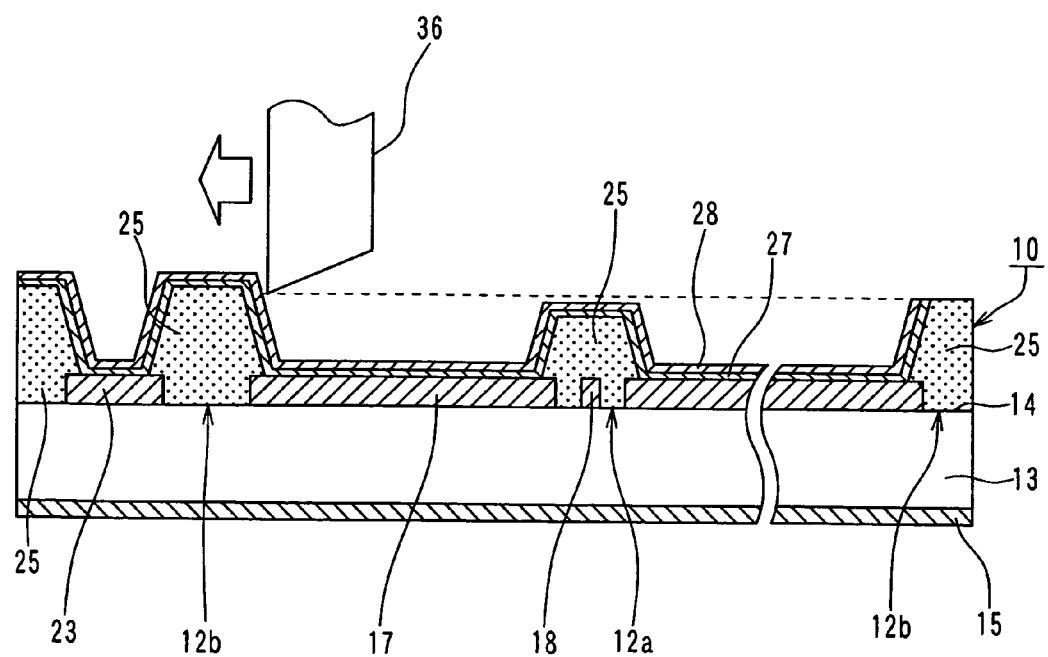
FIG. 12 is a diagram showing a step of cutting a part of a first protection film with a bit according to a fifth embodiment.

In the first to fourth embodiments, the second protection film 26 is formed on the first protection film 25 so that the stress in the solder layer 29 and the stress from the bit 36 and the like are not directly applied to the first protection film 25. In the present embodiment, without using the second protection film 26, the height of the first protection film 25 covering the gate metal wiring 18 is controlled to be lower than other parts so that the bit 36 does not contact the first protection film 25. Thus, the stress from the bit 36 is not applied to the first protection film 25. The present embodiment will be explained with reference to FIG. 12. FIG. 12 corresponds to a cross sectional view of the device taken along line II-II in FIG. 1. However, the layout of the gate metal wiring 18 in FIG. 12 is different from that in FIG. 1.

In the present embodiment, the surface electrode 17, the gate metal wiring 18, the sensor metal wiring 20 and the pads 21-24 such as the pad for the gate are formed on the main surface 14 of the chip 10. Then, the first protection film 25 is formed on the passage 12 on the main surface 14.

In this case, the first protection film 25 formed on the second passage 12*b*, on which the solder layer 29 is not mounted, has a height larger than a height of the first protection film 25 formed on the first passage 12*a*, on which the solder layer 29 is mounted. The first protection film 25 is applied with using the injector 32. The injecting amount of the injector 32 is controlled so that the height of the first protection film 25 is adjusted. Thus, the height of the first protection film 25 formed on the passage 12, on which the gate metal wiring 18 is arranged, can be controlled to be different from the height of the first protection film 25 formed on the passage 12, on which the hate metal wiring 18 is not arranged.

Then, the nickel film 27 and the gold film 28 are formed on the main surface 14 of the chip 10.

Next, as shown in FIG. 12, a part of the first protection film 25 on the second passage 12b on which the solder layer 29 is not mounted, the nickel film 27 and the gold film 28 are cut with using the bit 36 or the multi blade tool such that the first protection film 25 formed on the second passage 12b is exposed from the nickel film 27 and the gold film 28. Thus, the bit 36 does not contact the first protection film 25 covering the gate metal wiring 18 on which the solder layer 29 is mounted. The stress from the bit 36 is not applied to the first protection film 25 covering the gate metal wiring 18 on which the solder layer 29 is mounted. Accordingly, the crack 31 is not generated in the first protection film 25 covering the gate metal wiring 18 on which the solder layer 29 is mounted.

The metal layers such as the nickel film 27 and the gold film 28 on the first protection film 25 on which the solder layer 29 is not mounted are removed. Thus, the metal layers on the surface electrode 17 are electrically isolated from the metal layers on the pads 21-24.

When the height of the first protection film 25 is controller by the injector 32, the height of the first protection film 25 on the first passage 12a on which the solder layer 29 is mounted is lower than the height of the first protection film 25 formed on the second passage 12b on which the solder layer 29 is not mounted. Thus, the first protection film 25 formed on the second passage 12b, on which the solder layer 29 is not mounted, is not cut by the bit 36 or the multi blade tool.

Thus, since the stress caused in the cutting process of the bit 36 or the like is not applied to the first protection film 25 formed on the first passage 12a, on which the solder layer 29 is mounted, the crack 31 is not generated in the first protection film 25 on the first passage 12a, on which the solder layer 29 is mounted. Accordingly, a condition that the gate metal wiring 18 is covered with the first protection film 25 is maintained. Even if the solder layer 29 penetrates into the crack 31 in the first protection film 25, the gate metal wiring 18 and the surface electrode 17 does not shirt-circuit.

Sixth Embodiment

In the fourth embodiment, the part of the second protection film 26 is cut after the second protection film 26 is formed. In the present embodiment, a part of the first protection film 25 is cut, and after that, the second protection film 26 is formed.

Figure 13:
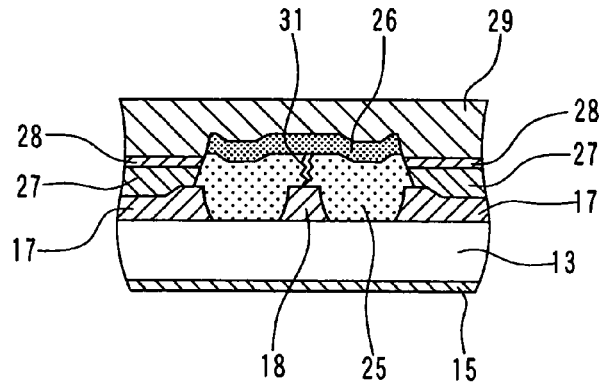
FIG. 13 is a diagram showing a partially enlarged cross sectional view of a semiconductor device according to a sixth embodiment.

FIG. 13 is a partially enlarged cross sectional view of a semiconductor device according to the present embodiment. FIG. 13 corresponds to the part IV in FIG. 3. The first protection film 25 is covered with the second protection film 26. The crack 31 is generated in the first protection film 25. Thus, although the crack 31 is generated in the first protection film 25, the second protection film 26 covers the first protection film 25, in which the crack 31 is generated. Thus, the solder layer 29 does not penetrate into the crack 31.

After the first protection film 25 is formed on the passage 12, the nickel film 27 and the gold film 28 are formed on the surface electrode 17 and the first protection film 25. A part of the first protection film 25, a part of the nickel film 27 and a part of the gold film 28 are cut by the bit 36 or the multi blade tool so as to expose the first protection film 25 from the nickel film 27 and the gold film 28. Thus, the nickel film 27 and the gold film 28 formed on the surface electrode 17 is electrically separated from the nickel film 27 and the gold film 28 formed on the pads 21-24.

Thus, when a part of the first protection film 25 is cut, the crack 31 may be generated in the first protection film 25 because of the stress of the bit 36 or the like.

Then, the second protection film 26 is applied to the first protection film 25 with using the injector 32. Thus, the second protection film 26 covers the crack 31 in the first protection film 25. Then, the wafer is divided into multiple semiconductor chips 10. Further, each chip 10 is packaged, and thus, the semiconductor device is completed.

Thus, even if the crack 31 is generated in the first protection film 25 when the part of the first protection film 25 is cut by the bit 36 or the like, the second protection film 26 is formed after the cutting process of the first protection film 25. Since the first and second protection films 25, 26 are formed in the above steps, the crack 31 is covered with the second protection film 26.

Thus, when the second protection film 26 is formed, the solder layer 29 does not reach the gate metal wiring 18 via the crack 31 generated in the first protection film 25. Thus, the gate metal wiring 18 and the surface electrode 17 do not short-circuit.

Seventh Embodiment

In the fifth embodiment, the height of the first protection film 25 on the first passage 12a on which the solder layer 29 is mounted is made lower than the height of the first protection film 25 on the second passage 12b on which the solder layer 29 is not mounted so that the first protection film 25 formed on the first passage 12a on which the solder layer 29 is mounted is not cut. Thus, it is necessary to control the height of the first protection film 25 according to a position of the film 25 on the passage 12.

In the present embodiment, without controlling the height of the first protection film 25, the first protection film 25 is formed. Even if the crack 31 is generated in the first protection film 25 when the first protection film 25 formed on the first passage 12a on which the solder layer 29 is mounted is cut, a member disposed on the gate metal wiring 18 prevents the crack 31 from reaching the gate metal wiring 18.

Figure 14:
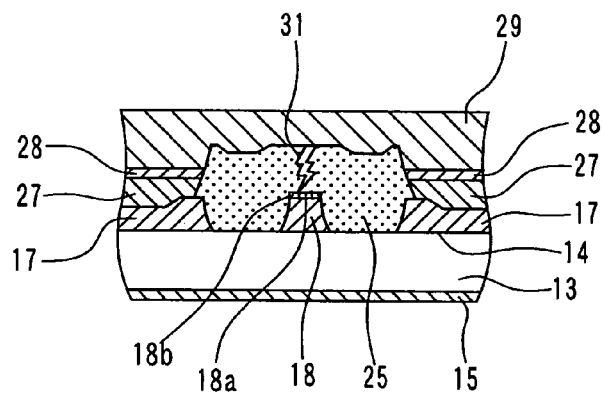
FIG. 14 is a diagram showing a partially enlarged cross sectional view of a semiconductor device according to a seventh embodiment.

FIG. 14 shows a partially enlarged cross sectional view of a semiconductor device according to the present embodiment. FIG. 14 corresponds to the part IV in FIG. 3. The gate metal wiring 18 is formed on the main surface 14 of the chip 10. The gate metal wiring 18 is covered with the first protection film 25.

Further, an insulation layer 18b is formed on a top surface 18a of the gate metal wiring 18, which is covered with the solder layer 29. The top surface 18a faces the metal plate, and is opposite to the main surface 14 of the chip 10. The insulation film 18b is prepared by processing a part of the gate metal wiring 18 in an insulation process when the gate metal wiring 18 is formed. Accordingly, the insulation layer 18b is a part of the gate metal wiring 18.

The insulation layer 18b is made of Al2O3 or AlN or the like. Thus, when the gate metal wiring 18 is made of, for example, aluminum, the insulation layer 18b can be formed by only adding oxygen or nitrogen. The insulation layer 18b may be formed not only on the top surface of the gate metal wiring 18 but also on a side of the gate metal wiring 18.

As shown in FIG. 14, the gate metal wiring 18 and the insulation layer 18b are covered with the first protection film 25. When the insulation layer 18b is formed on the top surface 18a of the gate metal wiring 18, even if the stress is applied to the first protection film 25, and the crack 31 is generated in the first protection film 25, the crack 31 stops growing the insulation layer 18b. Thus, even if the solder layer 29 penetrates into the crack 31, the solder layer 29 does not contact the gate metal wiring 18. Thus, the solder 29 does not electrically couple with the gate metal wiring 18.

The above structure is formed by the following steps. First, an aluminum metal film is formed on the surface of the wafer, on which the IGBT is formed. The aluminum metal film is prepared by sputtering method. After sputtering an aluminum target, a small amount of oxygen gas or nitrogen gas is added in an argon sputtering gas so that aluminum atoms reacts with oxygen atoms or nitrogen atoms. Thus, a reactive sputtering process is performed. Thus, an aluminum insulation layer is formed on a top surface of the aluminum metal film. This aluminum insulation layer provides the insulation layer 18b.

Then, the aluminum metal film together with the aluminum insulation layer is etched in an etching process. Specifically, a resist is formed on a gate-metal-wiring-layer-to-be-formed region, which is formed of the aluminum insulation layer and the aluminum metal film. The aluminum insulation layer exposed from the resist is etched. Then, another resist is formed on the aluminum metal film exposed from the resist, which corresponds to the surface electrode 17, the sensor metal wiring 20 and the pads 21-24. The aluminum metal film exposed from the other resist is etched. Thus, the surface electrode 17, the gate metal wiring 18, the sensor metal wiring 20 and the pads 21-24 are formed.

Thus, the etching step for etching the aluminum insulation layer so as to form the insulation layer 18b is performed at the same time as the etching step for etching the aluminum metal film. It is not necessary to add a new step for forming the insulation layer 18b.

After that, for example, similar to the fifth embodiment, the first protection film 25 is applied on the passage 12. The nickel film 27 and the gold film 28 are formed on the surface electrode 17, the pads 21-24 and the first protection film 25. A part of the first protection film 25 and a part of the nickel film 27 and a part of the gold film 28 are cut with the bit 36 or the like so that the nickel film and the gold film 28 are exposed from the first protection film 25. Thus, the surface electrode 17 is electrically insulated from the pads 21-24.

Thus, even if the stress is applied to the first protection film 25, and the crack 31 is generated in the first protection film 25 when the first protection film 25 is cut, the crack 31 stops growing at the insulation layer 18b, which is formed on the top surface 18a of the gate metal wiring 18. Accordingly, even when the metal plate 30 is mounted on the surface electrode 17 via the solder layer 29, the solder layer 29 does not reach the gate metal wiring 18 through the crack 31. The insulation layer 18b blocks the solder layer 29 from reaching the gate metal wiring 18.

When the insulation layer 18b is formed on the top surface 18a of the gate metal wiring 18, the gate metal wiring 18 and the surface electrode 17 do not short-circuit.

Eighth Embodiment

In the seventh embodiment, the insulation layer 18b is formed on the top surface 18a of the gate metal wiring 18 so that the insulation layer 18b protects the crack 31 from growing. In the present embodiment, the top surface of the first protection film 25 is processed in a surface processing step so that the solder layer 29 is restricted from penetrating into the crack 31.

Figure 15:
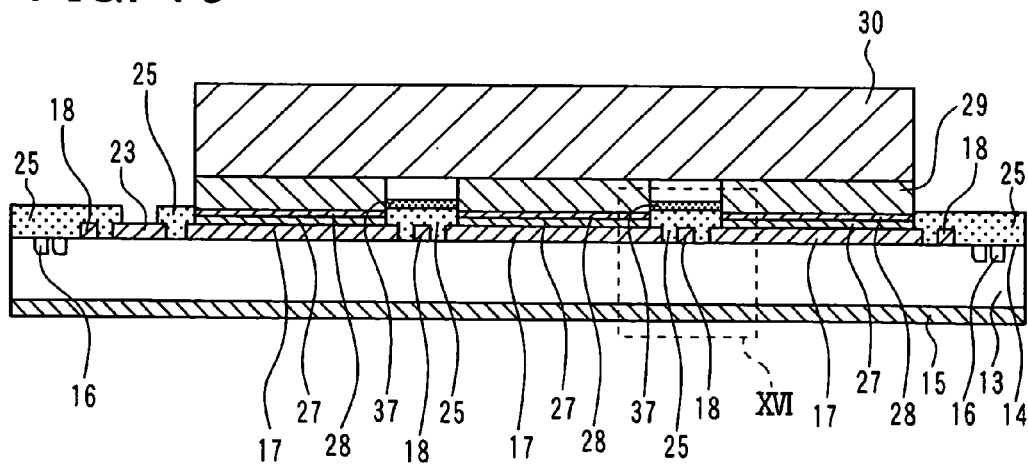
FIG. 15 is a diagram showing a part of a cross sectional view of a semiconductor device including a semiconductor chip according to an eighth embodiment.
Figure 16:
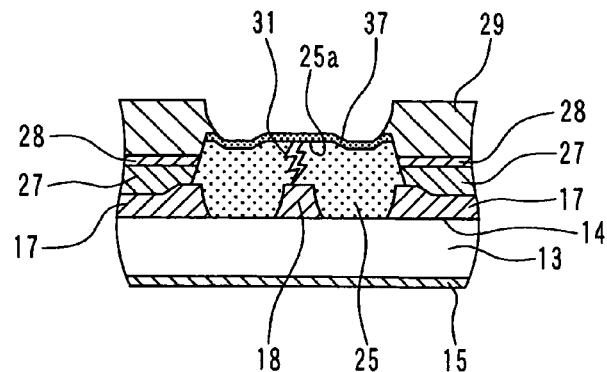
FIG. 16 is a diagram showing a partially enlarged cross sectional view of a part XVI of the device in FIG. 15.

FIG. 15 shows a semiconductor device including a semiconductor chip 10 according to the present embodiment. FIG. 16 shows a part XVI in FIG. 15.

As shown in FIG. 15, the gate metal wiring 18 is formed on the main surface 14 of the chip 10. The gate metal wiring 18 is covered with the first protection film 25. The first protection film 25 includes a fluorine surface processed layer 37, which is disposed on the first protection film 25.

Specifically, the first protection film 25 includes the fluorine surface processed layer 37 on the top surface 25a of the first protection film 25, as shown in FIG. 16. The top surface 25a of the first protection film 25 is covered with the solder layer 29, and faces the metal plate 30 so that the top surface 25a is opposite to the main surface 14 of the chip 10.

The fluorine surface processed layer 37 is an insulation layer prepared by fluorinating the top surface 25a of the first protection film 25. The fluorine surface processed layer 37 has very low solder wettability of the solder layer 29. Accordingly, as shown in FIGS. 15 and 16, the solder layer 29 is not formed on the fluorine surface processed layer 37.

The fluorine surface processed layer 37 is formed by the following process. The first protection film 25 is formed to cover the gate metal wiring 18. The nickel film 27 and the gold film 28 are formed on the first protection film 25. Then, a part of the first protection film 25, a part of the nickel film 27 and a part of the gold film 28 are cut with the bit 36 or the like. After that, the top surface 25a of the first protection film 25 is fluorinated so that the fluorine surface processed layer 37 is formed on the top surface 25a of the first protection film 25.

When the fluorine surface processed layer 37 is formed, the fluorine surface processed layer 37 covers the crack 31 even if the crack 31 is generated in the first protection film 25 during the cutting step of the first protection film 25. Accordingly, when the solder layer 29 is formed on the fluorine surface processed layer 37, the solder layer 29 does not penetrate into the crack 31.

After the first protection film 25 is cut, the fluorine surface processed layer 37 is formed by fluorinating the top surface 25a of the first protection film 25. Thus, the solder layer 29 is restricted from reaching the gate metal wiring 18 through the crack 31. Accordingly, the gate metal wiring 18 and the surface electrode 17 does not short-circuit.

Ninth Embodiment

In the eighth embodiment, the fluorine surface processed layer 37 is formed on the first protection film 25. The solder layer 29 is restricted from penetrating into the crack 31. In the present embodiment, a solder penetration prevention member is formed on the first protection film 25. Further, the solder penetration prevention member is sandwiched between the metal plate and the first protection film 25.

Figure 17:
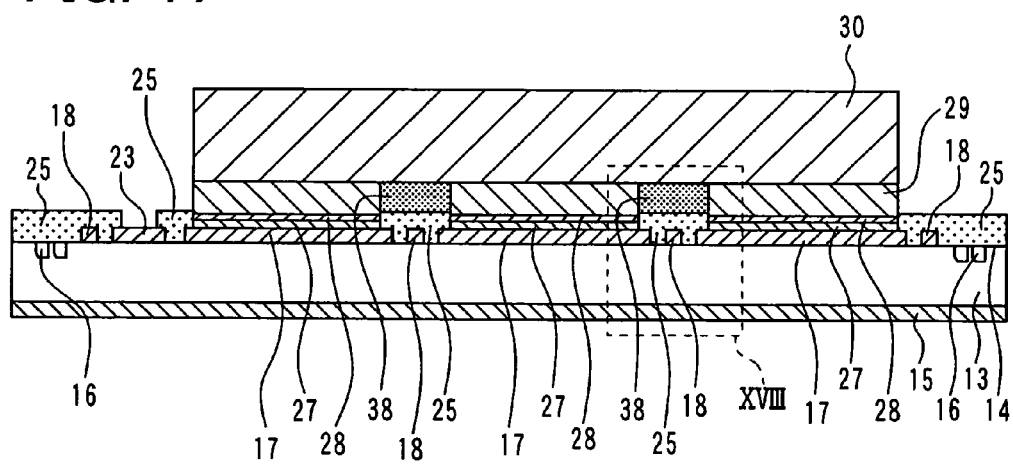
FIG. 17 is a diagram showing a part of a cross sectional view of a semiconductor device including a semiconductor chip according to a ninth embodiment.
Figure 18:
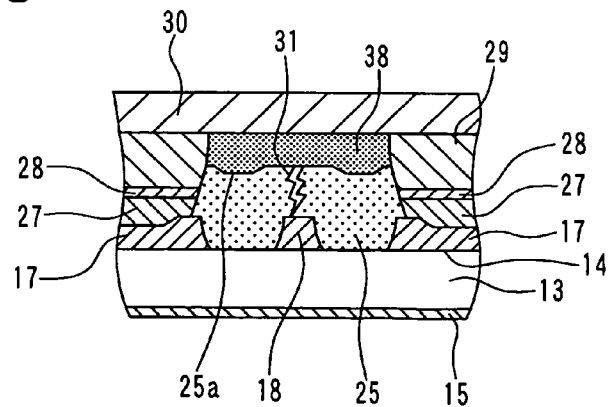
FIG. 18 is a diagram showing a partially enlarged cross sectional view of a part XVIII of the device in FIG. 17.

FIG. 17 shows a semiconductor device including a semiconductor chip 10 according to the present embodiment. FIG. 18 is a partially enlarged cross sectional view of a part XVIII in FIG. 17.

As shown in FIG. 17, the first protection film 25 includes the solder penetration prevention member 38 disposed on the first protection film 25. Specifically, the solder penetration prevention member 38 is formed on the first protection film 25, which is covered with the solder layer 29, as shown in FIG. 18. Further, the solder penetration prevention member 38 is sandwiched between the metal plate 30 and the first protection film 25.

The solder penetration prevention member 38 is made of soft material. For example, the solder penetration prevention member 38 is made of poly imide or soft resin having flexibility. When the solder penetration prevention member 38 is made of poly imide, the solder penetration prevention member 38 is formed on the first protection film 25 with using the injector 32.

The solder penetration prevention member 38 is disposed on the top surface 25a of the first protection film 25. Further, a side of the solder penetration prevention member 38 opposite to the first protection film 25 contacts the metal plate 30. Accordingly, as shown in FIG. 18, even if the crack 31 is generated, the solder layer 29 cannot penetrate into the crack 31.

The solder penetration prevention member 38 is formed on the first protection film 25 by the following method. The nickel film 27 and the gold film 28 are formed on the first protection film 25. Then, a part of the first protection film 25, a part of the nickel film 27 and a part of the gold film 28 are cut. After that, the solder penetration prevention member 38 is formed on the top surface 25a of the first protection film 25. When the solder penetration prevention member 38 is made of poly imide, the solder penetration prevention member 38 is formed on the first protection film 25, which is covered with the solder layer 29, with using the injector 32.

Then, the metal plate 30 is bonded to the gold film 28 via the solder layer 29. In this case, the metal plate 30 is mounted on the chip 10 via the solder layer 29 in such a manner that the solder penetration prevention member 38 is sandwiched between the metal plate 30 and the first protection film 25.

Thus, the solder penetration prevention member 38 is formed to the first protection film 25, and the solder penetration prevention member 38 is sandwiched between the metal plate 30 and the first protection film 25. Thus, when the first protection film 25 is cut, the stress of the bit 36 or the like is applied to the first protection film 25, and the crack 31 may be generated in the first protection film 25. The solder penetration prevention member 38 covers the crack 31. Further, the solder penetration prevention member 38 is sandwiched between the metal plate 30 and the first protection film 25 so that the solder layer 29 is mounted only on the surface electrode 17. Accordingly, even if the crack 31 is generated in the first protection film 25, the solder layer 29 is restricted from penetrating into the crack 31 and from reaching the gate metal wiring 18. Accordingly, the gate metal wiring 18 and the surface electrode 17 do not short-circuit.

Tenth Embodiment

In the eighth and ninth embodiments, the fluorine surface processed layer 37 and the solder penetration prevention member 38 are formed on the first protection film 25 so that the solder layer 29 does not penetrate into the crack 31. In the present embodiment, the metal plate 30 directly contacts the first protection film 25 so that the solder layer 29 does not penetrate into the crack 31.

Figure 19:
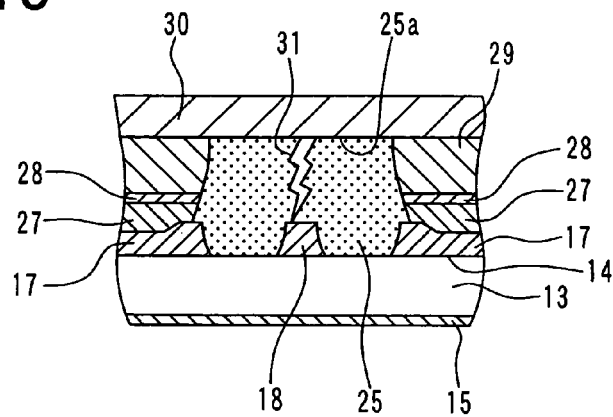
FIG. 19 is a diagram showing a partially enlarged cross sectional view of a semiconductor device according to a tenth embodiment.

FIG. 19 shows a semiconductor device according to the present embodiment. FIG. 19 corresponds to the part XVIII in FIG. 17. As shown in FIG. 19, the top surface 25a of the first protection film 25 directly contacts the metal plate 30. The top surface 25a is disposed on the metal plate side and opposite to the main surface 14 of the chip 10. Thus, the first protection film 25 is covered with the metal plate 30. Even if the crack 31 is generated in the first protection film 25, the crack 31 is covered with the metal plate 30. Thus, the solder layer 29 does not penetrate into the crack 31.

The above structure is manufactured by the following method. After the first protection film 25 is formed, the nickel film 27 and the gold film 28 are formed on the first protection film 25. The first protection film 25 reaches the metal plate 30, and therefore, it is preferable to form the first protection film 25 with using the injector 32 to be sufficiently high.

Then, a part of the first protection film 25, a part of the nickel film 27 and a part of the gold film 28 are cut so that the top surface 25a of the first protection film 25 is exposed from the nickel film 27 and the gold film 28. Then, the metal plate 30 is bonded to the gold film 28 via the solder layer 29. In this case, the metal plate 30 is mounted on the chip 10 via the solder layer 29 under a condition that the top surface 25a of the first protection film 25 contacts the metal plate 30.

Thus, when the top surface 25a of the first protection film 25 directly contacts the metal plate 30, the crack 31 is covered with the metal plate 30 even if the stress from the bit 36 or the like is applied to the first protection film 25, and the crack 31 is generated in the first protection film 25 when the first protection film 25 is cut by the bit 36 or the like. Thus, the solder layer 29 is mounted only on the surface electrode 17. The solder layer 29 is restricted from penetrating into the crack 31. Thus, the first metal wiring 18 and the surface electrode 17 do not short-circuit.

Eleventh Embodiment

In the tenth embodiment, the metal plate 30 contacts the first protection film 25. In the present embodiment, a protrusion is formed on the metal plate 30, and the protrusion contacts the first protection film 25.

Figure 20:
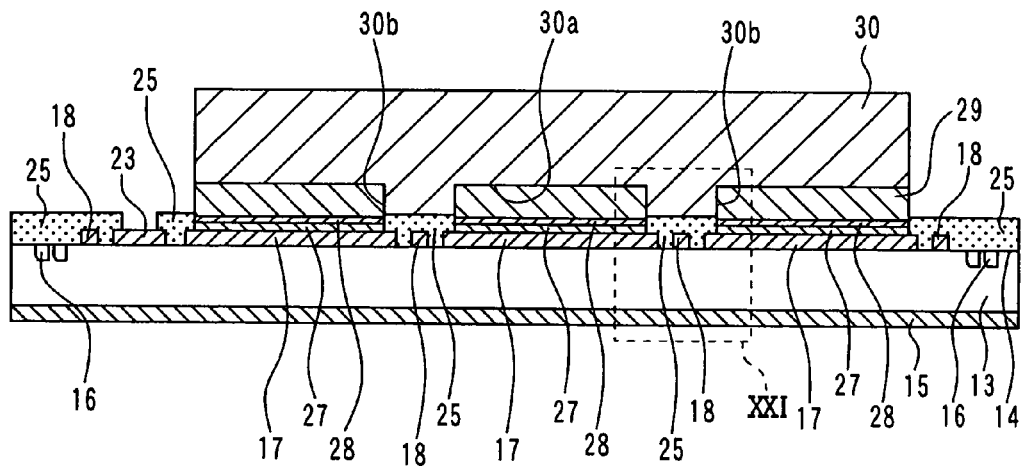
FIG. 20 is a diagram showing a partially enlarged cross sectional view of a semiconductor device according to an eleventh embodiment.
Figure 21:
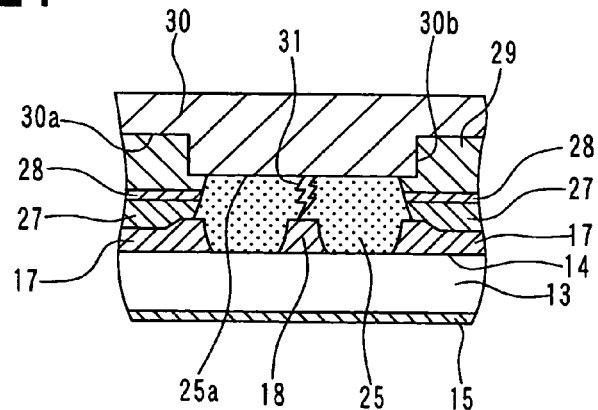
FIG. 21 is a diagram showing a partially enlarged cross sectional view of a part XXI of the device in FIG. 20.

FIG. 20 shows a semiconductor device including a semiconductor chip 10 according to the present embodiment. FIG. 21 shows a partially enlarged cross sectional view of a part XXI in FIG. 20.

As shown in FIG. 20, the metal plate 30 includes a protrusion 30b, which protrudes from a contact surface 30a of the metal plate 30 toward the semiconductor chip side. The contact surface 30a is disposed on the chip side. The protrusion 30b faces the first protection film 25 so that the protrusion 30b contacts the first protection film 25.

As shown in FIG. 21, the top surface 25a of the first protection film 25, which is covered with the metal plate 30 and disposed on the metal plate side opposite to the main surface 14 of the chip 10, contacts the protrusion 30b formed on the contact surface 30a of the metal plate 30. Even if the crack 31 is generated in the first protection film 25, the crack 31 is covered with the protrusion 30b of the metal plate 30. Thus, the solder layer 29 does not penetrate into the crack 31.

The metal plate 30 having the protrusion 30b may be formed in a press-processing method of metal material.

Specifically, the above structure is formed by the following method. After the first protection film 25 is formed, the nickel film 27 and the gold film 28 are formed on the first protection film 25. A part of the first protection film 25, a part of the nickel film 27 and a part of the gold film 28 are cut, so that the top surface 25a of the first protection film is exposed from the nickel film 27 and the gold film 28.

Next, the metal plate 30 having the protrusion 30b is prepared. The protrusion 30b contacts the top surface 25a of the first protection film 25, which is disposed on the metal plate side with respect to the main surface 14 of the chip 10. The metal plate 30 is bonded to the gold film 28 via the solder layer 29 under a condition that the protrusion 30b contacts the top surface 25a.

Thus, the protrusion 30b is formed on the metal plate 30. The protrusion 30b directly contacts the top surface 25a of the first protection film 25. The solder layer 29 is not disposed on the top surface 25a of the first protection film 25. Thus, even if the crack 31 is generated in the first protection film 25, the solder layer 29 does not reach the gate metal wiring 18 through the crack 31. Accordingly, the first metal wiring 18 and the surface electrode 17 do not short-circuit.

Twelfth Embodiment

In the fifth embodiment, the height of the first protection film 25 on the first passage on which the solder layer 29 is mounted is different from the height of the first protection film 25 on the second passage on which the solder layer 29 is mounted. In the present embodiment, the first protection film 25 is formed on the passage 12 at any place even when the solder layer 29 is not mounted on the passage 12. Then, the height of the first protection film 25 on the first passage 12a on which the solder layer 29 is mounted is lowered.

Figure 22A:
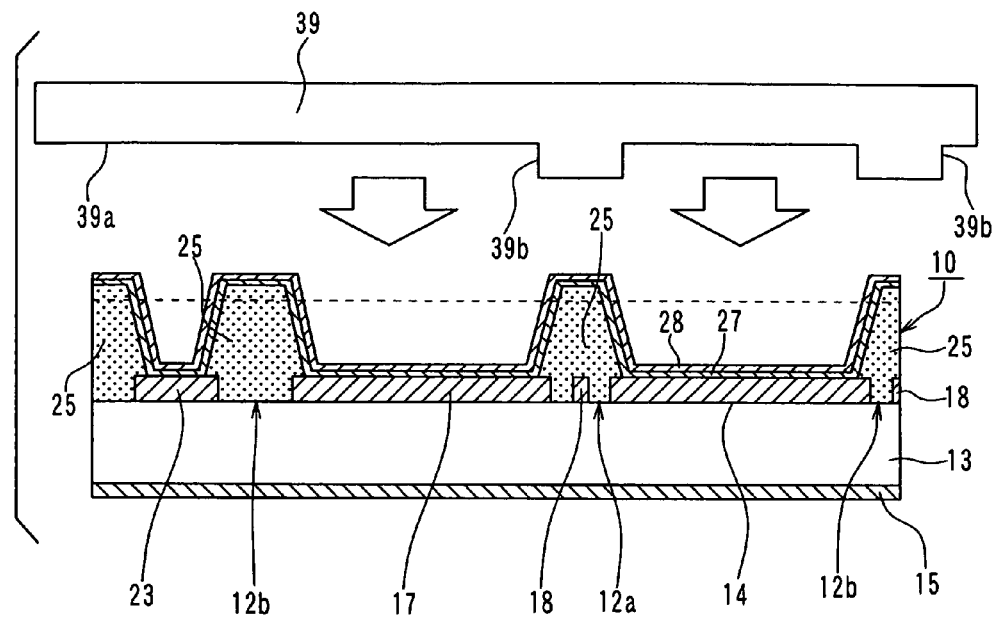
FIGS. 22A and 22B are diagrams showing parts of a manufacturing process of a semiconductor device according to a twelfth embodiment.
Figure 22B:
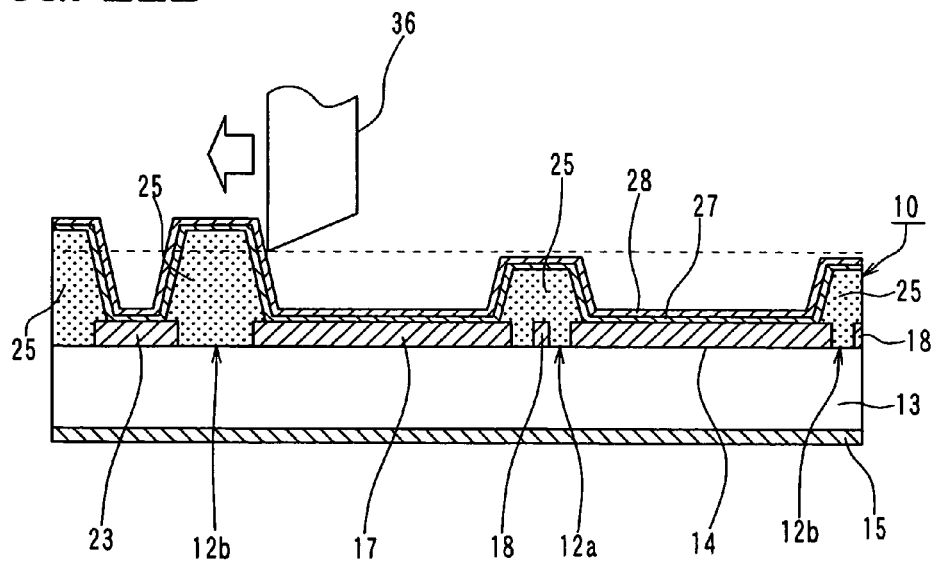

FIGS. 22A and 22B show a manufacturing process of a semiconductor device according to the present embodiment. The manufacturing method will be explained as follows.

The first protection film 25 is formed on the passage 12 of the chip 10. In this case, it is not necessary to control the height of the first protection film 25 on the first passage 12a and the height of the first protection film 25 on the second passage 12b. For example, as shown in FIG. 22A, the height of the first protection film 25 on the first passage 12a may be higher than the height of the first protection film 25 on the second passage 12b.

After that, the nickel film 27 and the gold film 28 are formed on the surface electrode 17 and the first protection film 25.

Then, a press element 39 shown in FIG. 22A is prepared. The press element 39 includes one side 39a and a protrusion 39b, which protrudes from the one side 39a. The protrusion 39b faces the first protection film 25, which is disposed on the first passage 12a, on which the solder layer 29 is mounted.

Then, the one side 39a of the press element 39 faces the main surface 14 of the chip 10, and the press element 39 approaches the chip 10 along with an arrow shown in FIG. 22A. Thus, the protrusion 39b presses the first protection film 25 on the first passage 12a to lower the height of the first protection film 25. Thus, the height of the first protection film 25 in the first passage 12a with respect to the main surface 14 of the chip 10 is lower than the height of the first protection film 25 on the second passage 12b with respect to the main surface 14 of the chip 10.

As shown in FIG. 22B, a part of the first protection film 25 on the second passage 12b, a part of the nickel film 27 and a part of the gold film 28 are cut by the bit 36 or the like so as to expose the first protection film 25 on the second passage 12b from the nickel film 27 and the gold film 28. Then, the wafer is divided into multiple chips 10.

In the pressing process with the press element 39, the removal of the nickel film 27 and the gold film 28 in the cutting process provides to control the height of a necessary part and the height of an unnecessary part. Thus, the first protection film 25 formed on the second passage 12b, on which the solder layer 29 is not mounted, is selectively cut. Accordingly, the first protection film 25 covering the gate metal wiring 18 is not cut. Thus, the crack 31 is restricted from being generated in the first protection film 25 on the gate metal wiring 18. Thus, the gate metal wiring 18 and the surface electrode 17 do not short-circuit.

Thirteenth Embodiment

Figure 25:
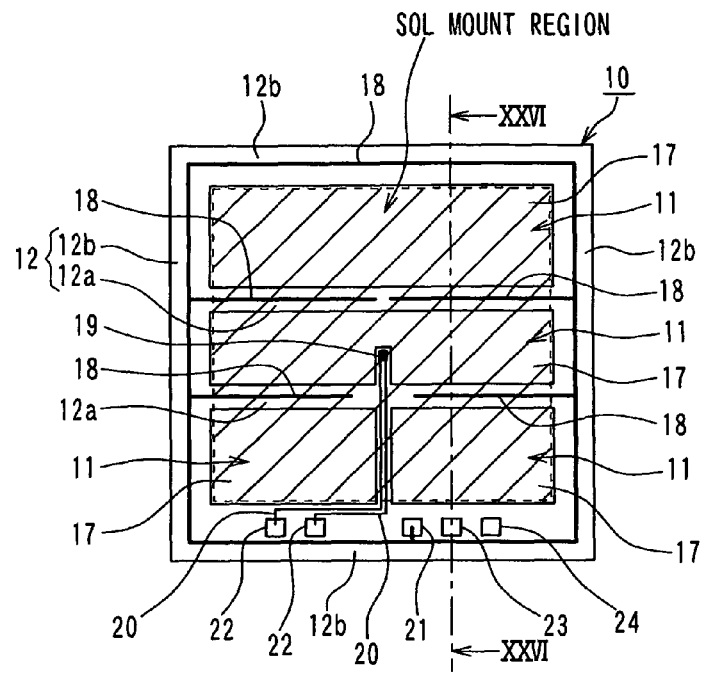
FIG. 25 is a diagram showing a plan view of a semiconductor chip according to a thirteenth embodiment.
Figure 26:
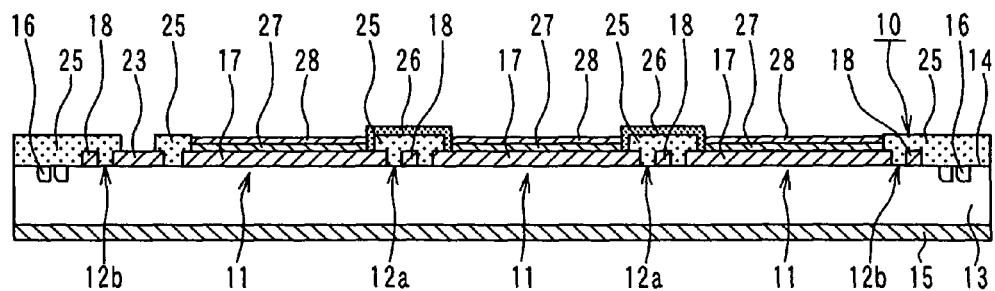
FIG. 26 is a diagram showing a cross sectional view of the chip taken along line XXVI-XXVI in FIG. 25.
Figure 27:
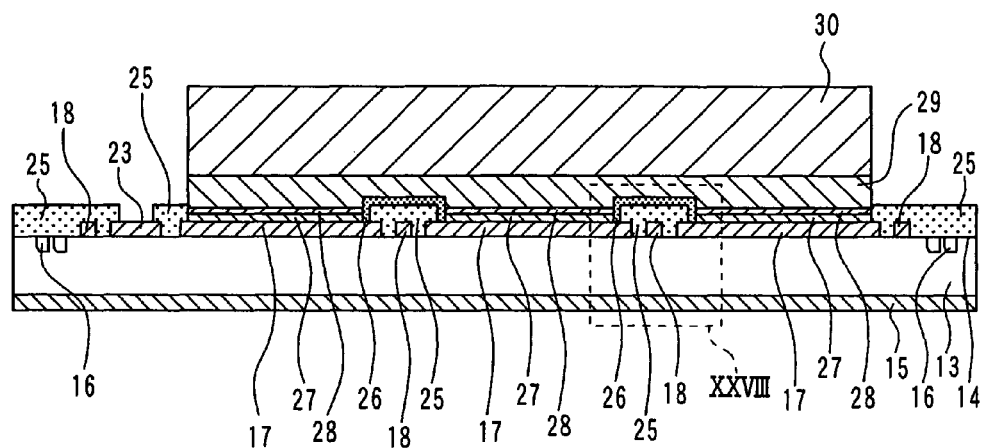
FIG. 27 is a diagram showing a part of a cross sectional view of a semiconductor device including the semiconductor chip.
Figure 28:
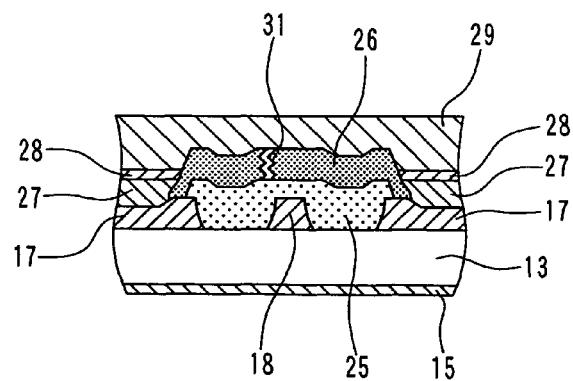
FIG. 28 is a diagram showing a partially enlarged cross sectional view of a part XXVIII of the device in FIG. 27.

FIG. 25 shows a semiconductor chip 10 in a semiconductor device according to a thirteenth embodiment. FIG. 26 shows a cross sectional view of the device taken along line XXVI-XXVI in FIG. 25. FIG. 27 shows a part of a cross sectional view of the device corresponding to a cross sectional view of the device taken along line XXVI-XXVI in FIG. 25. FIG. 28 shows a partially enlarged cross sectional view of a part XXVIII of the device in FIG. 27.

The chip 10 in FIGS. 25-28 is similar to the chip 10 in FIGS. 1-4. Thus, difference between the chip 10 in FIGS. 25-28 and the chip 10 in FIGS. 1-4 will be explained.

In the chip 10 in FIGS. 1-4, the Ni film 27 and the gold film 28 as the metal layer are formed on the top surface of the surface electrode 17 and the side of the second protection film 26. Further, the Ni film 17 and the gold film 28 are formed by the sputtering method.

However, in the chip 10 in FIGS. 25-28, the Ni film 27 and the gold film 28 as the metal layer are formed only on the top surface of the surface electrode 17. The Ni film 27 and the gold film 28 are formed by, for example, a nonelectrolytic plating method.

Further, in the manufacturing method of the chip 10 in FIGS. 1-4, the nickel film 27 and the gold film 28 are formed in this order on the surface electrode 17 exposed from the first protection film 25, the second protection film 26 and the pads 21-24 by the sputtering method.

However, in the manufacturing method of the chip in FIGS. 25-28, the nickel film 27 and the gold film 28 are formed in this order on the surface electrode 17 exposed from the first protection film 25 such that a nickel plating step and a gold plating step are formed by a nonelectrolytic plating method. Here, each pad 21-24 may be formed by a nickel plating method and a gold plating method, respectively. Further, the backside electrode 15 is formed on the backside of the wafer such that a Ti/Ni/Au layer is deposited by an evaporation method or the like.

In the present embodiment, the second protection film 26 is applied to a part of the first protection film 25 which is covered with the solder layer 29 with using the injector 32.

Thus, the stress from the solder layer 29 is not directly applied to the first protection film 25. Further, even if the crack 31 such as a scratch is generated in the second protection film 26, the crack 31 does not cross over the boundary between the first and second protection films 25, 26. Accordingly, the crack 31 does not reach the gate metal wiring 18, which is covered with the first protection film 25. Thus, the gate metal wiring 18 and the surface electrode 17 does not short-circuit.

Since the second protection film 26 is formed with using the injector 32, the second protection film 26 can be formed on a necessary part of the first protection film 25. Accordingly, a photo lithography step and an etching step for patterning the second protection film 26 are not necessary.

Fourteenth Embodiment

In the first to fifth embodiments, the gate metal wiring 18 is formed on the first passage 12a. In the present embodiment, the gate metal wiring 18 is not formed on a part of the main surface 14, on which the solder layer 29 is mounted.

Figure 29:
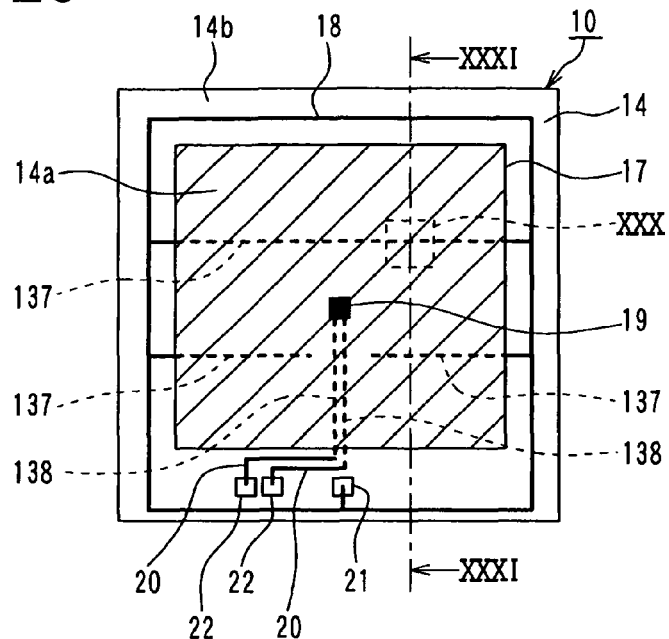
FIG. 29 is a diagram showing a plan view of a semiconductor device according to a fourteenth embodiment.

FIG. 29 shows a semiconductor device according to the present embodiment. In FIG. 29, the pad 23 for the current sensor and the pad 24 for a Kelvin emitter are not shown.

In the present embodiment, the center portion of the main surface 14 of the chip 10, shown as a shaded region in FIG. 29 provides a solder mounting region 14a, on which the solder layer 29 is mounted. A no-solder region 14b, on which no solder layer 29 is mounted, surrounds the solder mounting region 14a. The no-solder region 14b corresponds to the second passage 12b, on which no solder layer 29 is mounted.

In the chip 10, a gate region 137 for providing a trench gate structure is formed on both of the solder mounting region 14a and the no-solder region 14b. Specifically, the gate region 137 is retrieved from an inside of the center portion of the main surface 14 to the outside of the center portion.

In the present embodiment, in the chip 10, a wiring region 138 is formed such that the wiring region 138 is retrieved from an inside of the center portion of the main surface 14 to the outside of the center portion, similar to the gate region 137. The wiring region 138 has a similar structure as the trench gate structure of the gate region 137.

Specifically, a trench (not shown) is formed in the substrate 13. A sidewall oxide film is formed on a sidewall of the trench. Further, the wiring region 138 made of poly silicon is formed on the sidewall oxide film in the trench. The temperature sensor 19 is disposed in the trench, which is similar to the wiring region 138. The wiring region 138 and the temperature sensor 19 are connected to each other in the trench. The wiring region 138 is retrieved from the solder mounting region 14a to the no-solder region 14b. Since an insulation film such as an oxide film is formed on the temperature sensor 19, so that the temperature sensor 19 is insulated from the surface electrode 17.

The surface electrode 17 is formed on a whole of the solder mounting region 14a of the main surface 14 of the chip 10. Thus, a bonding strength of the solder layer 29 with respect to the surface electrode 17 is improved since a bonding area between the surface electrode 17 and the solder layer 29 in the solder mounting region 14a is larger than a bonding area in a case where the surface electrode 17 is formed in each cell 11 shown in FIGS. 1 and 6.

Further, as shown in FIG. 29, the gate metal wiring 18 is not formed on the solder mounting region 14a of the main surface 14 of the chip 10. The gate metal wiring 18 is formed on the no-solder region 14b. The gate metal wiring 18 is electrically coupled with the gate region 137 only on the no-solder region 14b of the main surface 14 of the chip 10. Thus, the gate region 137 is electrically coupled with the pad 21 for the gate via the gate metal wiring 18.

Similarly, the wiring region 138 is electrically coupled with the sensor metal wiring 20 only on the no-solder region 14b of the main surface 14 of the chip 10. Thus, the temperature sensor 19 is electrically coupled with the sensor pad 22 via the wiring region 138 and the sensor metal wiring 20.

Figure 30:
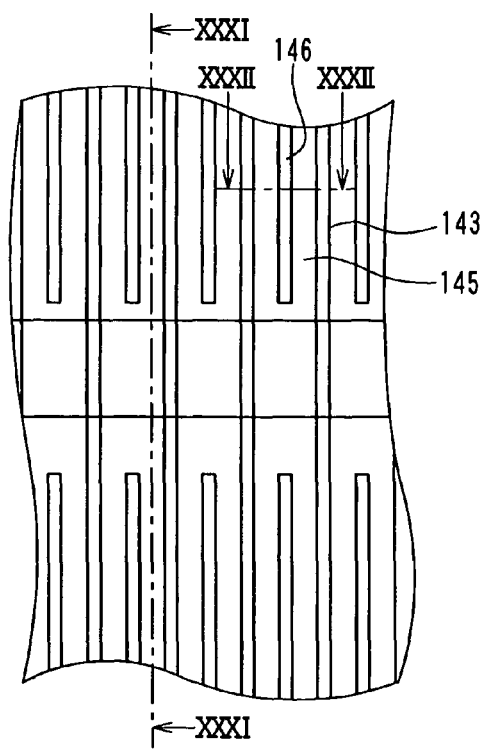
FIG. 30 is a diagram showing a partially enlarged plan view of a part XXXII of the device in FIG. 29.
Figure 31:
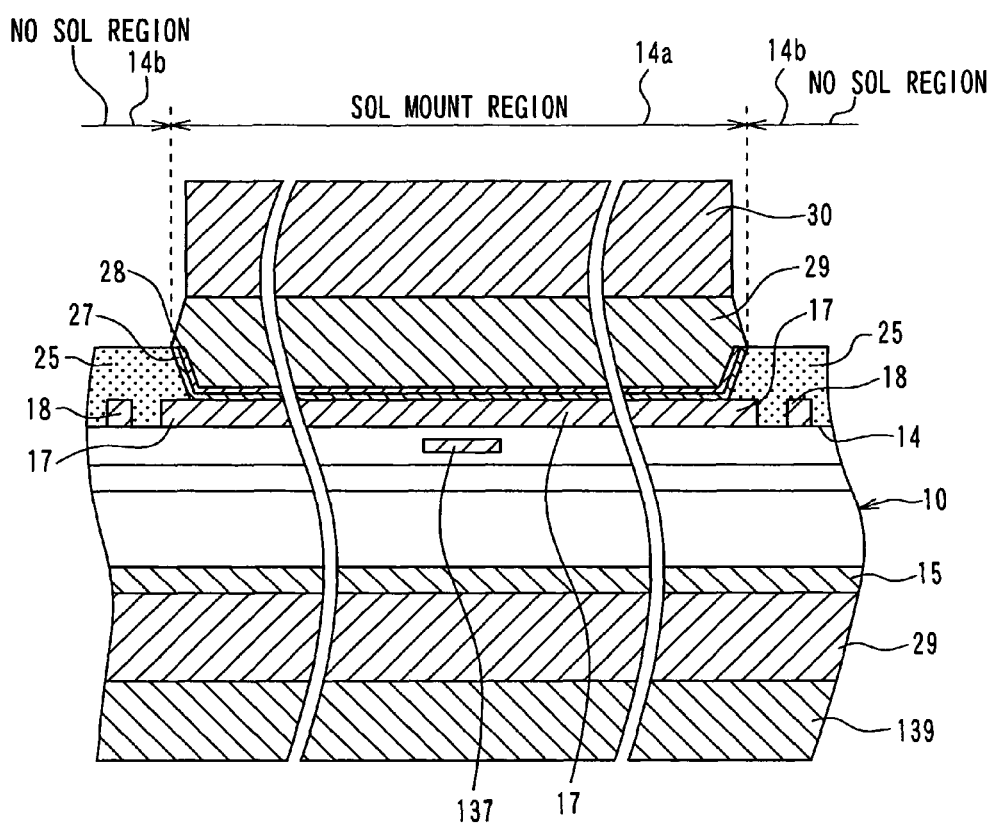
FIG. 31 is a diagram showing a part of a cross sectional view of the device taken along line XXXI-XXXI in FIGS. 29 and 30.
Figure 32:
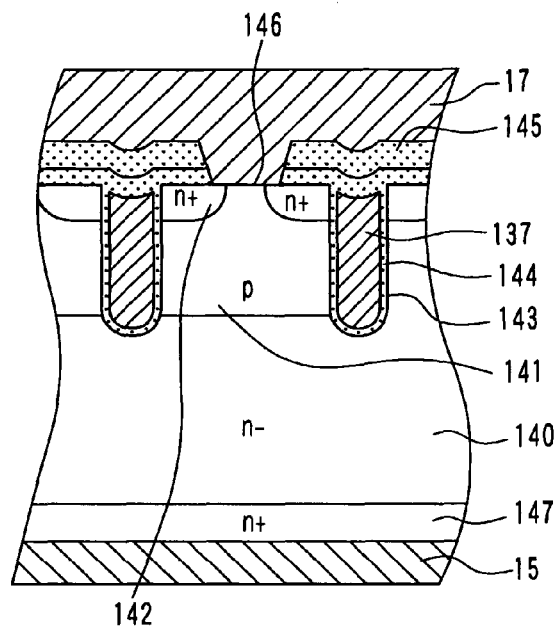
FIG. 32 is a diagram showing a part of a cross sectional view of the device taken along line XXXII-XXXII in FIG. 30.

FIGS. 30-32 show the chip 10. In FIG. 31, the metal plate 30 is mounted on the surface electrode 17 via the solder layer 29. Further, a lead frame 139 is mounted on the backside electrode 15 via the solder layer 29.

As shown in FIG. 31, the gate metal wiring 18 is not arranged on the solder mounting region 14a of the main surface 14. Thus, the first protection film 25 is not also formed on the solder mounting region 14a. Further, the second protection film 26 is not formed on the first protection film 25 to cover the first protection film 25.

The gate metal wiring 18 is formed on the no-solder region 14b of the main surface 14. The first protection film 25 covers the gate metal wiring 18. Thus, the first protection film 25 is disposed on the no-solder region 14b. It is not necessary to cover the first protection film 25 with the second protection film 26.

FIG. 32 shows a structure of an IGBT as a semiconductor element according to the present embodiment. As described above, a P type base layer 141 is formed in a surface portion of a N⁻ type drift layer 140. A N⁺ type emitter region 42 as an emitter region is formed in a surface portion of the base layer 141. A trench 143 is formed to penetrate the emitter region 142 and the base layer 141 and to reach the drift layer 140. A gate insulation film 144 and the gate region 137 are formed on an inner wall of the trench 143 in this order. The trench 143, the gate insulation film 144 and the gate region 137 provide the trench gate structure. A part of the emitter region 142 and the trench gate structure are covered with a BPSG film 145. The surface electrode 17 is formed on the main surface 14 of the chip 10 so as to cover the BPSG film 145. A contact portion between the surface electrode 17 and the main surface 14 provides a contact portion 146. The contact portion 146 has a stripe pattern. A N+ type layer 147 is formed on an opposite side of the drift layer 140. The backside electrode 15 is formed on the N+ type layer 147.

The semiconductor device has the above structure. Here, the structure of the IGBT may be applied to the semiconductor device in each embodiment.

The manufacturing method of the semiconductor device will be explained as follows. Multiple semiconductor chips 10 having the trench gate structure shown in FIG. 32 are formed in a wafer. In this case, the gate region 137 and the wiring region 138 are disposed to cross over the solder mounting region 14a and the no-solder region 14b. One end of the gate region 137 and one end of the wiring region 138 are exposed on the no-solder region 14b.

Then, a metal film is formed on a surface of the wafer. A photo resist is applied to the surface of the metal film, and patterned by a photo lithography method. Thus, the photo resist corresponding to the surface electrode 17, the gate metal wiring 18, the sensor metal wiring 20 and the pads 21-24 remains. A part of the metal film to be the gate metal wiring 18 and the sensor metal wiring 20 contacts the gate region 137 and the wiring region 138 on the no-solder region 14b.

A part of the photo resist corresponding to the surface electrode 17 remains to form the surface electrode 17 on a whole of the solder mounting region 14a of the main surface 14 of the chip 10. A part of the photo resist corresponding to the gate metal wiring 18 and the sensor metal wiring 20 remains to form the gate metal wiring 18 and the sensor metal wiring 20 on the no-solder region 14b of the main surface 14 of the chip 10.

A wet etching process is performed with using the photo resist as a mask. Thus, the metal film is patterned. Thus, the surface electrode 17, the gate metal wiring 18, the sensor metal wiring 20 and the pads 21-24 are formed at the same time. Then, the photo resist is removed. In this case, the gate metal wiring 18 and the sensor metal wiring 20 are formed on the no-solder region 14b of the main surface 14 of the chip 10. Further, the gate region 137 and the gate metal wiring 18 are electrically coupled only on the no-solder region 14b of the main surface 14 of the chip 10. The wiring region 138 and the sensor metal wiring 20 are electrically coupled only on the no-solder region 14b of the main surface 14 of the chip 10.

Then, a poly imide film is formed on a whole of the wafer. Then, a part of the poly imide film at a predetermined position remains on the wafer so that the first protection film 25 is formed. Thus, the gate metal wiring 18 and the sensor metal wiring 20 on the no-solder region 14b are covered with the first protection film 25. Alternatively, the first protection film 25 may be formed with using the injector 32.

Then, the nickel film 27 and the gold film 28 are formed on the first protection film 25 and the surface electrode 17. The backside electrode 15 is formed on the back side of the wafer.

Figure 33:
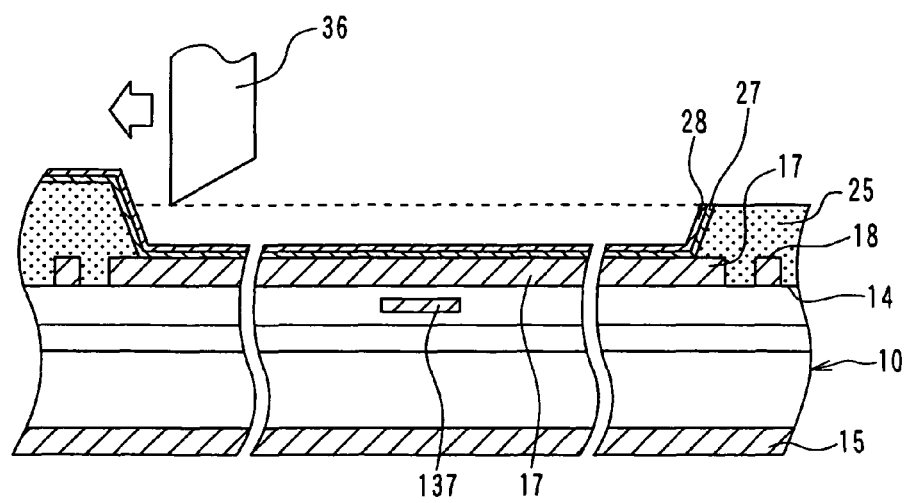
FIG. 33 is a diagram showing a cross sectional view of a step of cutting a first protection film according to the fourteenth embodiment.

As shown in FIG. 33, with using the bit 36 or the multiple blade tool, the nickel film 27, the gold film 28 and the first protection film 25 are cut so as to expose the first protection film 25 from the nickel film 27 and the gold film 28. Thus, the nickel film 27 and the gold film 28 formed on the surface electrode 17, and the nickel film 27 and the gold film 28 formed on the pads 21-24 are electrically separated from each other.

When the bit 36 or the multiple blade tool are used for cutting, eve if the stress caused by the bit 36 or the multiple blade tool is applied to the first protection film 25, the crack 31 is not generated in the first protection film 25 on the solder mounting region 14a since the first protection film 25 is not formed on the solder mounting region 14a. Further, even if the crack is generated in the first protection film 25 on the no-solder region 14b, the solder layer 29 is not disposed on the first protection film 25 on the no-solder region 14b. Thus, the solder layer 29 does not penetrate into the crack 31 and reach the gate metal wiring 18. Thus, the gate metal wiring 18 and the surface electrode 17 are not short-circuited.

After that, a dicing tape is applied to the wafer, and the wafer is divided into multiple chips 10. The metal plate 30 is bonded to the chip 10 via the solder layer 29. Further, each pad 21-24 is coupled with a corresponding lead terminal via a wire. The lead frame 139 as a lower heat sink is bonded to the backside electrode 15. An upper heat sink is bonded to the metal plate 30. Then, the chip 10 is sealed with resin mold. Thus, the semiconductor device is completed.

In the present embodiment, the gate metal wiring 18 covered with the first protection film 25 is formed on the no-solder region 14b. The gate region 137 of the semiconductor device is retrieved from the solder mounting region 14a to the no-solder region 14b. The gate metal wiring 18 and the gate region 137 are electrically coupled with each other only on the no-solder region 14b.

Thus, even when the first protection film 25 is cut with the bit 36 or the like in the manufacturing process of the semiconductor device, the solder layer 29 does not penetrate into the crack 31 in the first protection film 25 since the first protection film 25 is disposed only on the no-solder region 14b. Further, since the first protection film 25 is not covered with the solder layer 29, the stress from the solder layer 29 is not applied to the first protection film 25. Further, the crack is not generated in the first protection film 25 by the stress from the solder layer 29. Accordingly, the gate metal wiring 18 and the surface electrode 17 are not short-circuited.

Further, it is not necessary to form the second protection film 26 to cover the first protection film 25. The manufacturing process is simplified, and the manufacturing cost is reduced.

Figure 37:
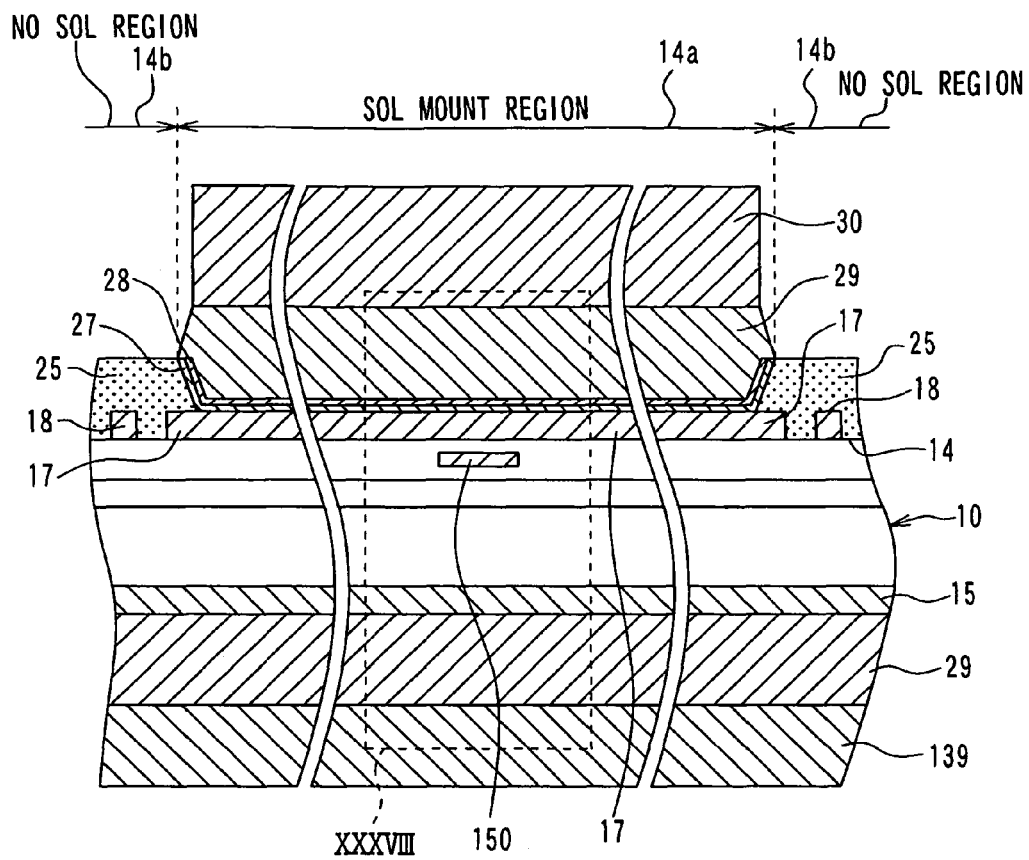
FIG. 37 is a diagram showing a part of a cross sectional view of a semiconductor device according to a modification of the fourteenth embodiment.
Figure 38:
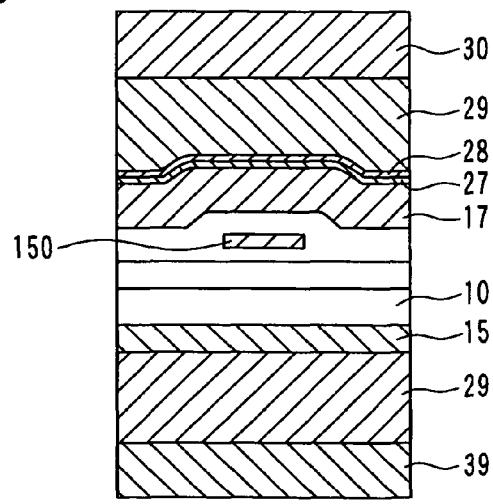
FIG. 38 is a diagram showing a partially enlarged cross sectional view of a part XXXVII of the device in FIG. 37.

In the above embodiment, the gate region 137 may be made of aluminum or poly crystal silicon. Alternatively, as shown in FIGS. 37 and 38, the device may include a gate runner 150. The gate runner 150 and the gate region 137 are connected to each other via a contact portion at a predetermined position of the device. The gate runner 150 may be made of a metal film such as an aluminum film. Alternatively, the gate runner may be made of poly crystal silicon. The gate runner 150 and the gate region 137 may be integrated or separated.

Fifteenth Embodiment

In the fourteenth embodiment, the surface electrode 17 is formed on a whole of the solder mounting region 14a. Alternatively, the surface electrode 17 may be divided to correspond to each cell 11. Thus, in the present embodiment, the chip 10 includes multiple cells 11, each of which includes the semiconductor device. Multiple passages 12 are disposed around the cells 11.

Figure 34:
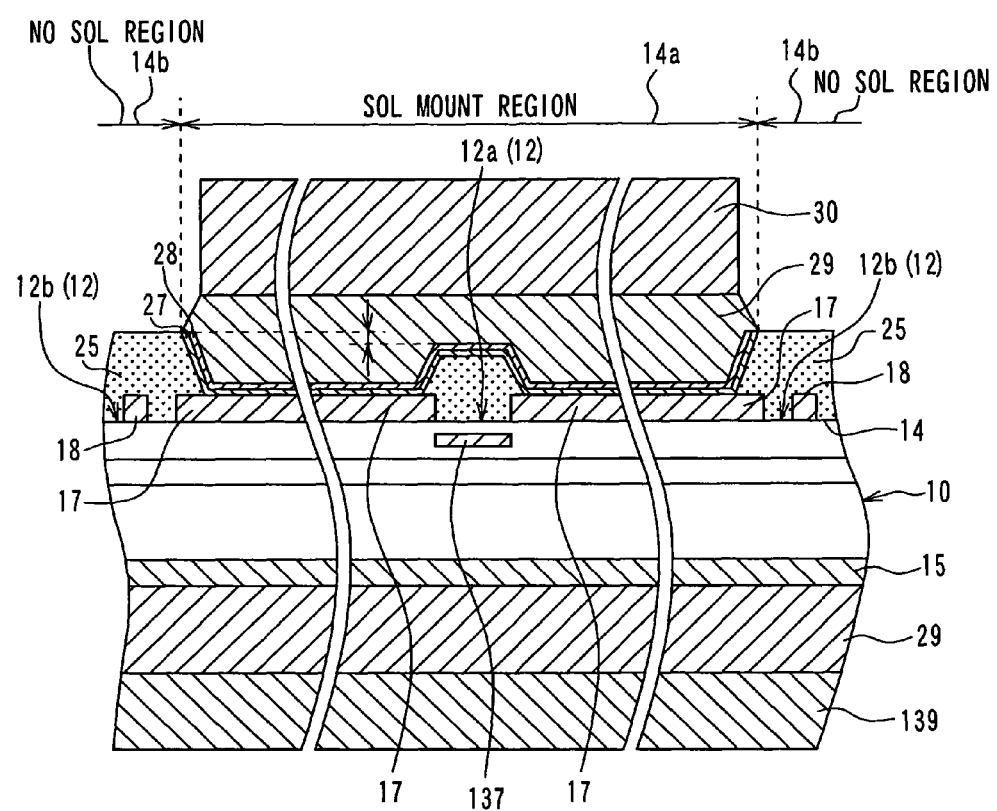
FIG. 34 is a diagram showing cross sectional view of a semiconductor chip according to a fifteenth embodiment.

FIG. 34 shows a cross sectional view of the semiconductor device according to the present embodiment. FIG. 34 corresponds to the cross section of the device taken along line XXXI-XXXI in FIG. 29. In FIG. 34, the metal plate 30 and the lead frame 139 are bonded to the chip 10 via the solder layer 29.

As shown in FIG. 34, multiple surface electrodes 17 are formed on the main surface 14 of the chip 10. The first protection film 25 is formed on a whole of the passages 12. Thus, the first protection film 25 covers the whole of the main surface 14, which is exposed from the surface electrode 17.

The height of the first protection film 25 formed on first passage 12a in the solder mounting region 14a with respect to the main surface 14 of the chip 10 as a height reference is lower than the height of the first protection film 25 formed on second passage 12b in the no-solder region 14b with respect to the main surface 14. Accordingly, a part of the first protection film 25, the nickel film 27 and the gold film 28, which are formed in the no-solder region 14b, are cut so as to expose the first protection film 25 in the no-solder region 14b from the nickel film 27 and the gold film 28.

Specifically, the height of the gold film 28 on the first protection film 25 in the solder mounting region 14a with respect to the main surface 14 as a height reference is lower than the height of the first protection film 25 in the no-solder region 14b. Thus, even when the first protection film 25 in the no-solder region 14b is cut by the bit 36 or the like, the nickel film 27 and the gold film 28 on the first protection film 25 in the solder mounting region 14a are not cut.

In the above structure, since the gate metal wiring 18 and the sensor metal wiring 20 are not formed on the first passage 12a in the solder mounting region 14a, the gate metal wiring 18 and the surface electrode 17 are not short-circuited in the solder mounting region 14a. Further, since the height of the first protection film 25 formed in the solder mounting region 14a is lower than the height of the first protection film 25 formed in the no-solder region 14b, the first protection film 25 in the solder mounting region 14a is not cut, i.e., machinery processed by the bit 36 or the like. Thus, the crack 31 is not generated in the first protection film 25 in the solder mounting region 14a.

When the semiconductor device is manufactured, multiple semiconductor chips 10 are formed in the wafer. Each chip 10 includes multiple cells 11 having the semiconductor devices, and multiple passages 12 disposed around the cells 11 on the main surface 14 of the chip 10.

When the first protection film 25 is formed, the first protection film 25 is formed on a whole of the passages 12. In this case, the first protection film 25 is formed such that the height of the first protection film 25 on the first passage 12a in the solder mounting region 14a with reference to the main surface 14 of the chip 10 is lower than the height of the first protection film 25 on the second passage 12a in the no-solder region 14b.

When the first protection film 25 is cut, a part of the first protection film 25, the nickel film 27 and the gold film 28, which are formed in the no-solder region 14b, are cut so as to expose the first protection film 25 in the no-solder region 14b from the nickel film 27 and the gold film 28. In this case, the first protection film 25 formed in the solder mounting region 14a is not cut, so that the stress from the bit 36 or the like is not applied to the first protection film 25 in the solder mounting region 14a. Since the gate metal wiring 18 is not formed in the solder mounting region 14a, the gate metal wiring 18 and the surface electrode 17 are not short-circuited in the solder mounting region 14a.

Sixteenth Embodiment

In the fifteenth embodiment, the height of the first protection film 25 in the solder mounting region 14a is lower than the height of the first protection film 25 in the no-solder region 14b. In the present embodiment, the first protection film 25 formed on a whole of the passages 12 in both of the solder mounting region 14a and the no-solder region 14b has a constant height.

Figure 35:
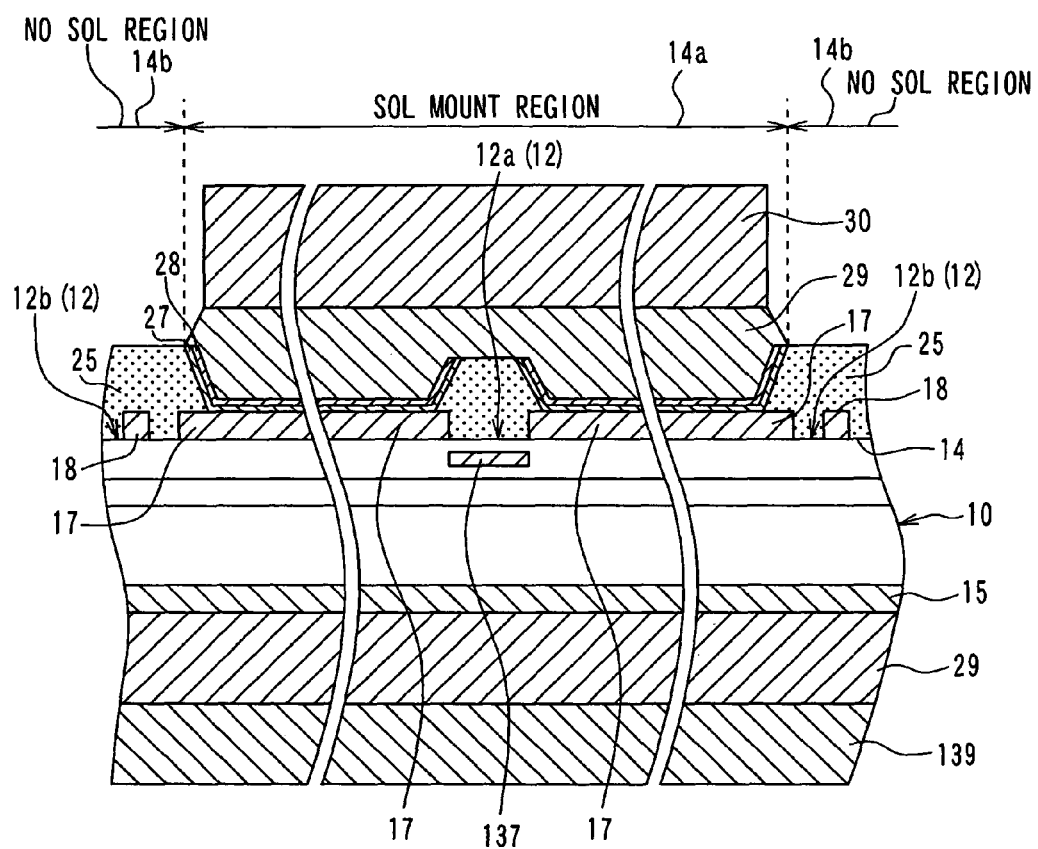
FIG. 35 is a diagram showing cross sectional view of a semiconductor chip according to a sixteenth embodiment.

FIG. 35 shows a cross sectional view of a semiconductor device according to the present embodiment. FIG. 35 corresponds to the cross section of the device taken along line XXXI-XXXI in FIG. 29. In FIG. 35, the metal plate 30 and the lead frame 139 are bonded to the chip 10 via the solder layer 29.

As shown in FIG. 35, in the present embodiment, a part of the first protection film 25, the nickel film 27 and the gold film 28 are cut so as to expose the first protection film 25 in both of the solder mounting region 14a and the no-solder region 14b from the nickel film 27 and the gold film 28. Thus, the height of the first protection film 25 on the Y main surface 14 in the solder mounting region 14a is the same as the height of the first protection film 25 on the main surface 14 in the no-solder region 14b.

The above structure is prepared such that a part of the first protection film 25, the nickel film 27 and the gold film 28 are cut by the bit 36 or the like so as to expose the first protection film 25 formed in both of the solder mounting region 14a and the no-solder region 14b from the nickel film 27 and the gold film 28 after the nickel film 27 and the gold film 28 are formed on the first protection film 25 and the surface electrode 17.

Thus, when the first protection film 25 in the solder mounting region 14a is cut, and the stress from the bit 36 or the like is applied to the first protection film 25, even if the crack 31 is generated in the first protection film 25, since the gate metal wiring 18 is not formed in the solder mounting region 14a, the surface electrode 17 and the gate metal wiring 18 are not short-circuited with the solder layer 29 penetrated into the crack 31.

Seventeenth Embodiment

In the fifteenth embodiment, the height of the first protection film 25 on the first passage 12a, on which the solder layer 29 is disposed, is lower than the height of the first protection film 25 on the second passage 12b, on which the solder layer 29 is not disposed. Accordingly, the first protection film 25 on the first passage 12a is not processed with the bit 36 or the like. In the present embodiment, the first protection film 25 on the first passage 12a is cut. Further, non-conductive material 148 is mixed in the first protection film 25. The non-conductive material 148 is made of particles of organic material or fibers of in-organic material. Thus, even if the crack 31 is generated in the first protection film 25, the crack 31 is stopped proceeding by the non-conductive material 148.

In the present embodiment, similar to the fifth embodiment, the gate metal wiring 18 is formed on the first passage 12a.

Figure 36:
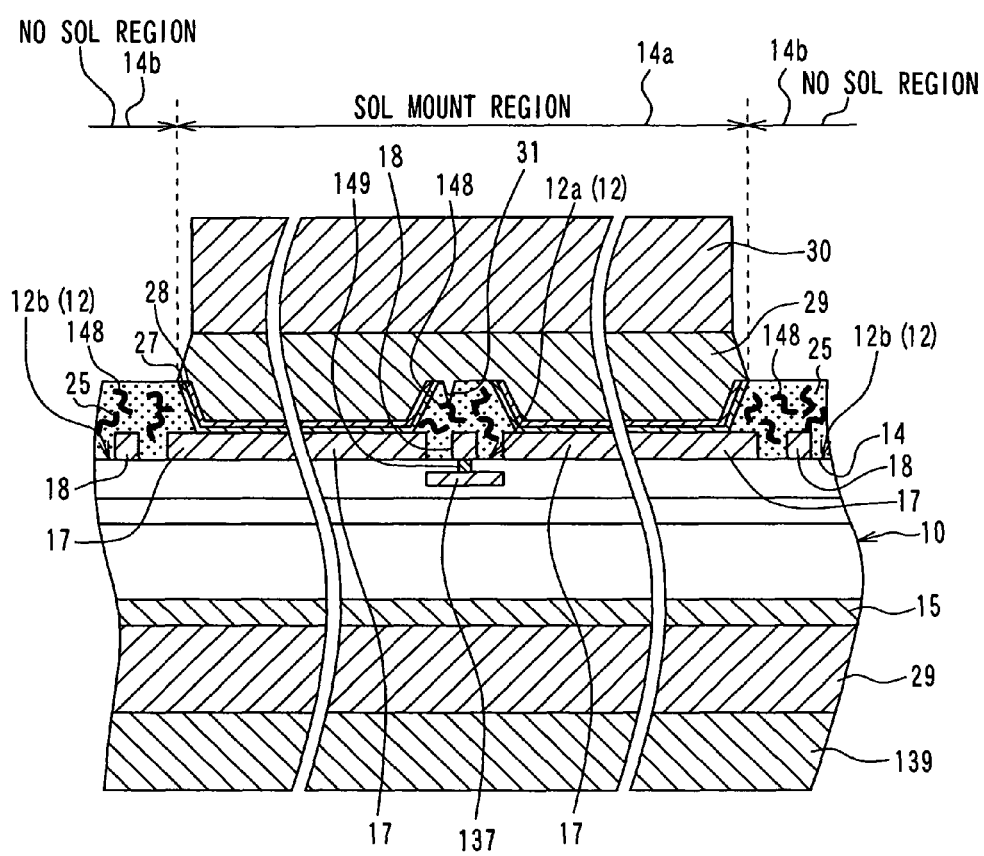
FIG. 36 is a diagram showing cross sectional view of a semiconductor chip according to a seventeenth embodiment.

FIG. 36 shows a cross sectional view of a semiconductor device according to the present embodiment. FIG. 36 corresponds to the cross section of the device taken along line XXXI-XXXI in FIG. 29. In FIG. 35, the metal plate 30 and the lead frame 139 are bonded to the chip 10 via the solder layer 29. Further, the gate metal wiring 18 is connected to the gate region 137 via a via hole 149.

The non-conductive material 148 is mixed in the first protection film 25. The non-conductive material 148 is made of, for example, inorganic fibers such as acrylic fibers and carbon nano-tubes or organic particles such as glass particles and epoxy particles. In the present embodiment, the non-conductive material 148 is made of acrylic fibers.

Since the non-conductive material 148 is mixed in the first protection film 25, the non-conductive material 148 prevents proceeding, i.e., growth of the crack 31 generated in the first protection film 25. Accordingly, even when the crack 31 is generated in the first protection film 25, and the solder layer 29 penetrates into the crack 31, the solder layer 29 does not reach the gate metal wiring 18. Thus, the gate metal wiring 18 and the surface electrode 17 are not short-circuited.

In the present embodiment, the gate metal wiring 18 is formed on the first passage 12a. Alternatively, similar to the fifteenth embodiment, the gate metal wiring 18 may not be formed on the first passage 12a.

Other Embodiments

In the above embodiments, the temperature sensor 19 is formed in the semiconductor chip 10. Alternatively, the chip 10 may not include the temperature sensor 19. Even when the temperature sensor 19 is not formed in the chip 10, the sensor metal wiring 20 may be formed as a wiring on the main surface 14 of the chip 10.

In the first to fourth embodiments, the poly imide film is formed on a whole of the wafer, and then, a part of the poly imide film is left at a predetermined position so that the first protection film 25 is formed on the wafer. Alternatively, the first protection film 25 may be formed with using the injector 32, similar to the second protection film 26.

In the fifth embodiment, without using the second protection film 26, the height of the first protection film 25 is controlled. In this case, similar to the second embodiment, the gate metal wiring 18 and the sensor metal wiring 20 may be arranged on the same passage in parallel to each other. Further, similar to the third embodiment, the first protection film 25 may be applied to the corner 34 of the chip 10.

In the twelfth embodiment, after the press process is performed with using the press element 39, the wafer is divided into multiple chips 10. Alternatively, the wafer may be divided into multiple chips 10, and then, the press process may be performed with using the press element 39. The protrusion 39b of the press element 39 is formed at a predetermined position on the one side 39a, which faces at least the first protection film 25 formed on the first passage 12a, on which the solder layer 29 is mounted. Alternatively, the protrusion 39b may be formed at other positions. For example, the protrusion 39b may be formed at a position of the one side 39a, which faces a region on which the solder layer 29 is mounted. Thus, it is easy to position the protrusion 39b to face the first protection film 25 on the first passage 12a, compared with a case where the protrusion 39b only faces the first protection film 25 on the first passage 12a.

Figure 23A:
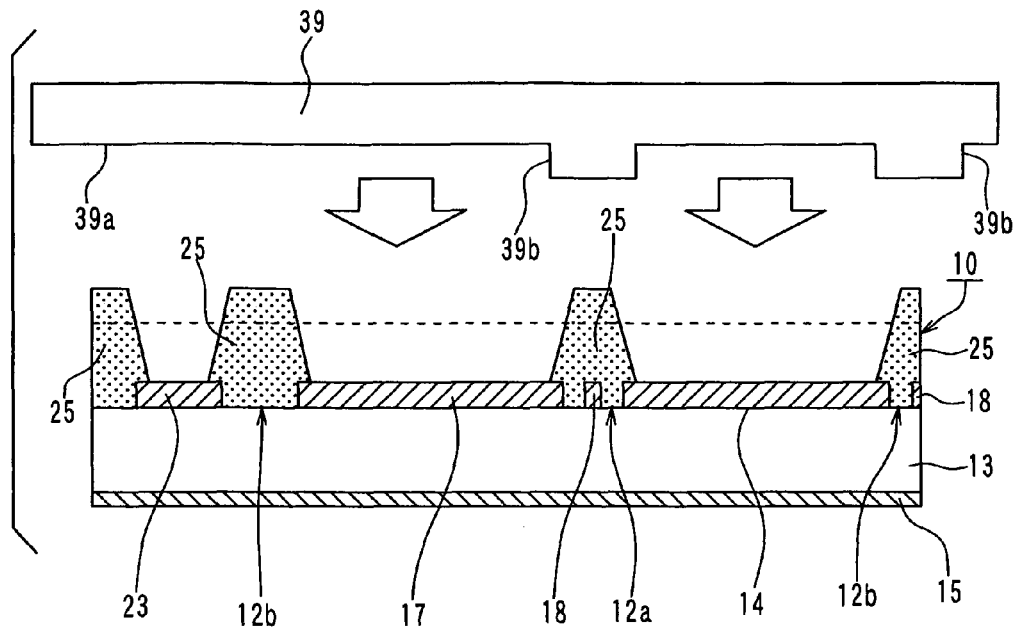
FIGS. 23A and 23B are diagrams showing parts of a manufacturing process of a semiconductor device according to another embodiment.
Figure 23B:
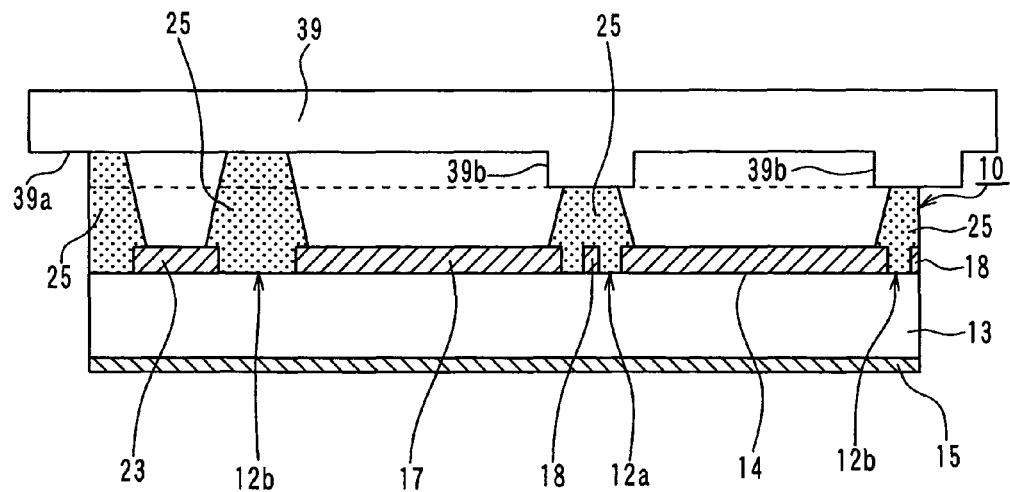
Figure 24:
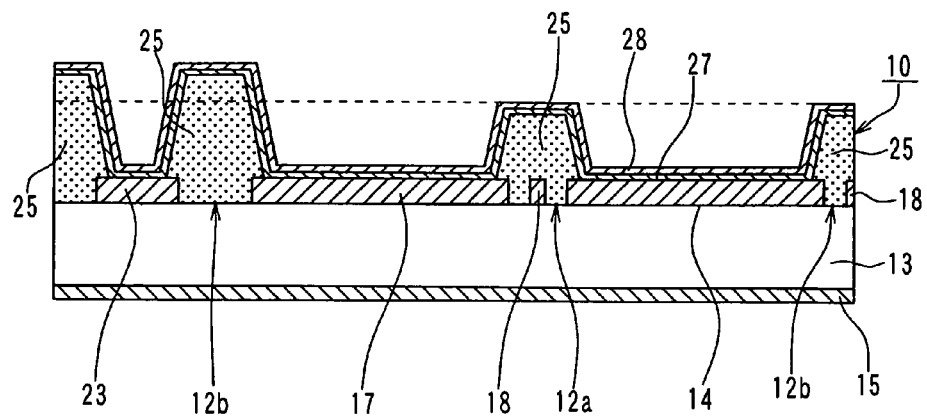
FIG. 24 is a diagram showing a part of the manufacturing process of the device according to the other embodiment.

In the twelfth embodiment, after the nickel film 27 and the gold film 28 are formed on the surface electrode 17 and the first protection film 25, the pressing process is performed with using the press element 39. Alternatively, before the nickel film 27 and the gold film 28 are formed on the surface electrode 17 and the first protection film 25, the pressing process may be performed with using the press element 39. Specifically, after the first protection film 25 is formed on the passage 12, as shown in FIG. 23A, the protrusion 39b of the press element 39 faces the first protection film 25 formed on the first passage 12a, on which the solder layer 29 is mounted. Then, as shown in FIG. 23B, the first protection film 25 is pressed and pushed by the protrusion 39b. Then, as shown in FIG. 24, the nickel film 27 and the gold film 28 are formed on the surface electrode 17 and the first protection film 25. As shown in FIG. 22B, the bit 36 or the like cuts a part of the nickel film 27 and a part of the gold film 28 and a part of the first protection film 25 on the second passage 12b. Thus, the pressing process is performed under a condition that the nickel film 27 and the gold film 28 are not formed on the first protection film 25. Thus, even if the stress is applied to the first protection film 25, the nickel film 27 and the gold film 25 by the press element 39, the crack 31 is not generated.

In the seventeenth embodiment, the non-conductive material 148 is mixed in the first protection film 25. Further, the non-conductive material 148 made of made of particles of organic material or fibers of in-organic material may be mixed in the second protection film 26. Thus, the non-conductive material 148 in the second protection film 26 stops the crack 31 generated in the second protection film 26.

The above disclosure has the following aspects.

According to a first aspect of the present disclosure, a semiconductor device includes: a semiconductor chip including a semiconductor element, wherein the semiconductor chip further includes a first region and a second region, and has a first surface and a second surface; a surface electrode disposed on the first surface of the semiconductor chip and electrically coupled with the first region of the semiconductor chip; a first, metal wiring disposed on the first surface of the semiconductor chip and electrically coupled with the second region of the semiconductor chip, wherein the first metal wiring controls a potential to be applied to the second region; a metal layer disposed on the surface electrode; a first protection film covering the first metal wiring; a metal plate covering at least a part of the surface electrode and a part of the first metal wiring and electrically coupling with the metal layer and the surface electrode via a solder layer, wherein the solder layer is disposed on the metal layer; and an insulation layer disposed on the at least the part of the first metal wiring, which is covered with the metal plate via the solder layer and the first protection film. The semiconductor chip, the surface electrode, the first metal wiring and the metal plate are packaged, and the insulation layer is disposed between the part of the first metal wiring and the first protection film.

In the above device, since the insulation layer is disposed on the first metal wiring, even if a crack is generated in the first protection film, and the solder layer penetrates into the crack, the solder is stopped at the insulation layer, so that the solder layer is restricted from reaching the first metal wiring. Accordingly, the first metal wiring and the surface electrode are not short-circuited.

According to a second aspect of the present disclosure, a semiconductor device includes: a semiconductor chip including a semiconductor element, wherein the semiconductor chip further includes a first region and a second region, and has a first surface and a second surface; a surface electrode disposed on the first surface of the semiconductor chip and electrically coupled with the first region of the semiconductor chip; a first metal wiring disposed on the first surface of the semiconductor chip and electrically coupled with the second region of the semiconductor chip, wherein the first metal wiring controls a potential to be applied to the second region; a metal layer disposed on the surface electrode; a first protection film covering the first metal wiring; a metal plate covering at least a part of the surface electrode and a part of the first metal wiring and electrically coupling with the metal layer and the surface electrode via a solder layer, wherein the solder layer is disposed on the metal layer; and a fluorine surface processed layer disposed on the first protection film, which is covered with the metal plate via the fluorine surface processed layer. The semiconductor chip, the surface electrode, the first metal wiring and the metal plate are packaged, and the fluorine surface processed layer is disposed between the metal plate and the first protection film.

In the above device, since the fluorine surface processed layer having very low, solder wettability is formed on the first protection film, the fluorine surface processed layer rejects the solder layer. Thus, even if a crack is generated in the first protection film, the crack is covered with the fluorine surface processed layer. Thus, the solder layer is restricted from reaching the first metal wiring. Accordingly, the first metal wiring and the surface electrode are not short-circuited.

According to a third aspect of the present disclosure, a semiconductor device includes: a semiconductor chip including a semiconductor element, wherein the semiconductor chip further includes a first region and a second region, and has a first surface and a second surface; a surface electrode disposed on the first surface of the semiconductor chip and electrically coupled with the first region of the semiconductor chip; a first metal wiring disposed on the first surface of the semiconductor chip and electrically coupled with the second region of the semiconductor chip, wherein the first metal wiring controls a potential to be applied to the second region; a metal layer disposed on the surface electrode; a first protection film covering the first metal wiring; a metal plate covering at least a part of the surface electrode and a part of the first metal wiring and electrically coupling with the metal layer and the surface electrode via a solder layer, wherein the solder layer is disposed on the metal layer; and a solder penetration prevention member disposed on the first protection film, which is covered with the metal plate. The semiconductor chip, the surface electrode, the first metal wiring and the metal plate are packaged, and the solder penetration prevention member is sandwiched between the metal plate and the first protection film.

In the above device, since the solder penetration prevention member is formed on the first protection film, the solder layer is mounted only on the metal layer. Thus, even if a crack is generated in the first protection film, the solder is restricted from reaching the first metal wiring via the crack. Accordingly, the first metal wiring and the surface electrode are not short-circuited.

According to a fourth aspect of the present disclosure, a semiconductor device includes: a semiconductor chip including a semiconductor element, wherein the semiconductor chip further includes a first region and a second region, and has a first surface and a second surface; a surface electrode disposed on the first surface of the semiconductor chip and electrically coupled with the first region of the semiconductor chip; a first metal wiring disposed on the first surface of the semiconductor chip and electrically coupled with the second region of the semiconductor chip, wherein the first metal wiring controls a potential to be applied to the second region; a metal layer disposed on the surface electrode; a first protection film covering the first metal wiring; and a metal plate covering at least a part of the surface electrode and a part of the first metal wiring and electrically coupling with the metal layer and the surface electrode via a solder layer, wherein the solder layer is disposed on the metal layer. The semiconductor chip, the surface electrode, the first metal wiring and the metal plate are packaged, and the first protection film contacts the metal plate.

In the above device, the metal plate directly contacts the first protection film. Thus, the solder layer is mounted on only the metal layer. Even if a crack is generated in the first protection film, the solder is restricted from reaching the first metal wiring via the crack. Accordingly, the first metal wiring and the surface electrode are not short-circuited.

According to a fifth embodiment of the present disclosure, a semiconductor device includes: a semiconductor chip including a semiconductor element, wherein the semiconductor chip further includes a first region and a second region, and has a first surface and a second surface; a surface electrode disposed on the first surface of the semiconductor chip and electrically coupled with the first region of the semiconductor chip; a first metal wiring disposed on the first surface of the semiconductor chip and electrically coupled with the second region of the semiconductor chip, wherein the first metal wiring controls a potential to be applied to the second region; a metal layer disposed on the surface electrode; a first protection film covering the first metal wiring; and a metal plate covering at least a part of the surface electrode and a part of the first metal wiring and electrically coupling with the metal layer and the surface electrode via a solder layer, wherein the solder layer is disposed on the metal layer. The semiconductor chip, the surface electrode, the first metal wiring and the metal plate are packaged. The metal plate includes a protrusion, which faces the first protection film, and protrudes toward the semiconductor chip, and the first protection film contacts the protrusion of the metal plate.

In the above device, since the protrusion of the metal plate directly contacts the first protection film, the solder layer is mounted on only the metal layer. Even if a crack is generated in the first protection film, the solder is restricted from reaching the first metal wiring via the crack. Accordingly, the first metal wiring and the surface electrode are not short-circuited.

According to a sixth aspect of the present disclosure, a semiconductor device includes: a semiconductor chip including a semiconductor element, wherein the semiconductor chip further includes a first region and a second region, and has a first surface and a second surface; a surface electrode disposed on the first surface of the semiconductor chip and electrically coupled with the first region of the semiconductor chip; a first metal wiring disposed on the first surface of the semiconductor chip and electrically coupled with the second region of the semiconductor chip, wherein the first metal wiring controls a potential to be applied to the second region; a first protection film covering the first metal wiring; a metal layer disposed on the surface electrode and a side of the second protection film; a metal plate covering at least a part of the surface electrode and a part of the first metal wiring and electrically coupling with the metal layer and the surface electrode via a solder layer, wherein the solder layer is disposed on the metal layer; and a second protection film disposed on the first protection film, which is covered with the solder layer via the second protection. The semiconductor chip, the surface electrode, the first metal wiring and the metal plate are packaged.

In the above device, the second protection film covers the first protection film, which is to be covered with the solder. The first protection film provides homogeneous solid body, and the second protection film provides another homogeneous solid body, and they are stacked. Thus, the homogeneous solid body is not continuous at a boundary between the first and the second protection films. Even if a crack is generated in the second protection film caused by stress from the solder layer, the crack is stopped at the boundary between the first and second protection films. Accordingly, the crack is restricted from reaching the first metal wiring, which is covered with the first protection film. Accordingly, the first metal wiring and the surface electrode are not short-circuited.

Alternatively, the semiconductor device may further include: a second metal wiring disposed on the first surface of the semiconductor chip and electrically separated from the first metal wiring. The semiconductor chip further includes a plurality of cells and a plurality of passages. Each cell includes the semiconductor element and the surface electrode. The plurality of passages surrounds each cell, and is disposed, on the first surface of the semiconductor chip. At least a part of the first metal wiring is disposed on one of the plurality of passages. At least a part of the second metal wiring is disposed on the one of the plurality of passages. The at least the part of the second metal wiring is in parallel to the at least the part of the first metal wiring. The first protection film is sandwiched between two adjacent cells, and the first protection film covers the second metal wiring. In this case, since the first metal wiring and the second metal wiring are arranged on the same passage, the first protection film is applied on the same passage at one time.

Alternatively, the semiconductor chip further includes a side and a corner. The side of the semiconductor chip is perpendicular to the first and second surfaces. The corner of the semiconductor chip is provided by the first surface and the side. The first protection film covers the corner of the semiconductor chip. In this case, the first metal wiring and the surface electrode are not short-circuited with using the first protection film. Further, current flowing along with the side of the chip and reaching the first surface is restricted by the first protection film at the corner.

According to a seventh aspect of the present disclosure, a manufacturing method of a semiconductor device includes: forming a plurality of semiconductor chips in a wafer, wherein each chip includes a semiconductor element having a first region and a second region; forming a surface electrode on a first surface of each semiconductor chip, wherein the surface electrode is electrically coupled with the first region of the semiconductor element; forming a first metal wiring on the first surface of each semiconductor chip, wherein the first metal wiring is electrically coupled with the second region of the semiconductor element; forming a first protection film on the first metal wiring to cover the first metal wiring; applying a second protection film on the first protection film with an injector; forming a metal layer on the surface electrode after the applying the second protection film; dividing the wafer into the plurality of semiconductor chips after the forming the metal layer; bonding a metal plate on the metal layer via a solder layer in such a manner that the metal plate covers at least a part of the surface electrode and a part of the first metal wiring, and the metal plate is electrically coupled with the metal layer and the surface electrode via the solder layer; and packaging the semiconductor chip, the surface electrode, the first metal wiring and the metal plate after the bonding the metal plate. The second protection film is disposed on the first protection film, which is covered with the metal plate via the solder layer and the second protection film.

In the above method, the second protection film is partially arranged on the first protection film, which is covered with the solder layer. Even if a crack such as scratch is generated in the second protection film before the solder layer is mounted, the crack is stopped at the boundary between the first and second protection films. Accordingly, the crack is restricted from reaching the first metal wiring, which is covered with the first protection film. Accordingly, the first metal wiring and the surface electrode are not short-circuited. Further, since the injector is used, the second protection film can be applied on a certain part of the first protection film, which is requested to apply the second protection film thereon. Thus, a photo lithography process and an etching process for patterning the second protection film are not necessary.

Alternatively, the manufacturing may further include: forming a clearance between adjacent semiconductor chips after the dividing the wafer; and applying the first protection film with the injector to cover a corner of the semiconductor chip. The corner of the semiconductor chip is provided by the first surface and a side of the semiconductor chip, and the side of the semiconductor chip is perpendicular to the first surface. In this case, the first metal wiring and the surface electrode are not short-circuited with using the first protection film. Further, current flowing along with the side of the chip and reaching the first surface is restricted by the first protection film at the corner.

Alternatively, in the forming the metal layer, the metal layer is formed on the second protection film. The method further includes: cutting a part of the second protection film and a part of the metal layer with a bit or a multiple blade tool so as to expose the second protection film from the metal layer after the forming the metal layer. In this case, even if a crack is generated in the second protection film when the part of the second protection film is cut by the bit or the multiple blade tool, the crack is stopped at the boundary between the first and second protection films. Accordingly, the crack is restricted from reaching the first metal wiring. The solder layer does not penetrate into the crack and reach the first metal wiring. The first metal wiring and the surface electrode are not short-circuited.

According to an eighth aspect of the present disclosure, a manufacturing method of a semiconductor device includes: forming a plurality of semiconductor chips in a wafer, wherein each chip includes a semiconductor element having a first region and a second region; forming a surface electrode on a first surface of each semiconductor chip, wherein the surface electrode is electrically coupled with the first region of the semiconductor element; forming a first metal wiring on the first surface of each semiconductor chip, wherein the first metal wiring is electrically coupled with the second region of the semiconductor element; forming a first protection film on the first metal wiring to cover the first metal wiring; forming a metal layer on the surface electrode and the first protection film after the forming the first protection film; cutting a part of the first protection film and a part of the metal layer with a bit or a multiple blade tool so as to expose the first protection film from the metal layer after the forming the metal layer; applying a second protection film on the first protection film with an injector after the cutting; dividing the wafer into the plurality of semiconductor chips after the applying the second protection film; bonding a metal plate on the metal layer via a solder layer in such a manner that the metal plate covers at least a part of the surface electrode and a part of the first metal wiring, and the metal plate is electrically coupled with the metal layer and the surface electrode via the solder layer; and packaging the semiconductor chip, the surface electrode, the first metal wiring and the metal plate after the bonding the metal plate.

Even if a crack is generated in the first protection film when the part of the first protection film is cut by the bit or the multiple blade tool, the crack is covered with the second protection film since the second protection film is formed after the cutting the part of the first protection film. Accordingly, the solder is restricted from reaching the first metal wiring via the crack in the first protection film. Accordingly, the first metal wiring and the surface electrode are not short-circuited.

According to a ninth aspect of the present disclosure, a manufacturing method of a semiconductor device includes: forming a plurality of semiconductor chips in a wafer, wherein each chip includes a semiconductor element having a first region and a second region; forming a surface electrode on a first surface of each semiconductor chip, wherein the surface electrode is electrically coupled with the first region of the semiconductor element; forming a first metal wiring On the first surface of each semiconductor chip, wherein the first metal wiring is electrically coupled with the second region of the semiconductor element; forming a first protection film on the first metal wiring to cover the first metal wiring; forming a metal layer on the surface electrode and the first protection film after the forming the first protection film; cutting a part of the first protection film and a part of the metal layer with a bit or a multiple blade tool so as to expose the first protection film from the metal layer after the forming the metal layer; dividing the wafer into the plurality of semiconductor chips after the cutting; bonding a metal plate on the metal layer via a solder layer in such a manner that the metal plate covers at least a part of the surface electrode and a part of the first metal wiring, and the metal plate is electrically coupled with the metal layer and the surface electrode via the solder layer; packaging the semiconductor chip, the surface electrode, the first metal wiring and the metal plate after the bonding the metal plate; and after the forming the first metal wiring, forming an insulation layer on the at least the part of the first metal wiring, which is covered with the metal plate via the solder layer and the first protection film. The insulation layer is disposed between the part of the first metal wiring and the first protection film.

In the above method, even if a crack is generated in the first protection film when the part of the first protection film is cut by the bit or the multiple blade tool, the crack is stopped at the insulation layer, which is formed on the first metal wiring. Accordingly, the crack is restricted from reaching the first metal wiring via the crack. Accordingly, the first metal wiring and the surface electrode are not short-circuited.

According to a tenth aspect of the present disclosure, a manufacturing method of a semiconductor device includes: forming a plurality of semiconductor chips in a wafer, wherein each chip includes a semiconductor element having a first region and a second region; forming a surface electrode on a first surface of each semiconductor chip, wherein the surface electrode is electrically coupled with the first region of the semiconductor element; forming a first metal wiring on the first surface of each semiconductor chip, wherein the first metal wiring is electrically coupled with the second region of the semiconductor element; forming a first protection film on the first metal wiring to cover the first metal wiring; forming a metal layer on the surface electrode and the first protection film after the forming the first protection film; cutting a part of the first protection film and a part of the metal layer with a bit or a multiple blade tool so as to expose the first protection film from the metal layer after the forming the metal layer; dividing the wafer into the plurality of semiconductor chips after the cutting; bonding a metal plate on the metal layer via a solder layer in such a manner that the metal plate covers at least a part of the surface electrode and a part of the first metal wiring, and the metal plate is electrically coupled with the metal layer and the surface electrode via the solder layer; packaging the semiconductor chip, the surface electrode, the first metal wiring and the metal plate after the bonding the metal plate; and after the cutting, forming a fluorine surface processed layer on the first protection film, which is covered with the metal plate via the fluorine surface processed layer. The fluorine surface processed layer is disposed between the metal plate and the first protection film.

In the above method, after the part of the first protection film is cut, the fluorine surface processed layer having very low solder wettability is formed on the first protection film.

Even if a crack is generated in the first protection film, the fluorine surface processed layer prevents the solder layer from reaching the first metal wiring via the crack. Accordingly, the first metal wiring and the surface electrode are not short-circuited.

According to an eleventh aspect of the present disclosure, a manufacturing method of a semiconductor device includes: forming a plurality of semiconductor chips in a wafer, wherein each chip includes a semiconductor element having a first region and a second region; forming a surface electrode on a first surface of each semiconductor chip, wherein the surface electrode is electrically coupled with the first region of the semiconductor element; forming a first metal wiring on the first surface of each semiconductor chip, wherein the first metal wiring is electrically coupled with the second region of the semiconductor element; forming a first protection film on the first metal wiring to cover the first metal wiring; forming a metal layer on the surface electrode and the first protection film after the forming the first protection film; cutting a part of the first protection film and a part of the metal layer with a bit or a multiple blade tool so as to expose the first protection film from the metal layer after the forming the metal layer; dividing the wafer into the plurality of semiconductor chips after the cutting; bonding a metal plate on the metal layer via a solder layer in such a manner that the metal plate covers at least a part of the surface electrode and a part of the first metal wiring, and the metal plate is electrically coupled with the metal layer and the surface electrode via the solder layer; packaging the semiconductor chip, the surface electrode, the first metal wiring and the metal plate after the bonding the metal plate; and after the cutting, forming a solder penetration prevention member on the first protection film, which is covered with the metal plate. In the packaging, the solder penetration prevention member is sandwiched between the metal plate and the first protection film.

In the above method, since the solder penetration prevention member is formed on the first protection film, the solder is mounted on only the metal layer. Thus, even if a crack is generated in the first protection film, the solder layer is restricted from penetrating into the crack. Thus, the first metal wiring and the surface electrode are not short-circuited.

According to a twelfth aspect of the present disclosure, a manufacturing method of a semiconductor device includes: forming a plurality of semiconductor chips in a wafer, wherein each chip includes a semiconductor element having a first region and a second region; forming a surface electrode on a first surface of each semiconductor chip, wherein the surface electrode is electrically coupled with the first region of the semiconductor element; forming a first metal wiring on the first surface of each semiconductor chip, wherein the first metal wiring is electrically coupled with the second region of the semiconductor element; forming a first protection film on the first metal wiring to cover the first metal wiring; forming a metal layer on the surface electrode and the first protection film after the forming the first protection film; cutting a part of the first protection film and a part of the metal layer with a bit or a multiple blade tool so as to expose the first protection film from the metal layer after the forming the metal layer; dividing the wafer into the plurality of semiconductor chips after the cutting; bonding a metal plate on the metal layer via a solder layer in such a manner that the metal plate covers at least a part of the surface electrode and a part of the first metal wiring, and the metal plate is electrically coupled with the metal layer and the surface electrode via the solder layer; and packaging the semiconductor chip, the surface electrode, the first metal wiring and the metal plate after the bonding the metal plate. In the packaging, the first protection film contacts the metal plate.

In the above method, the first protection film directly contacts the metal plate. Thus, the solder layer is formed on only the metal layer. Even if a crack is generated in the first protection film, the solder layer is restricted from penetrating into the crack. Thus, the first metal wiring and the surface electrode are not short-circuited.

According to a thirteenth aspect of the present disclosure, a manufacturing method of a semiconductor device includes: forming a plurality of semiconductor chips in a wafer, wherein each chip includes a semiconductor element having a first region and a second region; forming a surface electrode on a first surface of each semiconductor chip, wherein the surface electrode is electrically coupled with the first region of the semiconductor element; forming a first metal wiring on the first surface of each semiconductor chip, wherein the first metal wiring is electrically coupled with the second region of the semiconductor element; forming a first protection film on the first metal wiring to cover the first metal wiring; forming a metal layer on the surface electrode and the first protection film after the forming the first protection film; cutting a part of the first protection film and a part of the metal layer with a bit or a multiple blade tool so as to expose the first protection film from the metal layer after the forming the metal layer; dividing the wafer into the plurality of semiconductor chips after the cutting; bonding a metal plate on the metal layer via a solder layer in such a manner that the metal plate covers at least a part of the surface electrode and a part of the first metal wiring, and the metal plate is electrically coupled with the metal layer and the surface electrode via the solder layer; and packaging the semiconductor chip, the surface electrode, the first metal wiring and the metal plate after the bonding the metal plate. The metal plate includes a protrusion, which faces the first protection film, and protrudes toward the semiconductor chip, and, in the bonding the metal plate, the first protection film contacts the protrusion of the metal plate.

In the above method, the protrusion of the metal plate directly contacts the first protection film. Thus, the solder layer is not mounted on the first protection film. Even if a crack is generated in the first protection film, the solder layer is restricted from reaching the first metal wiring via the crack. Thus, the first metal wiring and the surface electrode are not short-circuited.

Alternatively, the manufacturing method may further include: forming a clearance between adjacent semiconductor chips after the dividing the wafer; and applying the first protection film with the injector to cover a corner of the semiconductor chip. The corner of the semiconductor chip is provided by the first surface and a side of the semiconductor chip, and the side of the semiconductor chip is perpendicular to the first surface. Further, the manufacturing method may further include: forming a second metal wiring on the first surface of each semiconductor chip, wherein the second metal wiring is electrically separated from the first metal wiring; and forming the first protection film on the second metal wiring to cover the second metal wiring. Each semiconductor chip further includes a plurality of cells and a plurality of passages. Each cell includes the semiconductor element and the surface electrode. The plurality of passages surrounds each cell, and is disposed on the first surface of the semiconductor chip. At least a part of the first metal wiring is formed on one of the plurality of passages. At least a part of the second metal wiring is formed on the one of the plurality of passages, and the at least the part of the second metal wiring is in parallel to the at least the part of the first metal wiring. In this case, the first and second metal wirings are arranged on the same passage. The first protection film is applied on the passage at one time.

According to fourteenth aspect of the present disclosure, a manufacturing method of a semiconductor device includes: forming a plurality of semiconductor chips in a wafer, wherein each chip includes a plurality of cells and a plurality of passages, the plurality of passages surrounds each cell, the plurality of passages is disposed on a first surface of the chip, and each cell includes a semiconductor element having a first region and a second region; forming a surface electrode on the first surface of each semiconductor chip, wherein the surface electrode is electrically coupled with the first region of the semiconductor element; forming a first metal wiring on one of the plurality of passages, wherein the first metal wiring is electrically coupled with the second region of the semiconductor element; applying a first protection film on the plurality of passages with an injector in such a manner that a height of the first protection film disposed on a first passage is lower than a height of the first protection film disposed on a second passage, wherein the plurality of passages includes the first passage and the second passage, a solder layer is to be mounted on the first passage, no solder layer is to be mounted on the second passage, and the first protection film covers the first metal wiring; forming a metal layer on the surface electrode and the first protection film; cutting a part of the first protection film disposed on the second passage and a part of the metal layer with a bit or a multiple blade tool so as to expose the first protection film on the second passage from the metal layer; dividing the wafer into the plurality of semiconductor chips after the cutting; bonding a metal plate on the metal layer via the solder layer in such a manner that the metal plate covers at least a part of the surface electrode and a part of the first metal wiring, and the metal plate is electrically coupled with the metal layer and the surface electrode via the solder layer; and packaging the semiconductor chip, the surface electrode, the first metal wiring and the metal plate after the bonding the metal plate.

In the above method, since the height of the first protection film on the first passage, on which the solder layer is mounted, is lower than the height of the first protection film on the second passage, on which the solder layer is mounted, the first protection film on the first passage is not cut by the bit or the multiple blade tool. Accordingly, since the stress from the bit or the tool is not applied to the first protection film on the first passage when the step of cutting, a crack is not generated in the first protection film on the first passage. Thus, the solder layer does not penetrate into the crack, and therefore, the first metal wiring and the surface electrode are not short-circuited.

Alternatively, the manufacturing method may further include: forming a clearance between adjacent semiconductor chips after the dividing the wafer; and applying the first protection film with the injector to cover a corner of the semiconductor chip. The corner of the semiconductor chip is provided by the first surface and a side of the semiconductor chip, and the side of the semiconductor chip is perpendicular to the first surface.

According to a fifteenth aspect of the present disclosure, a manufacturing method of a semiconductor device includes: forming a plurality of semiconductor chips in a wafer; wherein each chip includes a plurality of cells and a plurality of passages, the plurality of passages surrounds each cell, the plurality of passages is disposed on a first surface of the chip, and each cell includes a semiconductor element having a first region and a second region; forming a surface electrode on the first surface of each semiconductor chip, wherein the surface electrode is electrically coupled with the first region of the semiconductor element; forming a first metal wiring on one of the plurality of passages, wherein the first metal wiring is electrically coupled with the second region of the semiconductor element; applying a first protection film on the plurality of passages wherein the first protection film covers the first metal wiring; forming a metal layer on the surface electrode and the first protection film; preparing a press element having a press surface and a press protrusion, wherein the press protrusion protrudes from the press surface, and corresponds to the first protection film disposed on a first passage, wherein the plurality of passages includes the first passage and a second passage, a solder layer is to be mounted on the first passage, and no solder layer is to be mounted on the second passage; pressing the first protection film on the first passage with the press protrusion under a condition that the press surface of the press element faces the first surface of the chip so that a height of the first protection film disposed on the first passage with respect to the first surface of the chip is lower than a height of the first protection film disposed on the second passage with respect to the first surface of the chip; cutting a part of the first protection film disposed on the second passage and a part of the metal layer with a bit or a multiple blade tool so as to expose the first protection film on the second passage from the metal layer; dividing the wafer into the plurality of semiconductor chips after the cutting; bonding a metal plate on the metal layer via the solder layer in such a manner that the metal plate covers at least a part of the surface electrode and a part of the first metal wiring, and the metal plate is electrically coupled with the metal layer and the surface electrode via the solder layer; and packaging the semiconductor chip, the surface electrode, the first metal wiring and the metal plate after the bonding the metal plate.

In the above method, the first protection film on the second passage is selectively cut. Thus, a crack is not generated in the first protection film on the first passage. Accordingly, the first metal wiring and the surface electrode are not short-circuited.

According to sixteenth aspect of the present disclosure, a manufacturing method of a semiconductor device includes: forming a plurality of semiconductor chips in a wafer, wherein each chip includes a plurality of cells and a plurality of passages, the plurality of passages surrounds each cell, the plurality of passages is disposed on a first surface of the chip, and each cell includes a semiconductor element having a first region and a second region; forming a surface electrode on the first surface of each semiconductor chip, wherein the surface electrode is electrically coupled with the first region of the semiconductor element; forming a first metal wiring on one of the plurality of passages, wherein the first metal wiring is electrically coupled with the second region of the semiconductor element; applying a first protection film on the plurality of passages, wherein the first protection film covers the first metal wiring; forming a metal layer on the surface electrode and the first protection film; dividing the wafer into the plurality of semiconductor chips after the forming the metal layer; after the dividing the wafer, preparing a press element having a press surface and a press protrusion, wherein the press protrusion protrudes from the press surface, and corresponds to the first protection film disposed on a first passage, wherein the plurality of passages includes the first passage and a second passage, a solder layer is to be mounted on the first passage, and no solder layer is to be mounted on the second passage; pressing the first protection film on the first passage with the press protrusion under a condition that the press surface of the press element faces the first surface of the chip so that a height of the first protection film disposed on the first passage with respect to the first surface of the chip is lower than a height of the first protection film disposed on the second passage with respect to the first surface of the chip; after the pressing the first protection film, cutting a part of the first protection film disposed on the second passage and a part of the metal layer with a bit or a multiple blade tool so as to expose the first protection film on the second passage from the metal layer; after the cutting, bonding a metal plate on the metal layer via the solder layer in such a manner that the metal plate covers at least a part of the surface electrode and a part of the first metal wiring, and the metal plate is electrically coupled with the metal layer and the surface electrode via the solder layer; and after the bonding, packaging the semiconductor chip, the surface electrode, the first metal wiring and the metal plate after the bonding the metal plate.

In the above method, the first protection film on the second passage is selectively cut. Thus, a crack is not generated in the first protection film on the first passage. Accordingly, the first metal wiring and the surface electrode are not short-circuited.

According to a seventeenth aspect of the present disclosure, a manufacturing method of a semiconductor device includes: forming a plurality of semiconductor chips in a wafer, wherein each chip includes a plurality of cells and a plurality of passages, the plurality of passages surrounds each cell, the plurality of passages is disposed on a first surface of the chip, and each cell includes a semiconductor element having a first region and a second region; forming a surface electrode on the first surface of each semiconductor chip, wherein the surface electrode is electrically coupled with the first region of the semiconductor element; forming a first metal wiring on one of the plurality of passages, wherein the first metal wiring is electrically coupled with the second region of the semiconductor element; applying a first protection film on the plurality of passages, wherein the first protection film covers the first metal wiring; after the forming the first protection film, preparing a press element having a press surface and a press protrusion, wherein the press protrusion protrudes from the press surface, and corresponds to the first protection film disposed on a first passage, wherein the plurality of passages includes the first passage and a second passage, a solder layer is to be mounted on the first passage, and no solder layer is to be mounted on the second passage; pressing the first protection film on the first passage with the press protrusion under a condition that the press surface of the press element faces the first surface of the chip so that a height of the first protection film disposed on the first passage with respect to the first surface of the chip is lower than a height of the first protection film disposed on the second passage with respect to the first surface of the chip; after the pressing, forming a metal layer on the surface electrode and the first protection film; after the forming the metal layer, cutting a part of the first protection film disposed on the second passage and a part of the metal layer with a bit or a multiple blade tool so as to expose the first protection film on the second passage from the metal layer; after the cutting, dividing the wafer into the plurality of semiconductor chips after the forming the metal layer; after the dividing, bonding a metal plate on the metal layer via the solder layer in such a manner that the metal plate covers at least a part of the surface electrode and a part of the first metal wiring, and the metal plate is electrically coupled with the metal layer and the surface electrode via the solder layer; and after the bonding, packaging the semiconductor chip, the surface electrode, the first metal wiring and the metal plate after the bonding the metal plate.

In the above method, the height of the first protection film on the first passage is lowered by the press element. Then, the metal layer is formed on the first protection film. The first protection film on the second passage is selectively cut. Accordingly, a crack is not generated in the first protection film on the first passage. Accordingly, the first metal wiring and the surface electrode are not short-circuited. Further, a part of the first protection film is pressed by the press element before the metal layer is formed in the first protection film, a crack is restricted from being generated in the metal layer and the first protection film.

According to an eighteenth aspect of the present disclosure, a manufacturing method of a semiconductor device includes: forming a plurality of semiconductor chips in a wafer, wherein each chip includes a plurality of cells and a plurality of passages, the plurality of passages surrounds each cell, the plurality of passages is disposed on a first surface of the chip, and each cell includes a semiconductor element having a first region and a second region; forming a surface electrode on the first surface of each semiconductor chip, wherein the surface electrode is electrically coupled with the first region of the semiconductor element; forming a first metal wiring on one of the plurality of passages, wherein the first metal wiring is electrically coupled with the second region of the semiconductor element; applying a first protection film on the plurality of passages, wherein the first protection film covers the first metal wiring; after the applying the first protection film, dividing the wafer into the plurality of semiconductor chips after the forming the metal layer; after the dividing, preparing a press element having a press surface and a press protrusion, wherein the press protrusion protrudes from the press surface, and corresponds to the first protection film disposed on a first passage, wherein the plurality of passages includes the first passage and a second passage, a solder layer is to be mounted on the first passage, and no solder layer is to be mounted on the second passage; pressing the first protection film on the first passage with the press protrusion under a condition that the press surface of the press element faces the first surface of the chip so that a height of the first protection film disposed on the first passage with respect to the first surface of the chip is lower than a height of the first protection film disposed on the second passage with respect to the first surface of the chip; after the pressing, forming a metal layer on the surface electrode and the first protection film; after the forming the metal layer, cutting a part of the first protection film disposed on the second passage and a part of the metal layer with a bit or a multiple blade tool so as to expose the first protection film on the second passage from the metal layer; after the cutting, bonding a metal plate on the metal layer via the solder layer in such a manner that the metal plate covers at least a part of the surface electrode and a part of the first metal wiring, and the metal plate is electrically coupled with the metal layer and the surface electrode via the solder layer; and after the bonding, packaging the semiconductor chip, the surface electrode, the first metal wiring and the metal plate after the bonding the metal plate.

In the above method, the height of the first protection film on the first passage is lowered by the press element. Then, the metal layer is formed on the first protection film. The first protection film on the second passage is selectively cut. Accordingly, a crack is not generated in the first protection film on the first passage. Accordingly, the first metal wiring and the surface electrode are not short-circuited. Further, a part of the first protection film is pressed by the press element before the metal layer is formed in the first protection film, a crack is restricted from being generated in the metal layer and the first protection film.

Alternatively, the manufacturing method may further include: forming a clearance between adjacent semiconductor chips after the dividing the wafer; and applying the first protection film with the injector to cover a corner of the semiconductor chip. The corner of the semiconductor chip is provided by the first surface and a side of the semiconductor chip, and the side of the semiconductor chip is perpendicular to the first surface. Further, the manufacturing method may further include: forming a second metal wiring on the first surface of each semiconductor chip, wherein the second metal wiring is electrically separated from the first metal wiring; and forming the first protection film on the second metal wiring to cover the second metal wiring. At least a part of the first metal wiring is formed on the one of the plurality of passages. At least a part of the second metal wiring is formed on the one of the plurality of passages, and the at least the part of the second metal wiring is in parallel to the at least the part of the first metal wiring.

According to an nineteenth aspect of the present disclosure, a semiconductor device includes: a semiconductor chip including a semiconductor element, wherein the semiconductor chip further includes a first region and a second region, and has a first surface and a second surface; a surface electrode disposed on the first surface of the semiconductor chip and electrically coupled with the first region of the semiconductor chip; a first metal wiring disposed on the first surface of the semiconductor chip and electrically coupled with the second region of the semiconductor chip, wherein the first metal wiring controls a potential to be applied to the second region; a metal layer disposed on the surface electrode; a first protection film covering the first metal wiring; a second protection film disposed on the first protection film, which is covered with a solder layer via the second protection; and a metal plate covering at least a part of the surface electrode and a part of the first metal wiring and electrically coupling with the metal layer and the surface electrode via the solder layer, wherein the solder layer is disposed on the metal layer. The semiconductor chip, the surface electrode, the first metal wiring and the metal plate are packaged.

In the above device, the second protection film covers the first protection film, which is to be covered with the solder. The first protection film provides homogeneous solid body, and the second protection film provides another homogeneous solid body, and they are stacked. Thus, the homogeneous solid body is not continuous at a boundary between the first and the second protection films. Even if a crack is generated in the second protection film caused by stress from the solder layer, the crack is stopped at the boundary between the first and second protection films. Accordingly, the crack is restricted from reaching the first metal wiring, which is covered with the first protection film. Accordingly, the first metal wiring and the surface electrode are not short-circuited.

Alternatively, the semiconductor device may further include: a second metal wiring disposed on the first surface of the semiconductor chip and electrically separated from the first metal wiring. The semiconductor chip further includes a plurality of cells and a plurality of passages. Each cell includes the semiconductor element and the surface electrode. The plurality of passages surrounds each cell, and is disposed on the first surface of the semiconductor chip. At least a part of the first metal wiring is disposed on one of the plurality of passages. At least a part of the second metal wiring is disposed on the one of the plurality of passages. The at least the part of the second metal wiring is in parallel to the at least the part of the first metal wiring. The first protection film is sandwiched between two adjacent cells, and the first protection film covers the second metal wiring. In this case, since the first metal wiring and the second metal wiring are arranged on the same passage, the first protection film is applied on the same passage at one time.

Alternatively, the semiconductor chip may further include a side and a corner. The side of the semiconductor chip is perpendicular to the first and second surfaces. The corner of the semiconductor chip is provided by the first surface and the side, and the first protection film covers the corner of the semiconductor chip. In this case, the first metal wiring and the surface electrode are not short-circuited with using the first protection film. Further, current flowing along with the side of the chip and reaching the first surface is restricted by the first protection film at the corner.

Alternatively, the semiconductor device may further include: non-conductive material mixed in the second protection film. The non-conductive material is made of an organic particle or an inorganic fiber. In this case, the non-conductive material stops the crack from growing.

According to a twentieth aspect of the present disclosure, a semiconductor device includes: a semiconductor chip having a semiconductor element, wherein the semiconductor chip includes a first surface and a second surface, the semiconductor element has a trench gate structure, which includes an emitter region on the first surface, a trench penetrating the emitter region, a gate insulation film disposed on an inner wall of the trench, and a gate region disposed on the gate insulation film in the trench; a surface electrode disposed on the first surface and electrically coupled with the emitter region; a first metal wiring disposed on the first surface and electrically coupled with the gate region, wherein the first metal wiring controls a potential to be applied to the gate region; a metal layer disposed on the surface electrode; a first protection film covering the first metal wiring; and a metal plate covering the surface electrode and electrically coupling with the metal layer and the surface electrode via a solder layer, wherein the solder layer is disposed on the metal layer. The semiconductor chip, the surface electrode, the first metal wiring and the metal plate are packaged. The first surface of the semiconductor chip includes a solder mounting region and a no solder region. The solder layer is disposed over the solder mounting region, and the solder layer is not disposed over the no solder region. The gate region is disposed in both of the solder mounting region and the no solder region. The first metal wiring is disposed on the no solder region of the first surface, and the first metal wiring is electrically coupled with the gate region only in the no solder region.

In the above device, the first metal wiring is formed in the no solder region on the first surface of the chip. The first protection film covering the first metal wiring is also formed in the no solder region. Thus, the first protection film covering the first metal wiring is not covered with the solder layer. Thus, the crack is not generated in the first protection film covering the first metal wiring. The first metal wiring and the surface electrode are not short-circuited.

Alternatively, the surface electrode may be disposed on a whole of the solder mounting region of the first surface. In this case, the bonding area between the surface electrode and the solder layer is maximized. Thus, the bonding strength between the surface electrode and the solder layer is improved.

Alternatively, the semiconductor chip may include a plurality of cells, each of which includes the semiconductor element, and a plurality of passages, which is disposed around the cells and on the first surface of the chip. The first protection film is disposed on a whole of the plurality of passages. In this case, even if the crack is generated in the first protection film on the passage in the solder mounting region, the solder layer does not contact the first metal wiring since the first metal wiring is formed in the no solder region. Accordingly, the first metal wiring and the surface electrode are not short-circuited.

Alternatively, the semiconductor device may further include: non-conductive material mixed in the first protection film. The non-conductive material is made of an organic particle or an inorganic fiber. In this case, even if the crack is generated in the first protection film, the non-conductive material prevents the crack from growing.

According to a twenty-first aspect of the present disclosure, a manufacturing method of a semiconductor device includes: forming a plurality of semiconductor chips in a wafer, wherein each chip includes a semiconductor element having a first region and a second region; forming a surface electrode on a first surface of each semiconductor chip, wherein the surface electrode is electrically coupled with the first region of the semiconductor element; forming a first metal wiring on the first surface of each semiconductor chip, wherein the first metal wiring is electrically coupled with the second region of the semiconductor element; forming a first protection film on the first metal wiring to cover the first metal wiring; mixing non-conductive material in a second protection film, wherein the non-conductive material is made of an organic particle or an inorganic fiber; applying the second protection film on the first protection film with an injector; forming a metal layer on the surface electrode; dividing the wafer into the plurality of semiconductor chips after the forming the metal layer; bonding a metal plate on the metal layer via a solder layer in such a manner that the metal plate covers at least a part of the surface electrode and a part of the first metal wiring, and the metal plate is electrically coupled with the metal layer and the surface electrode via the solder layer; and packaging the semiconductor chip, the surface electrode, the first metal wiring and the metal plate after the bonding the metal plate. The second protection film is disposed on the first protection film, which is covered with the metal plate via the solder layer and the second protection film. In this case, even if the crack is generated in the first protection film, the non-conductive material prevents the crack from growing.

According to a twenty-second aspect of the present disclosure, a manufacturing method of a semiconductor device includes: forming a plurality of semiconductor chips in a wafer, wherein each chip includes a semiconductor element having a first surface and a second surface, the semiconductor element has a trench gate structure, which includes an emitter region on the first surface, a trench penetrating the emitter region, a gate insulation film disposed on an inner wall of the trench, and a gate region disposed on the gate insulation film in the trench; forming a surface electrode on the first surface, wherein the surface electrode is electrically coupled with the emitter region; forming a first metal wiring on the first surface, wherein the first metal wiring is electrically coupled with the gate region; forming a first protection film, which covers the first metal wiring; forming a metal layer on the surface electrode and the first protection film; cutting a part of the first protection film and a part of the metal layer with a bit or a multiple blade tool so as to expose the first protection film from the metal layer; dividing the wafer into the plurality of semiconductor chips after the cutting; bonding a metal plate on the metal layer via a solder layer in such a manner that the metal plate covers the surface electrode, and the metal plate is electrically coupled with the metal layer and the surface electrode via the solder layer; and packaging the semiconductor chip, the surface electrode, the first metal wiring and the metal plate after the bonding the metal plate. The first surface of the semiconductor chip includes a solder mounting region and a no solder region. The solder layer is disposed over the solder mounting region, and the solder layer is not disposed over the no solder region. In the forming the plurality of semiconductor chips, the gate region is formed in both of the solder mounting region and the no solder region. In the forming the first metal wiring, the first metal wiring is formed on the no solder region of the first surface. The first metal wiring is electrically coupled with the gate region only in the no solder region.

In the above method, the first metal wiring is formed in the no solder region of the first surface of the chip. Thus, even if the crack is generated in the first protection film when the stress of the solder layer is applied to the first protection film, the solder layer does not penetrate into the crack. Accordingly, the first metal wiring and the surface electrode are not short-circuited.

Alternatively, in the forming the surface electrode, the surface electrode may be formed on a whole of the solder mounting region of the first surface. In this case, the bonding area between the surface electrode and the solder layer is maximized in the solder mounting region. Accordingly, the bonding strength between the surface electrode and the solder layer is improved.

Alternatively, the semiconductor chip may include a plurality of cells, each of which includes the semiconductor element, and a plurality of passages, which is disposed around the cells and on the first surface of the chip, and in the forming the first protection film, the first protection film is formed on a whole of the plurality of passages. In this case, the first metal wiring is not formed on the passage in the solder mounting region. Thus, even if the crack is generated in the first protection film on the passage in the solder mounting region, the solder layer does not contact the first metal wiring. Accordingly, the first metal wiring and the surface electrode are not short-circuited.

Alternatively, in the forming the first protection film, the first protection film may be formed in such a manner that a height of the first protection film on one of the passages in the solder mounting region with respect to the first surface of the chip is lower than a height of the first protection film on another one of the passages in the no solder region, and, in the cutting, the first protection film in the no solder region is exposed film from the metal layer. In this case, the first protection film formed in the solder mounting region is not cut. Further, since the first metal wiring is not formed in the solder mounting region, the first metal wiring and the surface electrode are not short-circuited in the solder mounting region.

Alternatively, in the cutting, the first protection film in the no solder region and the first protection film in the solder mounting region are exposed from the metal layer. In this case, since the first metal wiring is not formed in the solder mounting region, even if the crack is generated in the first protection film in the solder mounting region when the stress of the solder layer is applied to the first protection film, the first metal wiring and the surface electrode are not short-circuited via the solder layer penetrated into the crack.

Alternatively, the manufacturing method may further include: mixing non-conductive material in a first protection film before the forming the first protection film. The non-conductive material is made of an organic particle or an inorganic fiber. In this case, the non-conductive material prevents the crack from growing, i.e., proceeding.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
a semiconductor chip including a semiconductor element, wherein the semiconductor chip further includes a first region and a second region, and has a first surface and a second surface;
a surface electrode disposed on the first surface of the semiconductor chip and electrically coupled with the first region of the semiconductor chip;
a first metal wiring disposed on the first surface of the semiconductor chip and electrically coupled with the second region of the semiconductor chip, wherein the first metal wiring controls a potential to be applied to the second region;
a metal layer disposed on the surface electrode;
a first protection film covering the first metal wiring;
a metal plate covering at least a part of the surface electrode and a part of the first metal wiring and electrically coupling with the metal layer and the surface electrode via a solder layer, wherein the solder layer is disposed on the metal layer; and
a solder penetration prevention member disposed on the first protection film, which is covered with the metal plate,
wherein the semiconductor chip, the surface electrode, the first metal wiring and the metal plate are packaged, and
wherein the solder penetration prevention member is sandwiched between the metal plate and the first protection film.

2. A semiconductor device comprising:
a semiconductor chip including a semiconductor element, wherein the semiconductor chip further includes a first region and a second region, and has a first surface and a second surface;
a surface electrode disposed on the first surface of the semiconductor chip and electrically coupled with the first region of the semiconductor chip;
a first metal wiring disposed on the first surface of the semiconductor chip and electrically coupled with the second region of the semiconductor chip, wherein the first metal wiring controls a potential to be applied to the second region;
a metal layer disposed on the surface electrode;
a first protection film covering the first metal wiring; and
a metal plate covering at least a part of the surface electrode and a part of the first metal wiring and electrically coupling with the metal layer and the surface electrode via a solder layer, wherein the solder layer is disposed on the metal layer,
wherein the semiconductor chip, the surface electrode, the first metal wiring and the metal plate are packaged, and
wherein the first protection film contacts the metal plate.

3. A semiconductor device comprising:
a semiconductor chip including a semiconductor element, wherein the semiconductor chip further includes a first region and a second region, and has a first surface and a second surface;
a surface electrode disposed on the first surface of the semiconductor chip and electrically coupled with the first region of the semiconductor chip;
a first metal wiring disposed on the first surface of the semiconductor chip and electrically coupled with the second region of the semiconductor chip, wherein the first metal wiring controls a potential to be applied to the second region;
a metal layer disposed on the surface electrode;
a first protection film covering the first metal wiring; and
a metal plate covering at least a part of the surface electrode and a part of the first metal wiring and electrically coupling with the metal layer and the surface electrode via a solder layer,
wherein the solder layer is disposed on the metal layer,
wherein the semiconductor chip, the surface electrode, the first metal wiring and the metal plate are packaged,
wherein the metal plate includes a protrusion, which faces the first protection film, and protrudes toward the semiconductor chip, and
wherein the first protection film contacts the protrusion of the metal plate.

* * * * *